(12) United States Patent
Finn et al.

(10) Patent No.: US 9,195,932 B2
(45) Date of Patent: Nov. 24, 2015

(54) BOOSTER ANTENNA CONFIGURATIONS AND METHODS

(71) Applicants: David Finn, Tourmakeady (IE); Mustafa Lotya, Celbridge (IE); Klaus Ummenhofer, Kaufbeuren (DE)

(72) Inventors: David Finn, Tourmakeady (IE); Mustafa Lotya, Celbridge (IE); Klaus Ummenhofer, Kaufbeuren (DE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 0 days.

(21) Appl. No.: 14/173,815

(22) Filed: Feb. 6, 2014

(65) Prior Publication Data

US 2015/0021402 A1 Jan. 22, 2015

Related U.S. Application Data

(63) Continuation-in-part of application No. 14/020,884, filed on Sep. 8, 2013, now Pat. No. 9,033,250, and a continuation-in-part of application No. 13/600,140, filed on Aug. 30, 2012, now Pat. No. 8,991,712, and a continuation-in-part of application No. 14/078,527, filed on Nov. 13, 2013, now Pat. No. 9,112,272, and a continuation-in-part of application No. 13/756,631, filed on Feb. 1, 2013, now Pat. No. 8,870,080, which is (Continued)

(51) Int. Cl.
*G06K 19/07* (2006.01)
*G06K 19/077* (2006.01)
*H01Q 7/00* (2006.01)
*H01Q 1/22* (2006.01)
*H01Q 21/29* (2006.01)
*H05K 3/10* (2006.01)
*H01F 38/14* (2006.01)

(52) U.S. Cl.
CPC .... *G06K 19/07794* (2013.01); *G06K 19/07769* (2013.01); *H01Q 1/2216* (2013.01); *H01Q 1/2225* (2013.01); *H01Q 1/2283* (2013.01); *H01Q 7/00* (2013.01); *H01Q 21/29* (2013.01); *H05K 3/103* (2013.01); *H01F 38/14* (2013.01); *Y10T 29/49162* (2015.01)

(58) Field of Classification Search
CPC . G06K 19/07783; H01Q 7/00; H01Q 1/2225; A01B 12/006
USPC .......................................................... 235/492
See application file for complete search history.

(56) References Cited

U.S. PATENT DOCUMENTS

| | | |
|---|---|---|
| 5,012,236 A | 4/1991 | Troyk et al. |
| 5,084,699 A | 1/1992 | DeMichele |
| 5,261,615 A | 11/1993 | Cuttelod |
| 5,270,717 A | 12/1993 | Schuermann |
| 5,572,410 A | 11/1996 | Gustafson |
| 5,773,812 A | 6/1998 | Kreft |
| 5,955,723 A | 9/1999 | Reiner |

(Continued)

FOREIGN PATENT DOCUMENTS

| | | |
|---|---|---|
| CA | 2279176 | 7/1998 |
| DE | 39 35 364 | 8/1990 |

(Continued)

*Primary Examiner* — Kristy A Haupt
(74) *Attorney, Agent, or Firm* — Gerald E. Linden

(57) ABSTRACT

A booster antenna (BA) for a smart card comprises a card antenna (CA) component extending around a periphery of a card body (CB), a coupler coil (CC) component at a location for an antenna module (AM), and an extension antenna (EA) contributing to the inductance of the booster antenna (BA). A method of wire embedding is also disclosed, by controlling a force and ultrasonic power applied by an embedding tool at different positions on the card body (CB).

10 Claims, 32 Drawing Sheets

Related U.S. Application Data a continuation of application No. 13/594,895, filed on Aug. 27, 2012, now Pat. No. 8,789,762, application No. 14/173,815, which is a continuation-in-part of application No. 13/931,828, filed on Jun. 29, 2013, now Pat. No. 8,708,240, which is a continuation of application No. 13/205,600, filed on Aug. 8, 2011, now Pat. No. 8,474,726, application No. 14/173,815, which is a continuation-in-part of application No. 13/730,811, filed on Dec. 28, 2012, which is a continuation-in-part of application No. 13/310,718, filed on Dec. 3, 2011, now Pat. No. 8,366,009, which is a continuation-in-part of application No. 13/294,578, filed on Nov. 11, 2011, now abandoned, application No. 14/173,815, which is a continuation-in-part of application No. 13/744,686, filed on Jan. 18, 2013, now abandoned.

(60) Provisional application No. 61/868,089, filed on Aug. 21, 2013, provisional application No. 61/860,354, filed on Jul. 31, 2013, provisional application No. 61/841,286, filed on Jun. 29, 2013, provisional application No. 61/737,746, filed on Dec. 15, 2012, provisional application No. 61/697,825, filed on Sep. 7, 2012, provisional application No. 61/905,134, filed on Nov. 15, 2013, provisional application No. 61/914,996, filed on Dec. 12, 2013, provisional application No. 61/589,781, filed on Jan. 14, 2012, provisional application No. 61/624,384, filed on Apr. 15, 2012, provisional application No. 61/646,369, filed on May 14, 2012, provisional application No. 61/660,668, filed on Jun. 15, 2012, provisional application No. 61/373,269, filed on Aug. 12, 2010, provisional application No. 61/384,219, filed on Sep. 17, 2010, provisional application No. 61/493,448, filed on Jun. 4, 2011, provisional application No. 61/493,611, filed on Jun. 6, 2011, provisional application No. 61/521,741, filed on Aug. 9, 2011, provisional application No. 61/533,228, filed on Sep. 11, 2011, provisional application No. 61/536,153, filed on Sep. 19, 2011, provisional application No. 61/589,434, filed on Jan. 23, 2012, provisional application No. 61/619,951, filed on Apr. 4, 2012, provisional application No. 61/693,262, filed on Aug. 25, 2012.

(56) References Cited

U.S. PATENT DOCUMENTS

| | | | |
|---|---|---|---|
| 6,008,993 | A | 12/1999 | Kreft |
| 6,095,423 | A | 8/2000 | Houdeau et al. |
| 6,142,381 | A | 11/2000 | Finn et al. |
| 6,190,942 | B1 | 2/2001 | Wilm et al. |
| 6,233,818 | B1 | 5/2001 | Finn et al. |
| 6,295,720 | B1 | 10/2001 | Finn et al. |
| 6,310,778 | B1 | 10/2001 | Finn et al. |
| 6,375,083 | B2 | 4/2002 | Fries |
| 6,378,774 | B1 | 4/2002 | Emori et al. |
| 6,406,935 | B2 | 6/2002 | Kayanakis et al. |
| 6,424,301 | B1 | 7/2002 | Johnson et al. |
| 6,698,089 | B2 | 3/2004 | Finn et al. |
| 6,719,206 | B1 | 4/2004 | Bashan et al. |
| 7,320,738 | B2 | 1/2008 | Radenne et al. |
| 7,928,918 | B2 | 4/2011 | Caruana et al. |
| 7,980,477 | B2 | 7/2011 | Finn |
| 8,100,337 | B2 | 1/2012 | Artigue et al. |
| 8,130,166 | B2 | 3/2012 | Ayala et al. |
| 8,261,997 | B2 | 9/2012 | Gebhart |
| 8,366,009 | B2 | 2/2013 | Finn |
| 8,474,726 | B2 | 7/2013 | Finn |
| 2001/0011012 | A1 | 8/2001 | Hino et al. |
| 2001/0054230 | A1 | 12/2001 | Finn et al. |
| 2002/0020903 | A1 | 2/2002 | Kreft et al. |
| 2002/0105232 | A1 | 8/2002 | Parrault |
| 2002/0162894 | A1* | 11/2002 | Kuramochi .................. 235/492 |
| 2007/0171074 | A1 | 7/2007 | Camp et al. |
| 2008/0246614 | A1 | 10/2008 | Paananen |
| 2008/0283615 | A1 | 11/2008 | Finn |
| 2008/0308641 | A1 | 12/2008 | Finn |
| 2008/0314990 | A1 | 12/2008 | Rietzler |
| 2009/0057414 | A1 | 3/2009 | Brunet et al. |
| 2009/0152362 | A1 | 6/2009 | Ayala et al. |
| 2009/0169776 | A1 | 7/2009 | Herslfow |
| 2010/0176205 | A1 | 7/2010 | Patrice |
| 2010/0283690 | A1 | 11/2010 | Artigue et al. |
| 2011/0155811 | A1 | 6/2011 | Rietzler |
| 2011/0163167 | A1 | 7/2011 | Artigue et al. |
| 2011/0189620 | A1 | 8/2011 | Herslow |
| 2012/0038445 | A1 | 2/2012 | Finn |
| 2012/0055013 | A1 | 3/2012 | Finn |
| 2012/0061473 | A1 | 3/2012 | Forster et al. |
| 2012/0064307 | A1 | 3/2012 | Forster et al. |
| 2012/0074233 | A1 | 3/2012 | Finn |
| 2013/0075477 | A1 | 3/2013 | Finn et al. |
| 2013/0146670 | A1 | 6/2013 | Grieshofer et al. |
| 2013/0146671 | A1 | 6/2013 | Grieshofer et al. |

FOREIGN PATENT DOCUMENTS

| | | |
|---|---|---|
| DE | 43 11 493 | 4/2000 |
| DE | 69706577 | 9/2001 |
| DE | 20 2005 016382 | 2/2006 |
| DE | 102006024247 | 11/2007 |
| EP | 0 875 039 | 11/1998 |
| EP | 0 931 295 | 7/1999 |
| EP | 0 977 145 | 2/2000 |
| EP | 1031939 | 8/2000 |
| EP | 1225538 | 7/2002 |
| EP | 1 325 468 | 7/2003 |
| EP | 2045872 | 4/2009 |
| EP | 2 120 190 | 11/2009 |
| EP | 2525304 | 11/2012 |
| KR | 100537452 | 12/2005 |
| NL | 9100347 | 3/1992 |
| WO | WO 2006/125916 | 11/2006 |
| WO | WO 2007/025934 | 3/2007 |
| WO | WO 2007/026077 | 3/2007 |

* cited by examiner

Dual Interface (DI) Smart Card, and Readers different areas of the Card Body (CB)

Booster Antenna BA with Card Antenna CA and Coupler Coil CC

Coupler Coil clockwise (CW)
from outer *c* to inner *d*

Coupler Coil clockwise (CW)
from inner *c* to outer *d*

Coupler Coil counter-clockwise
from inner *c* to outer *d* booster antenna components inclusion of an antenna extension AE first antenna component     second antenna component cross-over     cross-over

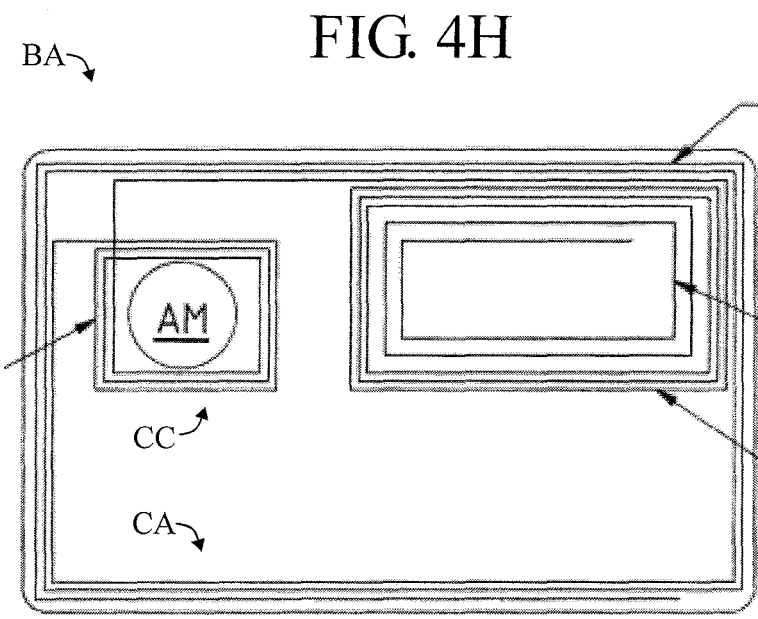
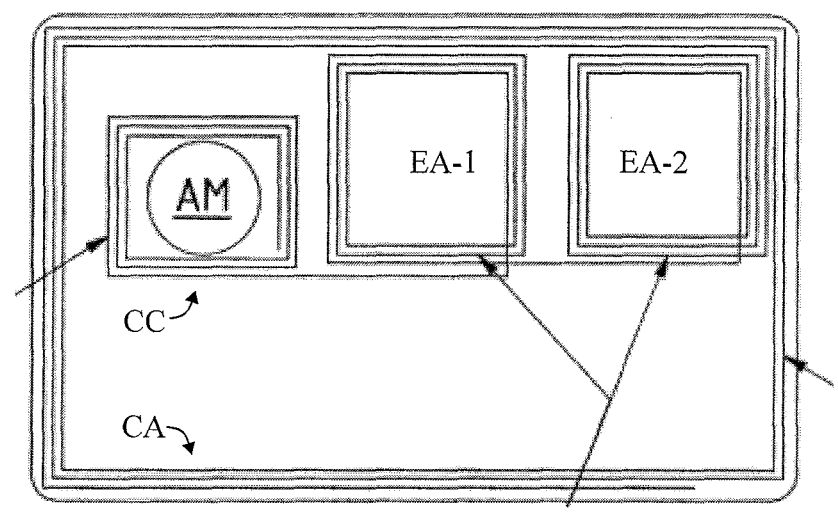

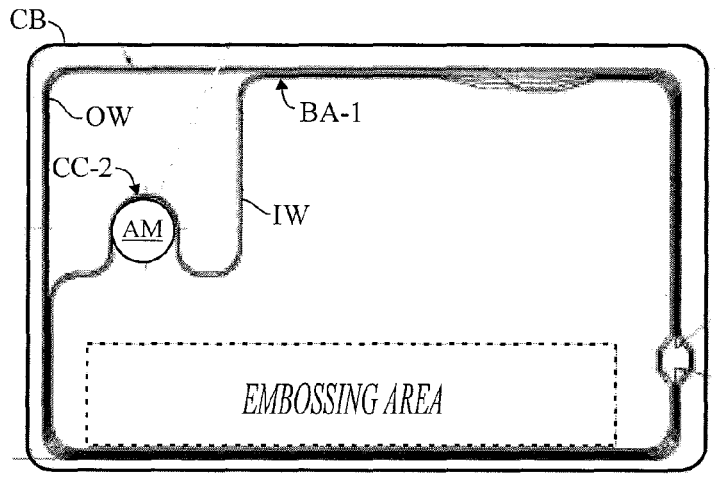
FIG. 5F
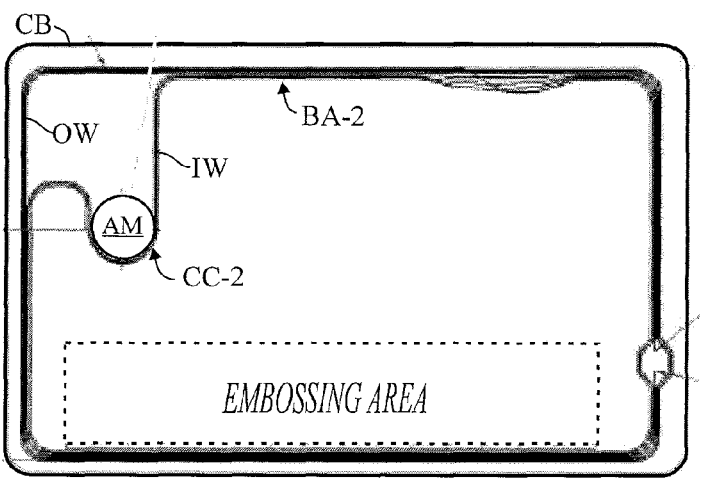
FIG. 5G
FIG. 5H
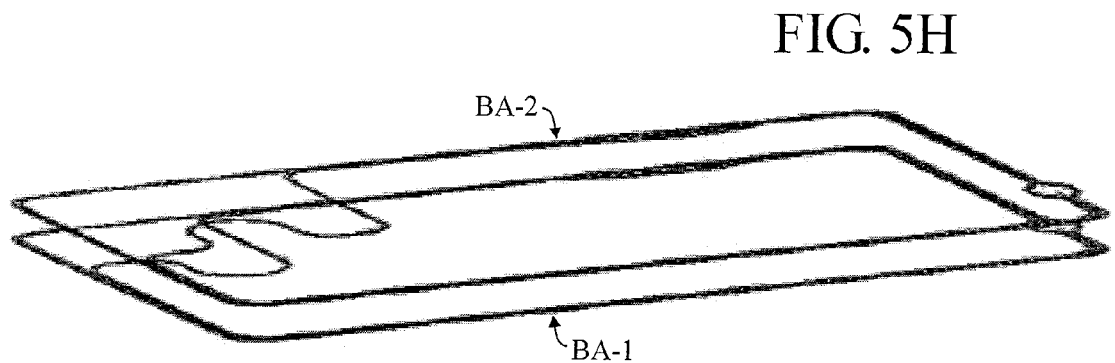

pitch increases across width of card body (CB)

zig-zag for increased capacitance dipole extending along 3 edges of periphery turns of wire embedded in Card Body CB

Module Antenna with Capacitive Extensions two module antenna segments (MA1, MA2)

two antenna segments (OS, IS) connected as quasi-dipole conventional coupler coil (CC) configuration coupler coil (CC) with inner and outer windings coupler coil (CC) with magnetic conductive patch (MP)

BA with CC and EA

EA reverse laid

CC "around" AM

CC reverse "around" CM

FIG. 11E

CC "around" CM with loop

CC reverse "around" CM with loop

BA, OW, CA, IW, EA, OP, IP, CC, a, f, x outer winding (OW) of card antenna (CA)

inner winding (iw) of coupler coil (CC)

extension antenna (EA)

outer winding (ow) coupler coil (CC)

inner winding (IW) card antenna (CA)

Compensating Loop (CL), with gap

Compensating Loop (CL), no gap

Metal Foil (MF) in Card Body (CB)

MF with opening at location of CC / AM

Metal Foil (MF) in Card Body (CB)

MF with opening at location of CC / AM

Booster Antenna with Capacitive Extensions

Extension Antenna (EA) with inner and outer windings two BA components (or windings), interleaved component(s) with multiple crossings

BOOSTER ANTENNA CONFIGURATIONS AND METHODS

CROSS-REFERENCE(S) TO RELATED APPLICATIONS

Priority is claimed, as a continuation-in-part ("CIP") or nonprovisional of the following:

CIP of U.S. Ser. No. 14/020,884 filed 8 Sep. 2013 which claims priority from
- nonprovisional of U.S. 61/868,089 filed 21 Aug. 2013
- nonprovisional of U.S. 61/860,354 filed 31 Jul. 2013
- nonprovisional of U.S. 61/841,286 filed 29 Jun. 2013
- nonprovisional of U.S. 61/737,746 filed 15 Dec. 2012
- nonprovisional of U.S. 61/697,825 filed 7 Sep. 2012
- nonprovisional of U.S. 61/905,134 filed 15 Nov. 2013
- nonprovisional of U.S. 61/914,996 filed 12 Dec. 2013

CIP of U.S. Ser. No. 13/600,140 filed 30 Aug. 2012 which claims priority from
- U.S. 61/586,781 filed 14 Jan. 2012
- U.S. 61/624,384 filed 15 Apr. 2012

CIP of U.S. Ser. No. 14/078,527 filed 13 Nov. 2013

CIP of U.S. Ser. No. 13/756,631 filed 2 Jan. 2013 which is a continuation of U.S. Ser. No. 13/594,895 filed 27 Aug. 2012 which claims priority from
- U.S. 61/646,369 filed 14 May 2012
- U.S. 61/660,668 filed 15 Jun. 2012

CIP of U.S. Ser. No. 13/931,828 filed 29 Jun. 2013 which is a continuation of U.S. Ser. No. 13/205,600 filed 8 Aug. 2011 (U.S. Pat. No. 8,474,726 issued 12 Jul. 2013) which claims priority from
- U.S. 61/373,269 filed 12 Aug. 2010
- U.S. 61/384,219 filed 17 Sep. 2010
- U.S. 61/493,448 filed 4 Jun. 2011
- U.S. 61/493,611 filed 6 Jun. 2011

CIP of U.S. Ser. No. 13/730,811 filed 28 Dec. 2012 which is a continuation-in-part of U.S. Ser. No. 13/310,718 filed 3 Dec. 2011 (U.S. Pat. No. 8,366,009 issued 5 Feb. 2013 which claims priority from
- U.S. 61/521,741 filed 9 Aug. 2011
- U.S. 61/533,228 filed 11 Sep. 2011
- U.S. 61/536,153 filed 19 Sep. 2011
- U.S. Ser. No. 13/294,578 filed 11 Nov. 2011
- U.S. 61/493,448 filed 4 Jun. 2011
- U.S. 61/493,611 filed 6 Jun. 2011

CIP of U.S. Ser. No. 13/744,686 filed 18 Jan. 2013 which claims priority from
- U.S. 61/589,434 filed 22 Jan. 2012
- U.S. 61/619,951 filed 4 Apr. 2012
- U.S. 61/693,262 filed 25 Aug. 2012

TECHNICAL FIELD

This disclosure relates to smart cards (or other secure documents, and the like), operating at least in a contactless mode (ISO 14443). The smart card may comprise a card body (CB), an antenna module (AM), and a booster antenna (BA). The antenna module (AM) may comprise an RFID (radio frequency identification) chip or chip module (either of which may be referred to as "CM") and a module antenna (MA). The RFID chip (CM) may be mounted on a module tape (MT), typically having 6 or 8 contact pads (CP) for interfacing with a contact reader in a contact mode (ISO 7816-2). The booster antenna (BA) may comprise various antenna components, such as a card body antenna (CA) for coupling with an external card reader, and a coupling coil (CC) for coupling with the module antenna (MA) of the antenna module (AM).

This disclosure further relates to techniques for embedding wire in a substrate, such as a card body (CB) for a smart card (or other secure documents, and the like), particularly to form the booster antenna (BA) and its various antenna components.

BACKGROUND

A dual interface (DI or DIF) smart card may generally comprise:
- an antenna module AM,
- a card body CB, and
- a booster antenna BA.

The antenna module "AM" may generally comprise a "DI" RFID chip (bare, unpackaged silicon die) or chip module (a die with leadframe, carrier or the like)—either of which may be referred to as "CM"—mounted to a module tape "MT". A module antenna MA may be disposed on the module tape MT for implementing a contactless interface. Contact pads "CP" may be disposed on the module tape MT for implementing the contact interface. The module tape MT may comprise a pattern of interconnects (conductive traces and pads) to which the chip CM and contact pads CP may be connected.

The module antenna MA may be connected, indirectly, via some of the interconnects to the chip CM, or may be directly connected to bond pads BP on the chip CM. The module antenna MA may comprise several turns of wire, such as 112 micron diameter insulated wire. Reference may be made to U.S. Pat. No. 6,378,774 (2002, Toppan), for example FIGS. 12A, B thereof.

The card body CB—which may be referred to as a substrate, or an inlay substrate—may generally comprise one or more layers of material such as Polyvinyl Chloride (PVC), Polycarbonate (PC), PET-G (Polyethylene Terephtalate Glycol-modified), Copolyester (Tritan), Teslin™, synthetic paper, paper and the like.

The card body CB may be generally rectangular, measuring approximately 54 mm×86 mm (refer to ISO/IEC 7810), having a thickness of approximately 300 μm thick. The card body CB is typically significantly (such as 20 times) larger than the antenna module AM.

The booster antenna BA may generally comprise a relatively large winding which may be referred to as a card antenna CA component (or portion) having a number of turns disposed in a peripheral area of the card body CB, and a relatively small coupler coil (or coupler antenna) CC component (or portion) having a number of turns disposed at a coupling area of the card body CB corresponding to the antenna module AM.

The card antenna CA and coupler coil CC may comprise wire mounted to (embedded in) the card body CB using an ultrasonic tool comprising a sonotrode and a capillary. See, for example U.S. Pat. No. 6,698,089 and U.S. Pat. No. 6,233,818. The wire may be non-insulated, insulated, or self-bonding wire, having an exemplary diameter in the range of approximately 50-112 μm.

SOME PATENT REFERENCES

NL 9100347 (1992, Nedap) discloses a contactless card having the following elements arranged as shown in FIG. 1; (1) geintegreerde schakeling (integrated circuit); (2) electronische schakeling (electronic circuit); (3) transformator (transformer); (4) kernmateriaal (core material); (5) condensator (condenser); (6) primaire spoel (primary coil) and (7) antennespoel (antenna coil)

As is evident from FIG. 1 of the Nedap patent, the electronic circuit (2, comparable to the chip CM herein) is connected with a first coil (3, comparable to the module antenna MA herein). A second coil (6, comparable to the coupling coil CC herein) is connected with the main antenna (1, comparable to the card antenna CA herein). The first coil (3, MA) is coupled with the second coil (6, CC), as aided by the core material (4).

U.S. Pat. No. 5,955,723 (Siemens; 1999), incorporated by reference herein, discloses a contactless chip card. A data carrier configuration includes a semiconductor chip. A first conductor loop is connected to the semiconductor chip and has at least one winding and a cross-sectional area with approximately the dimensions of the semiconductor chip. At least one second conductor loop has at least one winding, a cross-sectional area with approximately the dimensions of the data carrier configuration and a region forming a third loop with approximately the dimensions of the first conductor loop. The third loop inductively couples the first conductor loop and the at least one second conductor loop to one another. The first and third conductor loops are disposed substantially concentrically. FIGS. 1 and 2 illustrate that a large coil, that is to say a second conductor loop 3, has approximately the dimensions of a chip card. FIG. 1 illustrates a way of forming the small loop 4 of the large coil 3 without any crossovers, whereas FIG. 2 illustrates a small loop 4 having a crossover. FIG. 3 shows a further possible configuration of a coupling region between a small conductor loop 2 connected to a semiconductor chip 1, and a large conductor loop 3. In this case, the coupling region has a meandering path, in order to obtain as long a length of the coupling region as possible.

U.S. Pat. No. 8,130,166 (Assa Abloy; 2012), incorporated by reference herein, discloses coupling device for transponder and smart card with such device. A coupling device is formed by a continuous conductive path having a central section and two extremity sections, the central section forming at least a small spiral for inductive coupling with the transponder device, the extremities sections forming each one large spiral for inductive coupling with the reader device, wherein the small spiral shows a larger pitch than the ones of the large spirals, and wherein the two extremities of the continuous path are loose such that the coupling device forms an open circuit. The pitches of the large spirals are chosen such as that the interturn stray capacitances is important and that the large spirals have mainly a capacitive behavior. And the pitch of the small spiral is chosen such as that the interturn stray capacitances are negligible, and that the small spiral has mainly an inductive behavior. FIG. 3 shows an illustrative embodiment of the transponder device and coupling device. The coupling device 10 is formed by a single conductive path having a central section and two external sections. The central portion is formed as a small spiral 12 with a large pitch, whereas the two external sections form a large spiral 11 and 11' with a small pitch. In fact, the spiral 11 and 11' are two distinct spiral physical elements, but forming a single geometrical spiral element (with a short interruption in the middle).

US 20130146671 (Infineon; 2013), incorporated by reference herein, discloses a booster antenna structure for a chip card is provided, wherein the booster antenna structure may include a booster antenna; and an additional electrically conductive structure connected to the booster antenna. The contactless interface on the chip card can have a chip card antenna which is contained in the chip card and connected to the chip. In order to improve the wireless communication capability, a further antenna can be provided in addition to the chip card module antenna, namely an amplifier antenna or booster antenna.

U.S. Pat. No. 8,474,726 (Finn; 2013), incorporated by reference herein, discloses a transponder with an antenna module having a chip module and an antenna; a booster antenna having a first antenna structure in the form of a flat coil having a number of turns, an outer end and an inner end, and a second antenna structure in the form of a flat coil having a number of turns, an outer end and an inner end; the inner end of the second antenna structure connected with the outer end of the first antenna structure. The antenna module may be positioned so that its antenna overlaps one of the first antenna structure or the second antenna structure. An antenna module having two additional antenna structures is disclosed. Methods of enhancing coupling are disclosed.

US 20130075477 (Finn, Ummenhofer; 2013), incorporated by reference herein, discloses improving coupling in and to RFID smart cards. A data carrier such as a smart card comprising an antenna module (AM) and a booster antenna (BA). The booster antenna (BA) has an outer winding (OW) and an inner winding (IW), each of which has an inner end (IE) and an outer end (OE). A coupler coil (CC) is provided, connecting the outer end (OE, b) of the outer winding (OW) and the inner end (IE, e) of the inner winding (IW). The inner end (IE, a) of the outer winding (OW) and the outer end (OE, f) of the inner winding (IW) are left un-connected (free floating). The coupler coil (CC) may have a clockwise (CW) or counter-clockwise (CCW) sense which is the same as or opposite to the sense (CW or CCW) of the outer and inner windings. Various configurations of booster antennas (BA) are disclosed.

SUMMARY

It is a general object of the invention to provide improved techniques for improving coupling with RFID smart cards (as an example of secure documents, and the like). It is a further general object of the invention to provide an improved booster antenna (BA) for smart cards. It is a further general object of the invention to provide improved techniques for embedding wire in a card body (CB) of a smart card. These and other objects may be achieved individually or collectively by various embodiments of the invention disclosed herein.

The booster antenna BA may comprise a card antenna CA component, a coupler coil (or coupler antenna) CC component, and an extension antenna (or extension coil) EA component. According to some embodiments of the invention generally, improvements to the booster antenna BA may include one or more of:

arrangements of the card antenna CA, which may have only one winding, or which may comprise two or more windings such as an inner winding IW and an outer winding OW arrangements of the coupler coil (or coupler antenna) CC, which may comprise a loop which completely encircles a coupling area on the card body CB associated with the antenna module AM, or which may comprise an incomplete or open loop (or "horseshoe") which substantially fully but which does not completely encircle the coupling area (and antenna module AM)

Some features disclosed herein and related to the booster antenna (BA) may include:

various configurations of an extension antenna (or extension coil; EA), which may be connected to and extend from at least one of the card antenna (CA) and the coupler coil (CC)

the extension antenna (EA) may be a "true coil" having at least one cross-over

Some features disclosed herein and related to the booster antenna (BA) may include:
- disposing the coupler coil (CC) off-center with respect to the module antenna (MA) of the antenna module (AM) (FIG. 5A)
- forming the coupler coil (CC) with a free end (FIG. 5B)
- forming the coupler coil (CC) with two, side-by-side windings which are extensions of the card antenna (CA) (FIG. 5C)
- forming the coupler coil (CC) with two windings, each having free ends (FIG. 5D)
- forming a first booster antenna (BA-1) and partial coupling coil (CC-1) in a first layer, and forming a second booster antenna (BA-2) and partial coupling coi81 (CC-2) in a second layer (or an opposite side of the first layer. (FIGS. 5E,F,G)

Some features disclosed herein and related to the booster antenna (BA) may include:
- windings (turns) of CA, CC or CA having different pitches/spacings
- wire for the CA, CC or EA having different thicknesses
- wire for the CA, CC or EA having different resistances According to some embodiments of the invention generally, improvements to embedding wire in a card body CB with an embedding tool comprising a ultrasonic sonotrode and a capillary may include one or more of:
- controlling force applied by the capillary during embedding the wire
- controlling power in the sonotrode during embedding the wire According to an embodiment (example) of the invention a card body (CB) may comprise:
- a surface having a surface area, an upper portion of the surface constituting approximately half of the surface area of the card body and a lower portion of the surface constituting a remaining approximately half of the surface area of the card body;
- a first area for extending around a peripheral portion of the card body in at least the upper portion of the card body;
- a card antenna (CA) disposed in the first area;
- a second area located in the upper portion of the card body and corresponding in size to an antenna module (AM);
- a third area located in the upper portion of the card body which is separate from the first area and the second area; and
- an extension antenna (EA) disposed in the third area.

A coupler coil (CC) may be disposed in the second area. A portion of the extension antenna (EA) may be disposed adjacent at least 90° of the coupler coil (CC). The coupler coil (CC) may have two ends, and may be formed as a closed loop or as an open loop.

The extension antenna (EA) contributes to the inductance of the booster antenna (BA), and may be in the form of a coil comprising at least one cross-over. The extension antenna (EA) may be connected at one end to the booster antenna (BA). The extension antenna (EA) has two ends. One end may be connected to an end of the coupler coil (CC). One end may be connected to the card antenna (CA), or left unconnected as a free end.

According to an embodiment (example) of the invention a smart card may comprise a card body (CB) having a booster antenna (BA) with an extension antenna (EA), and a radio frequency identification (RFID) chip, and may have a coupler coil (CC).

According to an embodiment (example) of the invention a method of embedding a wire in a surface of a substrate may comprise:
- with an embedding tool, feeding wire onto the surface of the substrate while applying a given downward force and while imparting an ultrasonic vibration to the embedding tool; and
- controlling at least one of the downward force which is exerted by the embedding tool and a power of the ultrasonic vibration while embedding the wire in the surface of the substrate.

According to some embodiments (examples) of the invention, generally, a smart card (SC) may comprise a metallized layer, a compensating loop, or ferrite in the card body (CB).

According to some embodiments (examples) of the invention, generally, booster antenna (BA) components such as card antenna (CA), coupler coil (CC) and extension antenna (EA) may be laid with senses (clockwise, counter clockwise) which are opposite from one another.

When being laid, these components may be laid from an innermost turn to an outermost turn, or vice-versa.

According to some embodiments (examples) of the invention, a booster antenna (BA) may comprise at least a card antenna (CA) component extending around a periphery of a card body (CB) and an extension antenna (EA) component, and may be characterized by: the extension antenna (EA) component has a sense opposite to that from the card antenna (CA) component. The booster antenna (BA) may further comprising a coupler coil (CC) component. The coupler coil (CC) component may have a sense which is the same as the sense of the extension antenna (EA) component. The card antenna (CA) component may have an outer winding (OW) and an inner winding (IW). The booster antenna (BA) may be incorporated into a smart card (SC).

According to some embodiments (examples) of the invention, a booster antenna (BA) may comprise a card antenna (CA) component; a coupler coil (CC) component; and an extension antenna (EA) component; and may be characterized in that: at least one of the components has a sense which is opposite one or more of the other components. At least one of the components may comprise an outer winding (OW, ow) and an inner winding (IW, iw). At least some of the components may have innermost and outermost turns. At least one of the components may be laid from an innermost turn to an outermost turn. At least another of the components may be laid from an outermost turn to an innermost turn.

According to some embodiments (examples) of the invention, a booster antenna (BA) may comprise a card antenna (CA) component; a coupler coil (CC) component; and at least one capacitive stub connected with at least one of the coupler coil (CC) and card antenna (CA) components. One of the capacitive stubs may be connected with the card antenna (CA) component. An other of the capacitive stubs may be connected with the coupler coil (CC) component. There may be two capacitive stubs and they may each be formed in a flat coil pattern having a number of turns. The two capacitive stubs may beare substantially identical with one another A linear actuator may be used for urging at least a portion of the embedding tool downward. A force profile may be established, and different forces may be applied at different positions, during the embedding process, in a controlled manner. While controlling the force, a power of the ultrasonic vibration imparted to the embedding tool may also be controlled. Different downward forces may be applied by the embedding tool at different positions being embedded, and for a booster antenna component having a plurality of turns, this may depend upon which of the plurality of turns is being embedded.

The invention(s) described herein may relate to industrial and commercial industries, such RFID applications, smart cards, electronic passports and the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams.

Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein. Some elements may be referred to with letters ("BA", "CA", "CC", "EA" and the like), rather than or in addition to numerals.

FIGS. 4F-4I are diagrams illustrating embodiments of a booster antenna (BA) with card antenna CA, a coupler antenna (CC) and an extension antenna (EA).

FIGS. 5F, 5G, 5H are diagrams (5F, 5G, plan view; 5H perspective view) a composite booster antenna having a first booster antenna (BA-1) in one plane, such as on one side of a card body (CB) and a second booster antenna (BA-2) in another plane, such as on an opposite side of the card body (CB).

FIGS. 11A-11F are diagrams (plan views), each showing a configuration of booster antenna (BA), and various arrangements of its components (CA, CC, EA).

DETAILED DESCRIPTION

Figure 1:
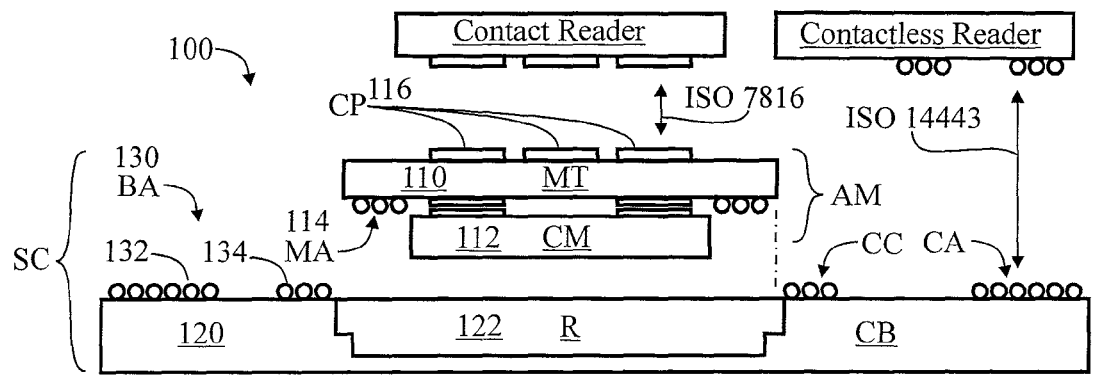
FIG. 1 is a cross-section of a dual-interface smart card and readers.

Various embodiments will be described to illustrate teachings of the invention(s), and should be construed as illustrative rather than limiting. Any dimensions and materials or processes set forth herein should be considered to be approximate and exemplary, unless otherwise indicated.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smart cards, such as EMV payment cards, metal composite cards, metal hybrid cards, metal foil cards, access control cards and secure credential documents. As used herein, any one of the terms "transponder", "tag", "smart card", "data carrier" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 7816 is an international standard related to electronic identification cards with contacts, especially smart cards.

EMV standards define the interaction at the physical, electrical, data and application levels between IC cards and IC card processing devices for financial transactions.

There are standards based on ISO/IEC 7816 for contact cards, and standards based on ISO/IEC 14443 for contactless cards.

A typical data carrier described herein may comprise
(i) an antenna module (AM) having an RFID chip (CM; or chip module) and a module antenna (MA),
(ii) a card body (CB) and
(iii) a booster antenna (BA) with coupler coil (CC) disposed on the card body (CB) to enhance coupling between the module antenna (MA) and the antenna of an external RFID "reader".

When "chip module" is referred to herein, it should be taken to include "chip", and vice versa, unless explicitly otherwise stated.

The module antenna (MA) may comprise a coil of wire, conductive traces etched or printed on a module tape (MT) or antenna substrate (AS) for the antenna module (AM), or may be incorporated directly on the chip itself.

Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). In contrast therewith, some figures present examples that are specifically "chip modules" having IC chips (such as a "CM") mounted and connected to substrates. A "chip module" (die and carrier) with a module antenna (MA) mounted and connected thereto may be referred to as an antenna module (AM).

The booster antenna (BA) with coupler coil (CC) may be formed by embedding wire in an inlay substrate or card body (CB). However, it should be understood that the antenna may be formed using processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, structured nanowire networks (including laser ablation) on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Figure 1A:
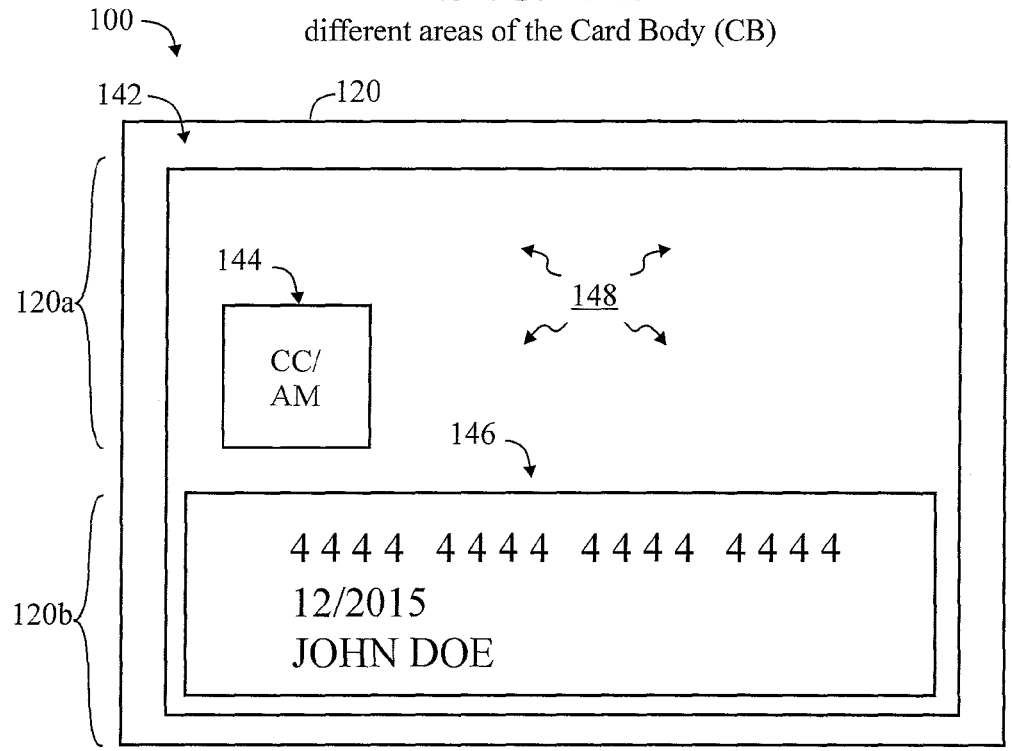
FIG. 1A is a top view of a card body (CB) for the smart card of FIG. 1.

FIGS. 1 and 1A illustrate a smart card (SC) 100 in cross-section, along with a contact reader and a contactless reader. The antenna module AM may comprise a module tape (MT) 110, an RFID chip (CM) 112 disposed on one side of the module tape MT along with a module antenna (MA) 114 and contact pads (CP) 116 disposed on the other side of the module tape MT for interfacing with an external contact reader. The card body (CB) 120 comprises a substrate which may have a recess (R) 122 extending into one side thereof for receiving the antenna module AM. (The recess R may be stepped—such as wider at the surface of the card body CB—to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134.

The card body (CB) 120 has a surface with an overall surface area, such as approximately 54 mm×86 mm~=4600 mm$^2$. An upper portion 120a of the card body CB may constitute approximately half (such as 50-70%) of the overall surface area of the card body CB, and a lower portion 120b of the card body CB may constitute a remaining approximately half (such as 30-50%) of the overall surface area of the card body CB.

A "peripheral" area 142 of the surface of the card body CB extends around the periphery of the card body CB in at least the upper portion 120a thereof, and may have a width of up to approximately 5 mm. The card antenna CA component may be disposed in this first area. The width of the first, peripheral area 142 may be greatest at the top edge of the card body CB, of medium width at the side edges of the card body CB, and least at the bottom edge of the card body CB.

A "coupling" area 144 of the surface of the card body CB is located in an interior area (within the peripheral area 142) of the card body CB, in the upper portion 120a thereof, at a position corresponding to the location of the antenna module AM, and may be of approximately the same size as the antenna module AM, such as approximately 8.2 mm×10.8 mm for a 6-contact module and 11.8 mm×13 mm for an 8-contact module.

An "embossing" area 146 of the surface of the card body CB is located in an interior area (within the peripheral area 142) of the card body CB, in the lower portion 120b thereof, is separate from the peripheral area 142 and the coupling area 144, and may constitute most (such as 80-90%) of the lower portion 120b of the card body CB.

A "remaining" (or "residual") area 148 of the surface of the card body CB is located in an interior area (within the peripheral area 142) of the card body CB, in the upper portion 120a thereof, is separate from the peripheral area 142 and the coupling area 144, and may constitute most (such as 60-80%) of the upper portion 120b of the card body CB. The card antenna 132 and coupler coil 134 are not disposed in this remaining area 148—in other words, are disposed substantially entirely in areas (142, 144) other than the remaining area 148 (and other than the embossing area 146).

As described in greater detail hereinbelow, according to an aspect of the invention, generally, an additional booster antenna component, referred to herein as an antenna extension (EA) component, may be disposed in remaining (or residual) area 148 of the surface of the card body CB. The antenna extension EA may comprise several turns (or traces) of wire (or other conductive material), and may be either (i) connected with one or both of the card antenna CA and coupler coil CC or (ii) not connected with either of the card antenna CA and coupler coil CC.

It is generally not desirable, but nevertheless possible that some of the booster antenna BA components, particularly at least a portion of the card antenna CA and a portion of the extension antenna EA may extend into the embossing area (146). In such a scenario, flat ribbon wire may be used. A wire for the booster antenna BA may be pre-flattened in an area which will correspond to where the wire will be disposed in the embossing area (146).

An Example of a Booster Antenna (BA)

The aforementioned US 20130075477, incorporated by reference herein, discloses a booster antenna BA arrangement (configuration) for a smart card. The booster antenna BA generally comprises a card antenna CA and a coupler coil.

A card antenna CA may comprise a single wire (or conductive trace) having two ends, arranged in a generally a rectangular spiral pattern, and disposed in the peripheral area (see 142, FIG. 1A) of the card body CB. The card antenna CA may comprise different portions, such as disclosed in U.S. Pat. No. 8,130,166 (Assa Abloy; 2012). The card antenna CA may comprise two distinct windings, such as an inner winding IW and an outer winding OW. A coupler coil CC may or may not be associated with the card antenna CA. The card antenna CA and coupler coil CC may constitute two components of a booster antenna BA.

According to an aspect of the invention, a component, referred to herein as an antenna extension EA may be associated with the booster antenna BA, and may be used with any suitable configuration of card antenna CA and coupler coil CC.

Figure 2:
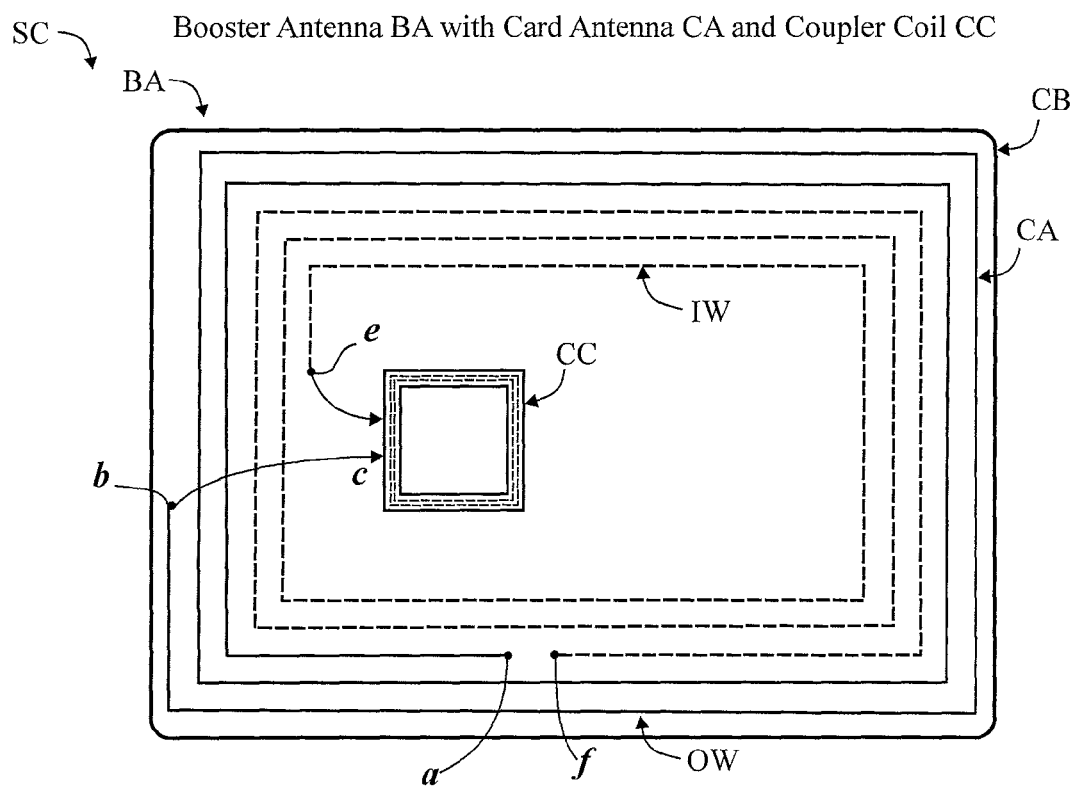
FIG. 2 is a diagram of an embodiment of a booster antenna (BA) having a card antenna (CA) with an inner winding (IW) and an outer winding (OW), and a coupler coil (CC).

FIG. 2 shows a booster antenna BA comprising a card antenna CA component extending around the peripheral area (142) of a card body CB, and having two windings—an outer winding OW and an inner winding IW, both extending substantially around the peripheral area (142) of the card body CB. Additionally, a coupler coil CC is shown which may be disposed in the coupling area (144).

The booster antenna BA may be formed using insulated, discrete copper wire disposed (such as ultrasonically bonded) around (inside of) the perimeter (periphery) of a card body CB (or inlay substrate, or data carrier substrate, such as formed of thermoplastic). The booster antenna BA comprises an outer winding OW (or coil, D) and an inner winding IW (or coil, D), and further comprises a coupler coil CC, all of which, although "ends" of these various coil elements are described, may be formed from one continuous length of wire (such as 80 µm self-bonding wire) which may be laid upon or embedded in the card body CB. More particularly, The outer winding OW may be a long wire (or conductive trace) wire having two ends—an inner end "a" and an outer end "b"—mounted to the card body CB in the form of a rectangular spiral having a number of (at least one) turns, and may be disposed in the peripheral area (142) of the card body CB.

The outer winding OW (compare D, FIG. 1A) may be formed as a spiral having a number (such as 2-3) of turns and having an inner end IE at point "a" and an outer end OE at point "b". The outer winding OW is near (substantially at) the periphery (perimeter) of the card body CB. The inner end IE ("a") of the outer winding OW is a free end.

The dimensions of the card body CB may be approximately 54 mm×86 mm. The outer dimension of the outer winding OW of the booster antenna BA may be approximately 80×50 mm. The wire for forming the booster antenna BA may having a diameter (d) of approximately 100 µm (including, but not limited to 80 mm, 112 µm, 125 µm).

The inner winding IW may be a long wire (or conductive trace) having two ends—an inner end "e" and an outer end "f"—mounted to the card body in the form of a rectangular spiral having a number (at least one) of turns, and may be disposed in the peripheral area (142) of the card body CB. The inner winding IW may be disposed within (towards the interior of the card body CB) the outer winding OW.

Figure 2A:
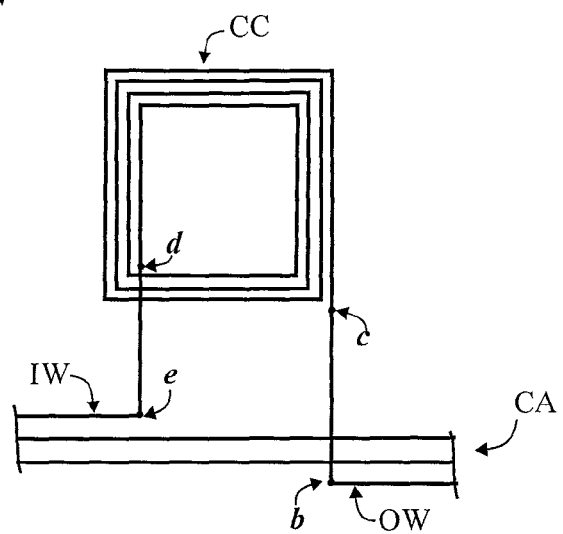
FIGS. 2A-2D are diagrams illustrating arrangements of a coupler coil (CC) in relation to a card antenna (CA).

The outer end "b" of the outer winding OW may be connected with the inner end "e" of the inner winding IW, either directly (not shown, see FIG. 2A of U.S. Ser. No. 13/600,140) or via the intermediary of a coupler coil CC.

The inner end IE (a) of the outer winding OW and the outer end OE (f) of the inner winding IW may be left unconnected, as "free ends".

The overall booster antenna BA comprising outer winding OW, coupler coil CC and inner winding IE is an open circuit, and may be referred to as a "quasi-dipole"—the outer winding OW constituting one pole of the dipole, the inner winding IW constituting the other pole of the dipole—center fed by the coupler coil CC.

The coupler coil CC may be a long wire (or conductive trace) or conductive trace having two ends "c" and "d". The aforementioned U.S. Ser. No. 13/600,140 (US 20130075477), incorporated by reference herein discloses various configurations for laying and connecting the inner winding IW, outer winding OW and coupler coil CC. See, for example, FIGS. 3A-3D therein. The present invention is not limited to any particular one(s) of these configurations.

The coupler coil CC may be formed as a spiral having a number (such as approximately 10) of turns and having two ends "c" and "d". The end "c" may be an outer end OE or an inner end IE, the end "d" may be an inner end IE or an outer end OE, as described with respect to the embodiments shown in FIGS. 3A, 3B, 3C, 3D of US 20130075477. The coupler coil CC is disposed at an interior portion of the card body CB, away from the periphery, and is shown only generally with a few dashed lines in FIG. 2.

It should be understood that the booster antenna BA could be made with other than wire using additive processes such as printing conductive material onto the substrate CB, or subtractive processes such as etching conductive material away from the substrate CB. For such non-wire antennas, although there may be no actual direction such as is inherent with laying or embedding the wire (the course of laying the wire, from one end to the other), but the resulting spiral elements OW, IW, CC of the booster antenna BA may nevertheless exhibit a clockwise CW or counter-clockwise CCW "virtual sense" (or orientation) which can be determined by analogy to laying wire. (For an additive process such as inkjet printing, which is sequential, the sense would be actual.) The "sense" can be determined by following the pattern from "a" to "f", or from "f" to "a".

As used herein, "pitch" may refer to the average distance, center-to-center (c-c), between adjacent turns of a wire for a winding (OW, IW) or the coupler coil (CC), as it is being laid. (Or, by analogy, to the center-to-center distance between adjacent conductive tracks made by additive or subtractive processes). It should be understood that during manufacturing (including as a result of subsequent manufacturing steps such as laminating), the pitch of the wire may vary or change somewhat, such as +/−5%, or more. And, when going around a corner, such as in a rectangular spiral, the pitch may be somewhat indeterminate. It should also be understood that the pitch of the windings (OW, IW) or coupler coil (CC) may be advertently altered (typically increased) locally, such as at the free ends "a" and "f", to accommodate manufacturing processes (such as starting and ending embedding the wire) and the like. "Pitch" may refer to the initial (during laying) or final (after laminating) distance (c-c) between adjacent turns of a winding.

The outer winding OW, coupler coil CC and inner winding IW may be formed as one continuous structure, using conventional wire embedding techniques. It should be understood that references to the coupler coil CC being connected to ends of the outer winding (OW) and inner winding (IW) should not be construed to imply that coupler coil CC is a separate entity having ends. Rather, in the context of forming one continuous structure of outer winding OW, coupler coil CC and inner winding IW, "ends" may be interpreted to mean positions corresponding to what otherwise would be actual ends—the term "connected to" being interpreted as "contiguous with" in this context.

The inner winding IW may be disposed within the outer winding OW, as illustrated, on a given surface of the card body CB (or layer of a multi-layer inlay substrate). Alternatively, these two windings of the booster antenna BA may be disposed on opposite surfaces of the card body CB or on two different layers of the card body CB (see FIGS. 5F, 5G), substantially aligned with one another (in which case they would be "top" and "bottom" windings rather than "outer" and "inner" windings. The two windings of the booster antenna BA may be coupled in close proximity so that voltages induced in them may have opposite phase from one another. The coupler coil CC may be on the same surface of the card body CB as the outer and inner windings.

The turns of the outer winding OW and inner winding IW of the booster antenna BA may be at a pitch of 0.2 mm (200 µm), resulting in a space of approximately one wire diameter between adjacent turns of the outer winding OW or inner winding IW. The pitch of the turns of the coupler coil CC may be substantially the same as or less than (stated otherwise, not greater than) the pitch of turns of at least one of the outer winding OW and inner winding IW—for example 0.15 mm (150 µm), resulting in space smaller than one wire diameter between adjacent turns of the coupler coil (CC). Self-bonding copper wire may be used for the booster antenna BA. The pitch of both the outer/inner windings OW/IW and the coupler coil CC may both be approximately 2× (twice) the diameter of the wire (or width of the conductive traces or tracks), resulting in a spacing between adjacent turns of the spiral(s) on the order of 1 wire diameter (or trace width). The pitches of the outer winding OW and the inner winding IW may be substantially the same as one another, or they may be different than each other. The outer winding OW and inner winding IW may have the same sense (clockwise CW or counter-clockwise CCW) as each other.

It is within the scope of the invention that more turns of wire for the coupler coil CC can be accommodated in a given area—for example, by laying two "courses" of wire, one atop the other (with an insulating film therebetween, if necessary), in a laser-ablated trench defining the area for the turns of the coupler coil CC.

In FIG. 2, the coupler coil CC is shown without detail, represented by a few dashed lines. Some details of its construction, and how is my be connected with the outer winding OW and inner winding IW are set forth in FIGS. 3A-3D.

FIG. 2A shows one example of a coupler coil CC component which may be laid by starting at a point "c" (coming from an outer winding OW of the card antenna CA), laying the coupler coil CC component from an outermost turn to an innermost turn thereof, in a counter-clockwise CCW direction. When the innermost winding of the coupler coil CC component is complete (point "d"), the wire may cross-over the already laid turns of the coupler coil CC component to resume (or continue) formation of the card antenna CA component (such as the inner winding IW thereof), by way of example. Some alternatives may include:
 (i) winding in a clockwise CW direction,
 (ii) laying the innermost turn and working outward to the outermost turn,
 (iii) laying only a portion of the coupler coil CC component (such as an inner winding iw thereof), exiting and laying at least a portion of another booster antenna BA component, and later returning to lay a remaining portion of the coupler coil CC component.

Figure 2B:
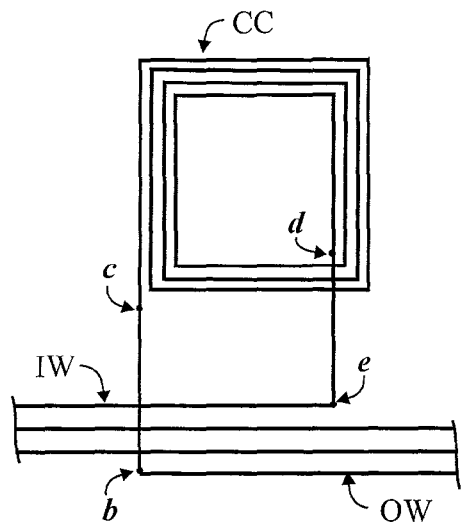

FIG. 2B shows an example of a coupler coil CC component which may be laid by starting at a point "c" (coming from an outer winding OW of the card antenna CA), laying the coupler coil CC component from an outermost turn to an innermost turn thereof, in a clockwise CW direction. When the innermost winding of the coupler coil CC component is complete (point "d"), the wire may cross-over the already laid turns of the coupler coil CC component to resume (or continue) formation of the card antenna CA component (such as the inner winding IW thereof), by way of example.

Figure 2C:
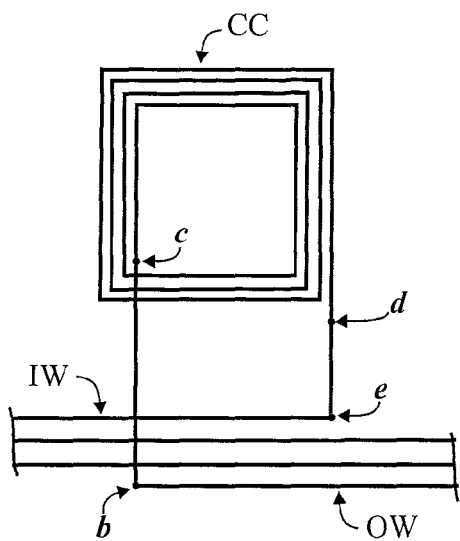

FIG. 2C shows an example of a coupler coil CC component which may be laid by starting at a point "c" (coming from an outer winding OW of the card antenna CA), laying the coupler coil CC component from an innermost turn to an outermost turn thereof, in a clockwise CW direction. (This may require several cross-overs, as illustrated.) When the outermost winding of the coupler coil CC component is complete (point "d"), the wire may be routed (no cross-over may be required) towards the periphery of the card body CB to resume (or continue) formation of the card antenna CA component (such as the inner winding IW thereof), by way of example.

Figure 2D:
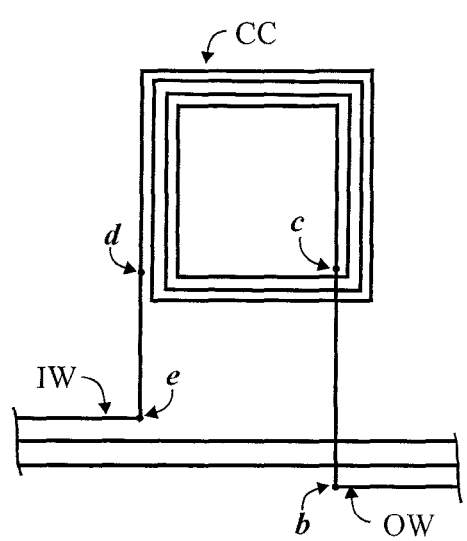

FIG. 2D shows an example of a coupler coil CC component which may be laid by starting at a point "c" (coming from an outer winding OW of the card antenna CA), laying the coupler coil CC component from an innermost turn to an outermost turn thereof, in a counter-clockwise CCW direction. When the outermost winding of the coupler coil CC component is complete (point "d"), the wire may be routed (no cross-over may be required) towards the periphery of the card body CB to resume (or continue) formation of the card antenna CA component (such as the inner winding IW thereof), by way of example.

An antenna module AM may be mounted in on the card body CB so that its module antenna MA is closely adjacent the coupler coil CC, for coupling therewith. The antenna module AM may be disposed with its module antenna MA overlapping the coupler coil CC, or with its module antenna completely within the interior of the coupler coil CC, or with entirely within the coupler coil CC. The antenna module AM may be installed in a milled cavity on the card body CB so that its module antenna MA may be substantially coplanar with the coupler coil CC. The module antenna MA may be at a different level than (not coplanar with) the coupler coil CC.

The module antenna MA for the antenna module AM may also be a coil of wire wound with either a clockwise (CW) or counter-clockwise (CCW) sense. The module antenna MA may have the same sense (CW, or CCW) as the coupler coil CC. The module antenna MA may have the opposite sense (CW, or CCW) as the coupler coil CC. The module antenna MA may have the same sense (CW, or CCW) as the outer winding OW and/or the inner winding IW. The module antenna MA may have the opposite sense (CW, or CCW) as the outer winding OW and inner winding IW.

It may be noted that NL 9100347 (NEDAP; 1992) and U.S. Pat. No. 5,955,723 (Siemens; 1999) both describe 2 coils that are of a "given dimension". For example Coils 1 & 3—Coil 1 on the chip and Coil 3 on the card—and they also say they are concentric to each other and that allows the coupling. In the arrangements described herein, the coils (MA, CC) are not restricted to being the same size, nor are they restricted to being concentrically positioned.

In the course of laying the wire (or otherwise creating conductive paths for the antenna elements OW, CC, IW, using any of a variety of additive or subtractive processes) for the booster antenna BA, it is evident that the wire (or conductive path) may need to cross over itself at several positions. For a booster antenna BA comprising wire, the wire may be insulated, typically self-bonding wire. For conductive paths, appropriate insulating or passivation layers or films may be used to facilitate cross-overs.

Booster Antenna (BA) Components and Placement on the Card Body (CB)

Figure 3A:
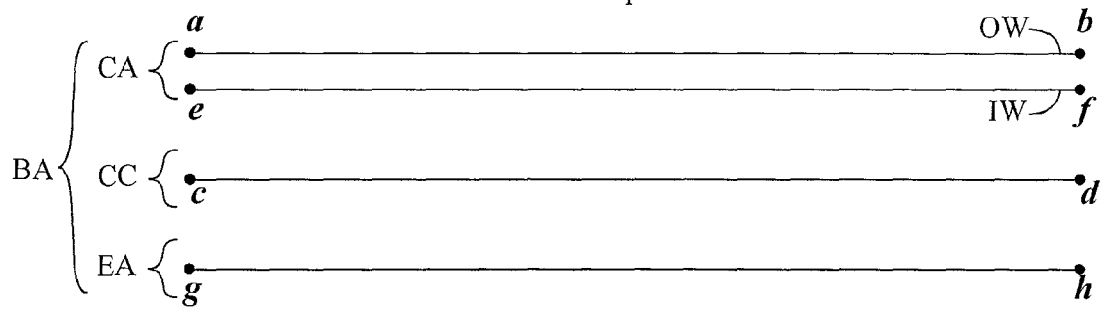
FIG. 3A is a diagram illustrating a card antenna (CA), coupler coil (CC) and extension antenna (EA) components of a booster antenna (BA).

FIG. 3A shows, schematically, some components of an exemplary booster antenna (BA)—namely:

- an exemplary card antenna CA may comprise a first winding OW having two ends "a" and "b" and a second winding IW having two ends "e" and "f", such as may have been described above.
- an exemplary coupler coil CC may have two ends "c" and "d", such as may have been described above
- the card antenna CA and coupler coil CC may be connected with one another in any suitable manner, such as may have been described above
- an antenna extension AE may be a long wire (or conductive trace) wire having two ends "g" and "h"—mounted to the card body CB in any suitable form such as (but not limited to) a spiral having a number of (at least one) turns, and may be disposed in the residual area (see 148, FIG. 1A) of the card body CB.
- the booster antenna BA components CA (OW, IW), CC and AE are illustrated as straight line segments, the dots at their two ends simply indicating an end position of the wire (or conductive trace), being included for graphic clarity.

Figure 3B:
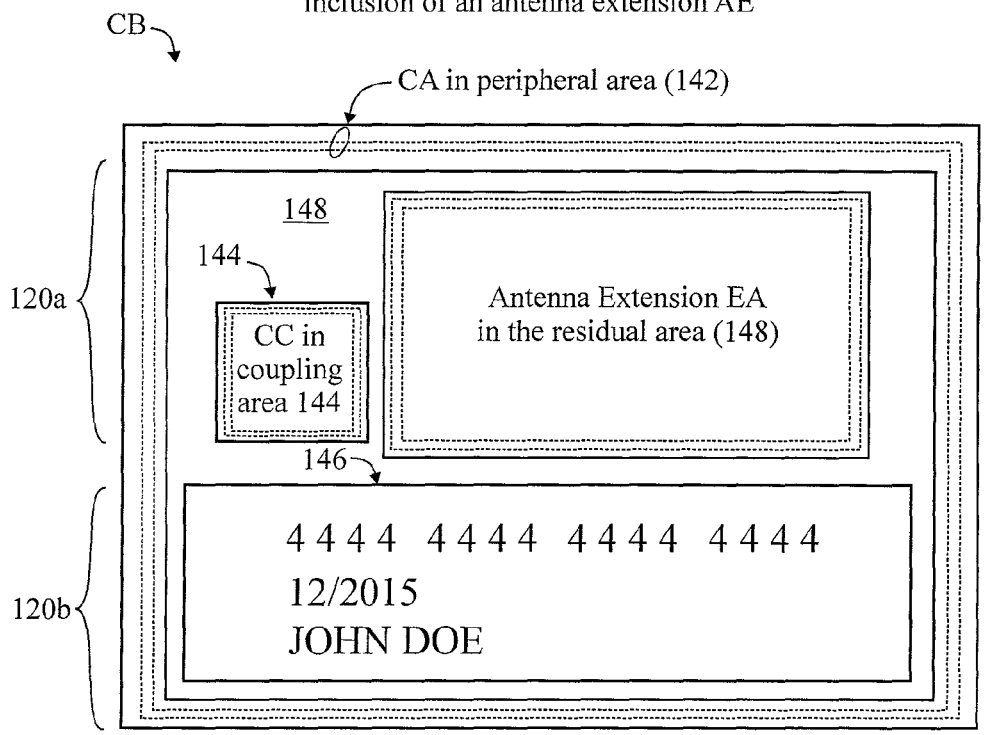
FIG. 3B is a diagram illustrating various areas of a card body CB of a smart card.

FIG. 3B expands upon FIG. 1A and illustrates, schematically and generally, the addition (inclusion) of an extension antenna EA component of a booster antenna BA disposed in the residual area (148) of a smart card. The extension antenna EA is shown only generally in this figure, it is shown in greater detail in other figures.

Some Configurations of Booster Antennas BA with Extension Antennas EA

Some configurations of booster antennas BA comprise card antennas CA which may be one winding or two windings (such as inner winding IW and outer winding OW), coupler coils CC (or coupler antennas) and extension antennas EA (or antenna extension, or extension coil, or extension loop). Each of the (CA, OW, IW, CC, EA) booster antenna components typically has two ends (see FIG. 3A), and typically has a plurality of windings (or turns). Both of the ends of a given antenna component may be connected to ends of other antenna components. Alternatively, one of the two ends of an antenna component may be a free end. Some of these components may be in the form of an open loop coil or a closed coil. An antenna component in the form of a "true" coil will exhibit a cross-over (see FIG. 4).

Figure 4:
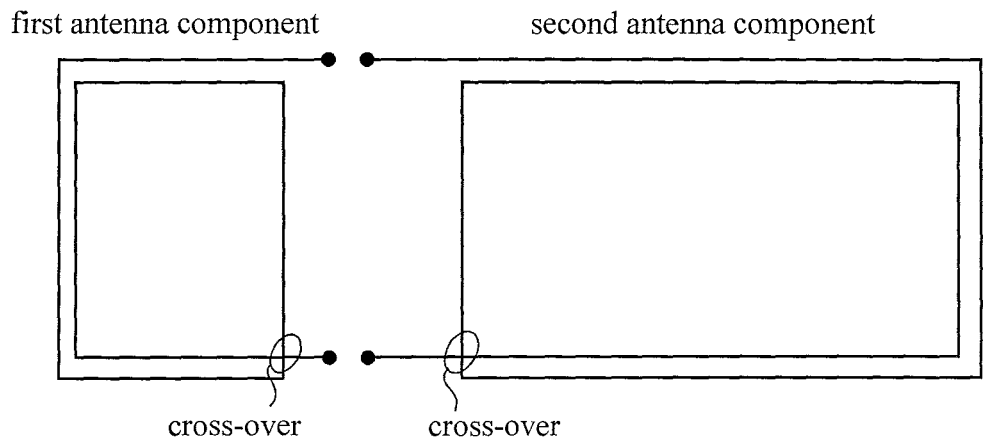
FIG. 4 is a diagram illustrating some antenna components, at least one of which is a "true" coil having a cross-over.

FIG. 4 is a diagram illustrating schematically some antenna components of a booster antenna (BA), at least one of which is a "true" coil having a cross-over. Generally, geometrically speaking, if a coil has at least one complete 360° turn, and is connected to another component that is disposed either outside of or inside of the coil—and there are no vias through the substrate (card body CB) for making connections from inside the coil to the outside thereof—it is inherently necessary that the pattern of the coil cross-over itself so that the two ends of the coil can connect with two terminals of the other component, as shown. In this figure, both of the components are true-coils. As used herein, a "true" coil may be defined as a coil, loop or spiral of wire (or other conductor) having two ends (such as "g" and "h"), extending at least approximately 360°, substantially enclosing an area (such as the coupling area 144), and crossing over itself (either from the outside in, or from the inside out).

U.S. 61/697,825 filed 7 Sep. 2012 discloses (FIG. 5H therein) a booster antenna BA comprising an inner winding IW and an outer winding OW (as disclosed herein, together the inner winding IW and outer winding OW may constitute a card antenna CA), an "open loop" coupler coil CC at the position of the antenna module AM, and an "extension" which may be referred to herein as an "antenna extension" or "extension antenna" or "extension coil" EA. See also U.S. Ser. No. 13/600,140 filed 30 Aug. 2012 (now US 20130075477 published Mar. 28, 2013, incorporated by reference herein.

Figure 4A:
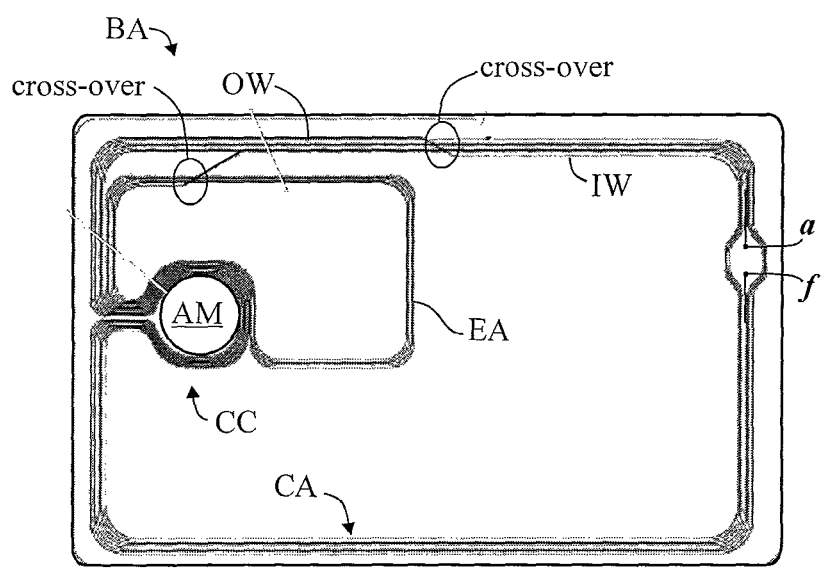
FIGS. 4A-4E are diagrams illustrating embodiments of a booster antenna (BA) with card antenna CA, a coupler antenna (CC) and an extension antenna (EA).

FIG. 4A is a diagram corresponding to FIG. 5H of U.S. Ser. No. 13/600,140, showing a booster antenna (BA) having a card antenna CA, a coupler coil CC and an extension antenna (EA). These components may be formed (embedded in the card body CB) as one continuous embedded coil. The coupler coil CC is in the form of an open loop ("horseshoe").

Note that both of the outer winding OW and inner winding IW are enlarged to form the coupler coil CC and substantially fully encircle the antenna module AM in the coupling area (144). The free ends (a, f) of the card antenna CA are shown disposed at the right edge of the card body CB.

The extension antenna EA has one end extending from an end of the coupler coil CC, and another end extending from an end of the card antenna CA, and exhibits a cross-over. The extension antenna EA (or extension coil, or extension loop) is disposed so as to have a portion adjacent two sides (or approximately 180°) of the coupler coil CC.

An antenna extension EA component is shown as an "extension" of the inner winding IW, comprising some turns of wire in a spiral pattern disposed near the antenna module AM in the left hand side of the top (as viewed) portion (120a) of the card body CB. The extension antenna EA may be disposed outside of, but near the coupling area (144) of the card body CB, in the residual area (148).

In this example, the coupler coil CC component of the booster antenna BA does not need to be a "true" coil, it does not need to have a cross-over. Rather, it may be a horseshoe-shaped "open" loop which substantially fully, but less than 360°, encircles the coupling area (144) for inductive coupling with the module antenna MA of the antenna module AM.

In this example, the card antenna CA is a true coil, in the form of a spiral extending around the peripheral area (142) of the card body CB, and exhibits a cross-over.

The extension antenna (or extension coil) EA has two ends—one end is connected to the coupler coil CC, the other end is connected to the card antenna CA. The extension antenna EA may be formed as a spiral of wire embedded in the card body CB, contiguous with one or more of the card antenna CA and coupler coil CC, and is a true coil which exhibits a cross-over, and contributes to the inductive coupling of the booster antenna BA. The extension antenna EA may be disposed in the residual area (148) of the card body CB, and is shown as being disposed only in the upper half (120a) of the card body CB, but it may extend to the lower half (120*b*) of the card body CB, including any or all of adjacent to, above, below or into the embossing area (146).

Figure 4B:
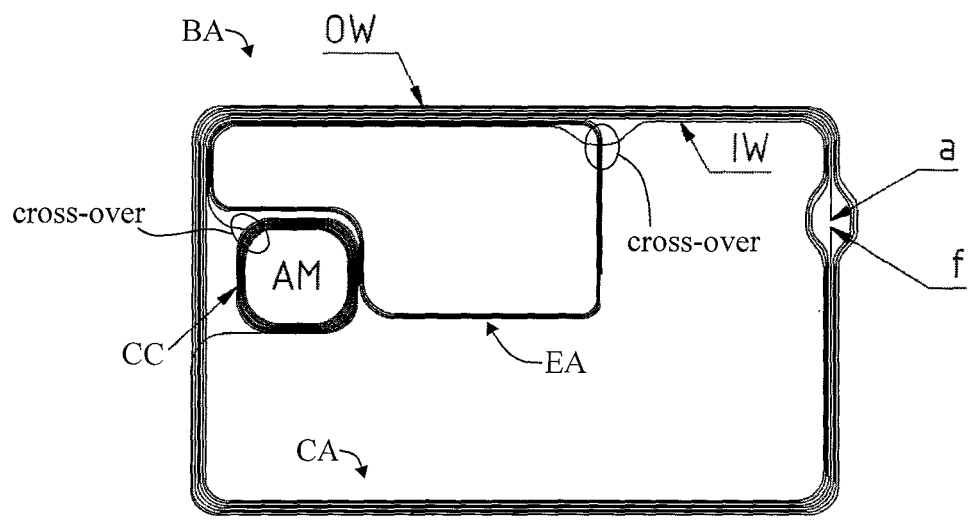

FIG. 4B is a diagram showing a booster antenna BA having a card antenna CA, a coupler coil CC and an extension antenna EA. These components may be formed (embedded in the card body CB) as one continuous embedded coil. The coupler coil CC is in the form of a closed loop, having a cross-over.

The extension antenna EA (or extension coil, or extension loop) has one end extending from an end of the coupler coil CC, and another end extending from an end of the card antenna CA, and exhibits a cross-over. The extension antenna EA is disposed so as to have a portion adjacent two sides (or approximately 180°) of the coupler coil CC.

In this example, the layout of the inner winding (IW) and outer windings (OW) of the card antenna CA are slightly different than in FIG. 4A. The inner winding IW of the card antenna CA passes over the extension antenna EA at a different location than in FIG. 4A. In this example, the coupler coil CC forms a closed loop (rather than the horseshoe shown in FIG. 4A) around the antenna module AM, has a cross-over, and may therefore may be considered to be a "true" coil.

In this example, the extension coil EA is a true coil having a cross-over, is disposed in the residual area (148) of the card body CB, and is shown as being disposed only in the upper half (120*a*) of the card body CB, but it may extend to the lower half (120*b*) of the card body CB and into the embossing area (146). In this example, the extension antenna (EA) may occupy a larger area and have a narrower pitch (closer spacing of windings) than the extension antenna EA of FIG. 4A.

A benefit of having the extension antenna EA in a booster antenna BA may be to increase the inductivity of the booster antenna BA while reducing its resonance frequency. For example, without the extension antenna EA, the card antenna CA may require significantly more windings (such as in excess of 15 windings, instead of only 7 or 8 windings), depending on the spacing between the windings and the diameter or cross sectional area of the conductor of the wire used to form the booster antenna BA. It is within the scope of the invention that the card antenna CA has only one winding.

Additionally, the extension antenna EA may increase the inductive coupling between the module antenna MA of the antenna module AM and the coupler coil CC of the booster antenna BA, and this may be more important than increasing the inductivity of the booster antenna BA. A high level of inductive coupling between (using transformer terminology) the "primary side" (coupler coil) and the "secondary side" (module antenna) improves the transfer of energy and communication (signaling) integrity. Better coupling may also reduce the quality factor (Q) and increase performance.

The booster antennas (BA) of FIGS. 4A and 4B both show card antennas CA having an inner winding (IW) and an outer winding (OW). Compare FIG. 2.

Figure 4C:
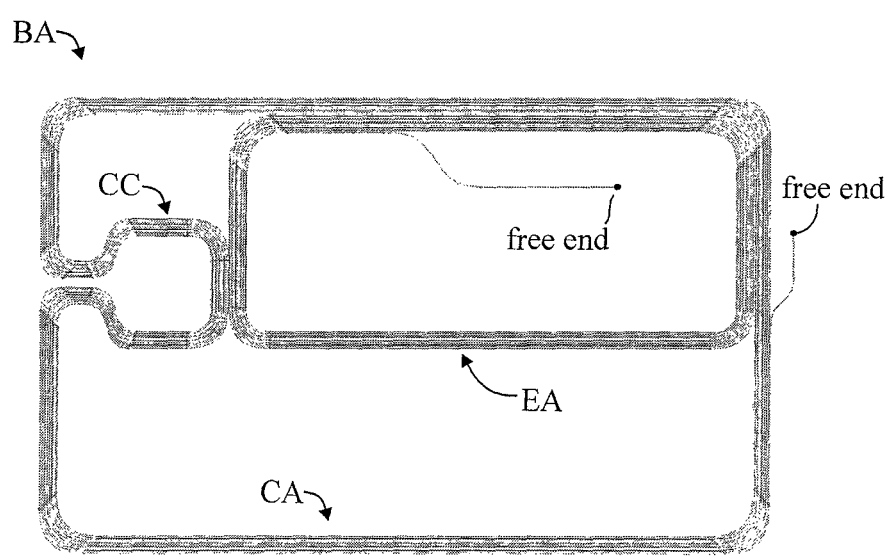

FIG. 4C is a diagram showing a booster antenna BA having a card antenna CA, a coupler coil CC and an extension antenna EA. These components may be formed (embedded in the card body CB) as one continuous embedded coil. The coupler coil CC is in the form of an open loop ("horseshoe").

The extension antenna EA (or extension coil, or extension loop) has one end extending from an end of the card antenna CA, its other end is a free end. The extension antenna EA is disposed so as to have a portion adjacent one side (or approximately 90°) of the coupler coil CC.

The card antenna CA may be a single coil (not having an inner winding IW and an outer winding OW as in some of the previous examples), having one free end.

The coupler coil CC may be a open loop, rather than a "true coil", and may be horseshoe-shaped, encircling most, but not all of the coupling area (144).

The extension antenna EA may be a continuation of an end of the card antenna CA, and may have one free end which is left unconnected. The extension antenna EA my be disposed to interact on one side of the coupler coil CC. The extension antenna EA may have several turns of wire, but does not need a cross-over.

Figure 4D:
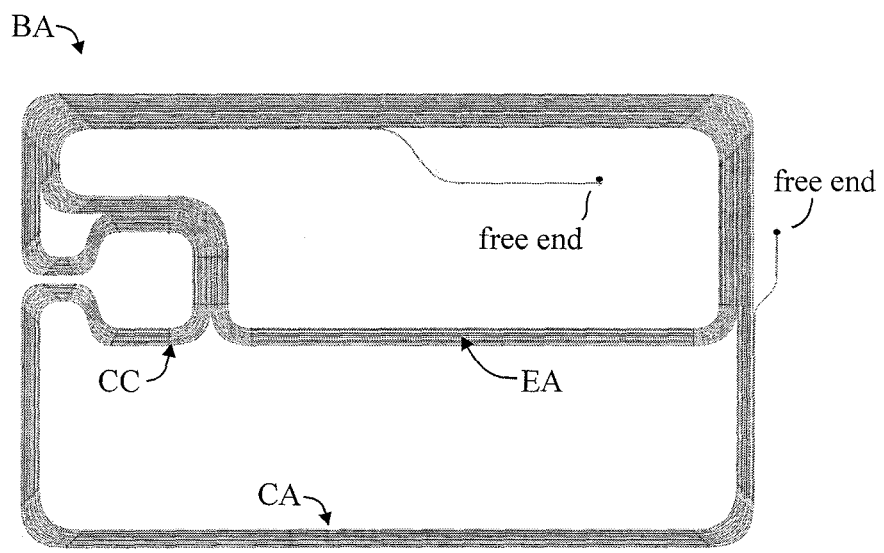

FIG. 4D is a diagram showing a booster antenna BA having a card antenna CA, a coupler coil CC and an extension antenna EA. These components may be formed (embedded in the card body CB) as one continuous embedded coil. The coupler coil CC is in the form of an open loop ("horseshoe").

The extension antenna EA (or extension coil, or extension loop) has one end extending from an end of the card antenna CA, its other end is a free end. The extension antenna EA is disposed so as to have a portion adjacent two sides (or approximately 180°) of the coupler coil CC.

In this example, the card antenna CA is one coil (does not have inner winding IW and outer winding OW as in some of the previous examples.) In this example, the coupler coil CC is not a "true coil", it is horseshoe-shaped and encircles most, but not all of the coupling area (144).

The extension antenna EA has one end which is an extension of the coupler coil CC, the other end is a free end. A free end makes possible the arrangement of a coil without a cross-over. In this example, the extension antenna (EA) is disposed to have portions adjacent two sides of the coupler antenna (CC).

In some of the booster antenna BA designs described herein, the card antenna CA component of the booster antenna BA may have a total of 12 windings (or turns)—for example, 6 windings each for the inner winding IW and outer winding OW, or a total of 12 for a simple card antenna CA. The extension antenna EA may have two functions, firstly to lower the resonance frequency of the booster antenna BA to the desired resonance of 13.56 MHz from approximately 18.00 MHz, for example with only 10 windings (wire diameter 80 to 112 μm and a pitch of 100 μm) in the antenna extension EA may reduce the resonance frequency by 5 MHz, and secondly to regulate or concentrate the electromagnetic field when in close coupling proximity to the external contactless reader (see FIG. 1) at around 20 mm. The extension antenna EA may increase the coupling factor between the coupler coil CC and the module antenna MA of the antenna module AM.

The ability to reduce the number of windings required in the card antenna CA may enhance the performance and manufacturability of the smart card. More windings makes the card stiffer, and there is not a lot of room in the peripheral area (142) of the card body CB, particularly below the embossing area (146) to accommodate very many turns of wire.

A "coupling area" (144) may be defined as the area immediately under the antenna module AM (and its module antenna (MA)). The coupler coil CC may be typically located in the coupling area. The extension antennas EA may be disposed in other than the coupling area, as discussed above, but nevertheless may enhance the overall coupling between the booster antenna BA and the module antenna MA, and/or the booster antenna BA and the antenna of an external reader.

In FIGS. 4C and 4D, the one end of the extension antenna EA may be connected with the coupler coil CC, rather than with the card antenna CA.

FIGS. 4C and 4D illustrate how the shape and position of the extension antenna EA may be varied, with respect to the card antenna CA and coupler antenna CC, in order to tune the RF characteristics of the booster antenna BA. FIG. 4C shows a design where the extension antenna EA may be disposed along only one side of the coupler coil CC, or coupler antenna) and two sides of the card antenna CA. FIG. 4D shows the extension antenna EA disposed adjacent two sides of the coupler antenna (CC) and two sides of the card antenna CA.

A number of benefits may be attributable to the use of an extension antenna EA as a component of a booster antenna BA. Some variations of the extension antenna EA include how it is disposed with respect to the coupler coil CC component, as well as how it is disposed with respect to the card antenna CA component. The extension antenna EA may be a true coil, connected at at least one of its two ends to one or both of the coupler coil CC and card antenna CA. Its other end may also be connected to one or both of the coupler coil CC and card antenna CA, or may remain as a free end.

Figure 4E:
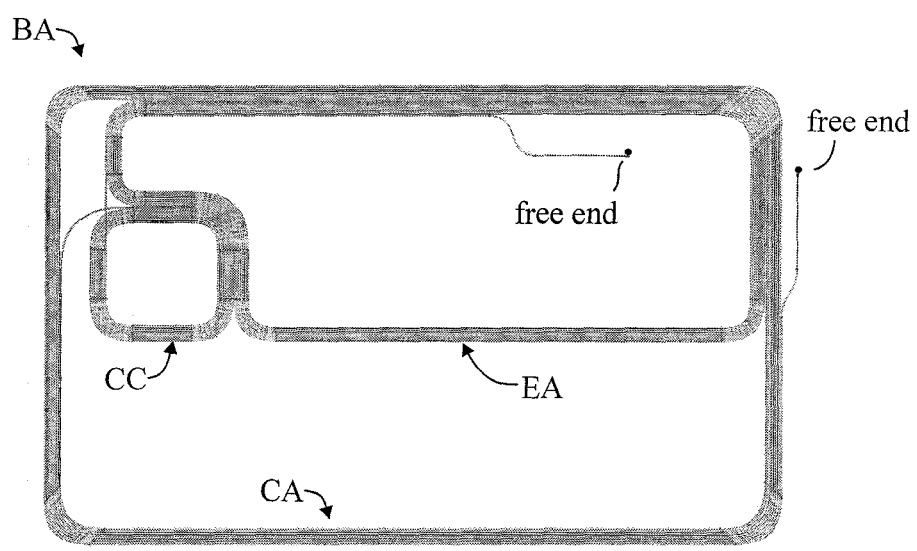

FIG. 4E is a diagram showing a booster antenna BA having a card antenna CA, a coupler coil CC and an extension antenna EA. These components may be formed (embedded in the card body CB) as one continuous embedded coil. The coupler coil CC is in the form of a closed loop.

The extension antenna EA (or extension coil, or extension loop) has one end extending from an end of the coupler coil CC, its other end is a free end. The extension antenna EA is disposed so as to have a portion adjacent two sides (or approximately 180°) of the coupler coil CC.

The card antenna CA may comprise one coil (without an inner winding IW and an outer winding OW as in some of the previous examples), and may have a free end. In this example, the coupler coil CC is a true coil, and has a cross-over.

This design features a low number of turns at the perimeter of the card body CB below the embossing area (or "5$^{th}$ line" of embossing). The extension antenna (EA) may be disposed to have portions adjacent two sides of the coupler antenna (CC), and may have a free end.

In this example, the extension antenna EA have one end extending from the coupler coil CC and its other end may be a free end. The extension antenna EA may be disposed along two sides of the coupler antenna (CC).

Booster Antenna BA Components Disposed Primarily in the Top Half of the Card Body CB Reference is made to U.S. Ser. No. 13/600,140 filed 30 Aug. 2012 (now US 20130075477), particularly FIGS. 6A,B,C thereof, and also to U.S. 61/697,825 filed 7 Sep. 2012, particularly FIG. 6D thereof, all of which are incorporated by reference herein.

Figure 4F:
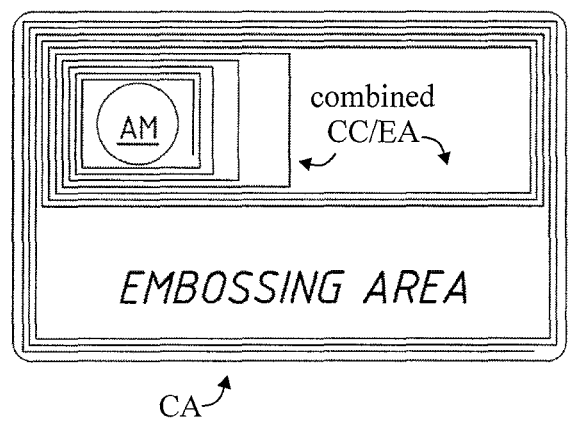

FIG. 4F shows that the booster antenna BA may extend around the peripheral area (142) of the card body CB, and also into the coupling area (144) and the residual area (148), while avoiding the embossing area (146). In this example, the coupler coil CC and extension antenna EA are essentially combined with one another, as a coil wherein the turns increase in pitch as the combined CC/EA booster antenna component extends across the residual area.

There is no true center to the coil formed by the combined coupler coil CC and extension antenna EA components, and the antenna module AM is positioned asymmetrically with respect to the combined CC/EA antenna component, and the degree of asymmetry can be varied by varying the pitch of the turns within the extension antenna (EA) in the area above the embossing area.

Figure 4G:
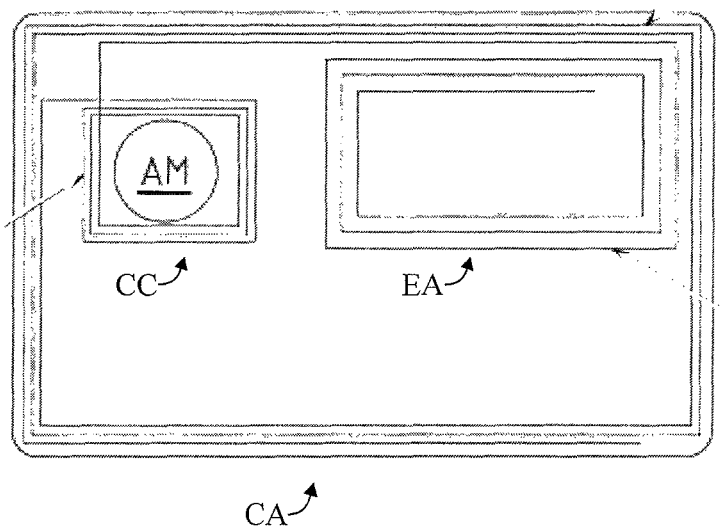

FIG. 4G is a diagram showing a booster antenna (BA) having a card antenna CA, a coupler coil CC and an extension antenna (EA). These components may be formed (embedded in the card body CB) as one continuous embedded coil.

The extension antenna EA has one end connected with an end of the coupler coil CC, its other end is a free end. The pitch (spacing between turns) of the extension antenna EA may be different than the pitch of the coupler coil CC. Both the extension antenna EA and coupler coil CC may have pitches different than that of the card antenna CA.

The coupler coil CC is shown as a "true" coil (closed loop), having a crossover. The extension antenna EA may be connected at one end to one end of the coupler coil CC, the other end of the extension antenna EA may be a free end (not connected to another booster antenna BA component. The extension antenna EA may not have a cross-over. The extension antenna EA may have a pitch (spacing between adjacent turns) which is different than that of the coupler coil CC, and the pitch can be selected in order to vary the capacitance of the extension antenna (EA) and hence tune the resonance frequency of the booster antenna (BA). The components of the booster antenna (BA) may be formed as a continuous wire embedded coil.

FIG. 4H is a diagram showing a booster antenna (BA) having a card antenna CA, a coupler coil CC and an extension antenna (EA). These components may be formed (embedded in the card body CB) as one continuous embedded coil.

The extension antenna EA has one end connected with an end of the coupler coil CC, its other end is a free end. The pitch (spacing between turns) of the extension antenna EA may be formed with varying pitches—for example, increasing in pitch towards its inner turns (versus its outer turns), for example a narrow pitch at the outer turns and a wider pitch at the inner turns of the extension antenna EA. The pitch of individual turns of the extension antenna EA may be adjusted to match the booster antenna (BA) resonance frequency.

FIG. 4I is an illustration of a booster antenna (BA) with card antenna CA, a coupler antenna (CC) and an extension antenna (EA). The antenna may be laid on the card body CB as a continuous embedded coil.

The extension antenna EA comprises two coils EA-1 and EA-2 which may be connected in series with one another, as shown. One end of the coil EA-1 is connected with an end of the coupler coil CC, the other end of the coupler coil CC may be a free end. The other end of the coil EA-2 is connected with a first end of the coil EA-2. The other end of the coil EA-2 is connected with an end of the card antenna CA, the other end of the card antenna CA may be a free end. The two coils EA-1 and EA-2 of the extension antenna EA may be laid with the same sense (both clockwise), or with opposite senses (one clockwise, the other counter clockwise).

This concept can be applied to more than two extension antennas (EAs). The two or more extension antennas (EAs) may have independently different sizes, shapes, pitch and number of turns, and each one may have a varying (increasing or decreasing) pitch. The use of multiple extension antennas (EAs) allows for flexibility in the design of the extension antenna (EA) system in order to tune, including adjusting at least one of the inductance and the resonance frequency, of the booster antenna (BA). The use of multiple extension antennas (EAs) can ultimately improve the coupling between the booster antenna (BA) and the module antenna (MA).

In the various embodiments disclosed herein, the booster antenna BA may be a continuous embedded coil(s) of wire. All of the antenna components may be formed from a single continuous length of wire. Some of the components, or some portions thereof may be formed from conductive tracks other than wire, such as by additive (e.g., printing) or subtractive (e.g., etching) processes.

Some Additional Configurations of the Coupler Coil (CC)

Figure 5A:
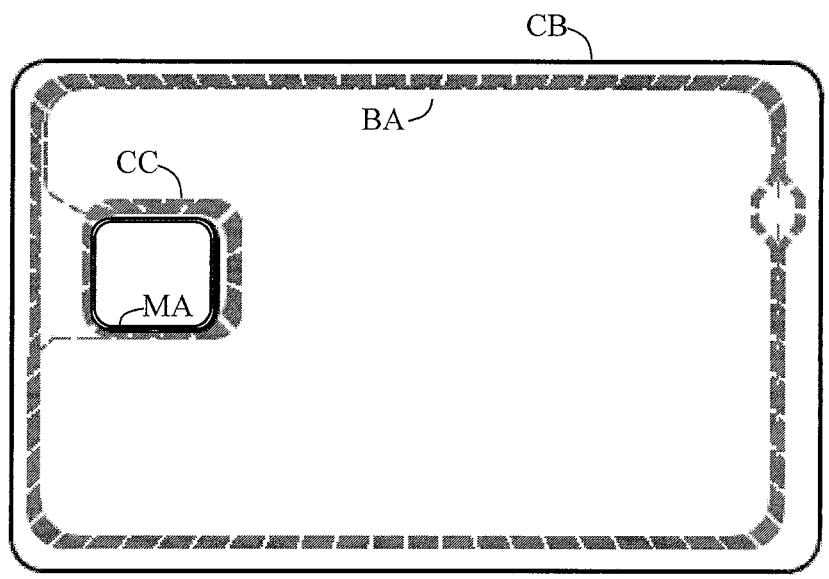
FIG. 5A is an illustration of a booster antenna (BA) with its coupler antenna (CC) disposed slightly off-center from the module antenna (MA) of an antenna module (AM).

FIG. 5A shows a booster antenna BA with a coupler coil CC. Details such as outer winding OW and inner winding IW of the booster antenna BA are omitted, for illustrative clarity. An antenna module AM with module antenna MA may be mounted in the card body CB (not shown), as described above.

Here it can be observed that the middle of the antenna module AM, which may be nominally (typically) coincident with the center of the module antenna MA, is offset noticeably from (substantially non-coincident with) the middle (center) of the coupler coil CC.

The offset between the center of the module antenna MA from the center of the coupler coil CC need not be great to avoid any implication that they are substantially coincident (substantially concentric). First of all, the antenna module AM and its module antenna MA measure only approximately 8 mm-10 mm on a side (square). One millimeter is a significant offset on this scale. Furthermore, whereas U.S. Pat. No. 5,955,723 (Siemens, 1999) is adamant that the coupler coil (third loop) and module antenna (first loop) must be disposed "substantially concentrically", better coupling may be achieved by having the offset shown in FIG. 5A. And the offset may facilitate overlapping of the module antenna MA with one or two sides of the coupler coil CC, for increased coupling therebetween. In FIG. 5A it may be observed that the module antenna MA overlaps the bottom and left sides of the coupler coil CC. (The module antenna MA and coupler coil CC are both somewhat rectangular, each having four sides.)

Figure 5B:
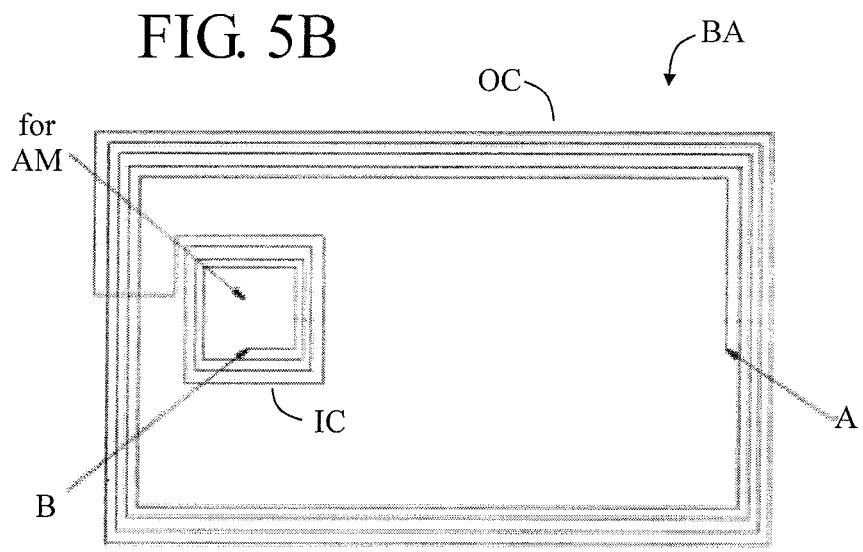
FIG. 5B is an illustration of a booster antenna (BA) with a coupler coil (CC) having a free end.

FIG. 5B is an illustration of a booster antenna (BA) with a coupler coil (CC) having a free end, and shows a booster antenna BA having an card antenna CA (peripheral portion) which may be referred to as an "outer coil" OC and a coupler coil CC (coupler portion) which may be referred to as an inner coil IC defines a coupling area for the antenna module AM (not shown). Overall, there are only two free ends—an end "A" of the outer coil OC, and an end "B" of the inner coil IC.

The outer coil OC is shown being laid from its end "A" counterclockwise CCW, from inner turn to outer turn, then after approximately 10 turns, heading inward to start laying the inner coil IC. The inner coil IC is shown being laid clockwise (CW), from an outer turn to an inner turn, then after approximately 20 turns ending at the point "B".

The sense CW of the inner coil IC is shown opposite from the sense CCW of the outer coil OC. They may, however, have the same sense.

The outer coil OC is shown being laid from innermost to outermost turn. Alternatively, it may be laid from outermost turn to innermost turn.

The inner coil IC is shown being laid from outermost turn to innermost turn. Alternatively, it may be laid from innermost turn to outermost turn.

The pitches for the inner coil IC and outer coil OC may be the same, or different than one another. The pitches for each of the inner coil IC and outer coil OC may be non-uniform, including progressive, such as increasing from turn-to-turn from inner to outer turns of the respective coil.

Figure 5C:
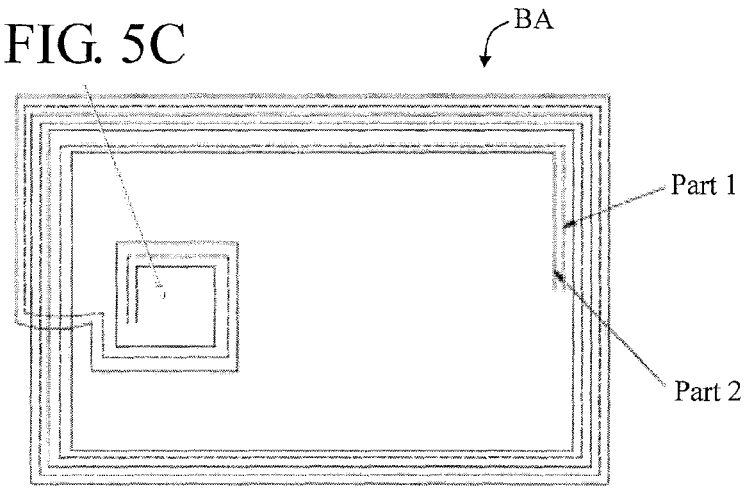
FIG. 5C is an illustration of a booster antenna (BA) with a coupler coil (CC) which is formed as an extension of windings of the card antenna (CA).

FIG. 5C shows a booster antenna BA having two windings or parts, designated "Part 1" and "Part 2". Each of these parts has two free ends, and has an outer peripheral portion and an inner coupling portion.

The outer peripheral portion of each part may be laid from its end, counterclockwise CCW, from an inner turn to an outer turn, then after approximately 5 turns, thereafter heading inward to start laying the inner portion. The inner portions are shown being laid also counterclockwise CCW, from an outer turn to an inner turn, then after approximately 10 turns ending at the point "B". The number of turns is merely illustrative, and the senses can be reversed.

The two parts—Part 1 and Part 2—may be realized interleaved (as illustrated) on the same surface of a substrate (card body CB), or on opposite sides of the substrate, or on two layers of a multi-layer substrate. The two parts may be substantially identical with one another.

Figure 5D:
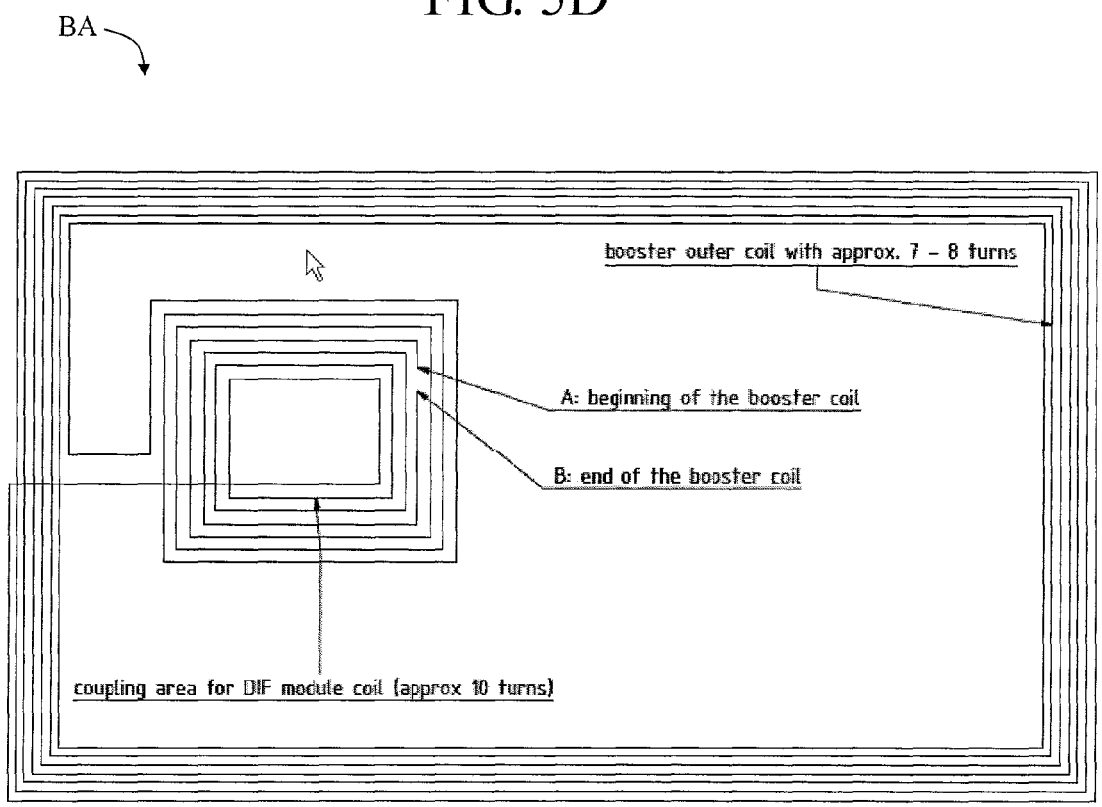
FIG. 5D is an illustration of a booster antenna (BA) with a coupler coil (CC) having two free ends within the coil.

FIG. 5D shows that a peripheral portion of the booster antenna BA may have no free ends (it is continuous), and the coupler coil CC may have two free ends. This configuration may be laid starting at point A, at an interior turn of the coupler coil CC, proceeding counterclockwise CCW and outward to an outer turn of the coupler coil CC, moving towards the periphery of the card body CB and proceeding clockwise CW, laying the peripheral portion of the booster antenna BA from inside turn to outside turn, then returning to the interior of the card body CB to complete laying the coupler coil CC from an inner turn, proceeding counterclockwise CCW to the interior turn and ending at a point B on the interior turn (which may be the same interior turn as point A). Points A and B are the two free ends of the single wire (or conductive track) forming the booster antenna BA. The outer portion may comprise approximately 7-8 turns, the inner portion may comprise approximately 10 turns.

Other alternative designs are possible. For example, connecting ends of the module antenna MA to a portion or end of the booster antenna BA or coupler coil CC (or similar portion of a booster antenna BA.

a "Folded" Coupler Coil

U.S. 61/841,286 filed 29 Jun. 2013 (Finn, Czornack) discloses a "folded" coupler coil. See FIGS. 5A, 5B therein.

Figure 5E:
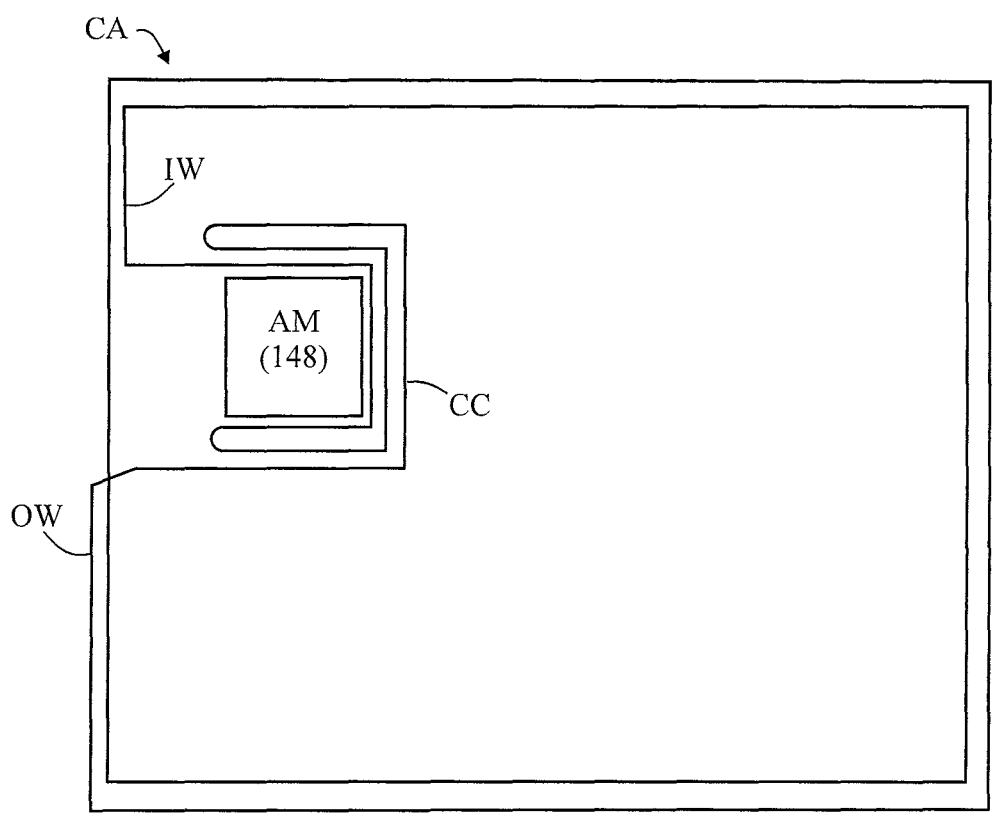
FIG. 5E is a diagram illustrating a "folded" coupler coil CC.

FIG. 5E shows a booster antenna BA and its coupler coil component CC. The coupler coil CC in this example has two ends, several windings, and may be formed by embedding a wire nearly all (such as approximately three-quarters of the way of the way around a coupling area (144), the reversing direction and going back to the starting position, then reversing position and again going three-quarters of the way around the coupling area, and so forth.

The card antenna CA of the booster antenna BA is shown having only a few turns, for illustrative clarity, and exhibits a cross-over. The coupler coil CC is shown without a cross-over, one end of the coupler coil CC being connected to an inner winding of the card antenna CA, the other end of the coupler coil CC being connected to an outer winding of the card antenna CA.

A Compound Booster Antenna (BA)

FIGS. 5F,G,H illustrate forming two booster antennas, each having a partial coupler coil, in two different planes, such as one booster antenna on each of two opposite sides of the card body (substrate), or on two separate layers which may then be laminated together.

FIG. 5I shows that a first booster antenna BA-1 may be formed on one side of the card body CB with its coupler coil component CC-1 encircling the top half (approximately 180°) of the antenna module AM. FIG. 5J shows that a second booster antenna BA-2 may be formed on the opposite side of the card body CB with its coupler coil component CC-2 encircling the bottom half (approximately 180°) of the antenna module AM.

Each of the booster antennas BA-1, BA-2 may comprise a outer winding OW and inner winding IW, and may have two free ends "a" and "f". The free ends (a, f) of the booster antennas BA-1, BA-2 are shown towards the bottom of the right edge of the card body CB.

FIGS. 5F and 5G show an embossing area (in dashed lines) on the bottom portion of the card body CB, which is an area "reserved" for embossing, in which the booster antennas BA-1 and BA-2 should not encroach. They may however pass along (just inside of) the bottom edge of the card body CB.

FIG. 5H shows that in combination with one another, the two booster antennas BA-1 and BA-2 provide full enclosure (approximately 360°) of the antenna module AM. In FIG. 5K, the card body (CB) and antenna module (AM) are omitted, for illustrative clarity. The two booster antennas BA-1 and BA-2 may constitute what may be referred to as a "composite booster antenna".

It should be understood that in various ones of the configurations for booster antennas shown herein that booster antennas other than FIG. 2 type quasi-dipole (Q-D) booster antenna (BA) may be employed to achieve the desired enclosure of the antenna module AM and consequent improvements to coupling between the module antenna and the booster antenna.

Some Additional Arrangements of a Booster Antenna (BA)

In the following embodiments, the antenna module (AM) is disposed on the upper portion of the card body (CB) of a smart card, in a conventional manner, and the booster antenna (BA) is also disposed primarily (substantially, including fully) on the upper portion of the card body (CB). The lower portion (Embossing Area) of the card body CB is "reserved" for embossing, and other than a small area at the perimeter is generally not available for a booster antenna.

Figure 6A:
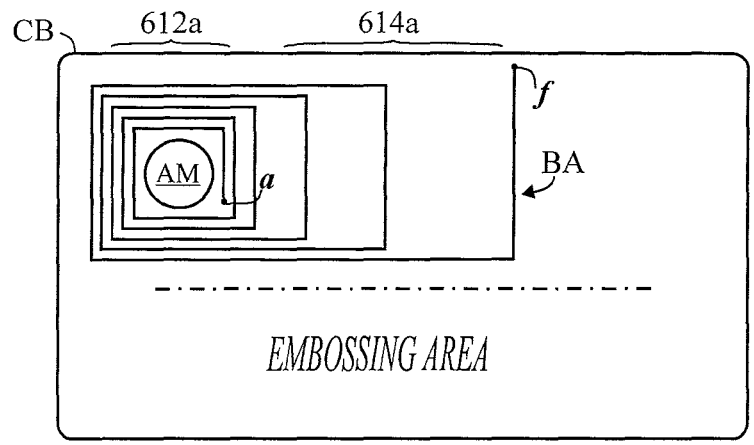
FIGS. 6A,B,C,D are diagrams (plan view) of additional configurations for booster antennas (BA), disposed primarily in the top half of the card body (CB).

FIG. 6A (similar to FIG. 4F) illustrates a smart card having a card body CB, an antenna module AM disposed in the upper portion of the card body CB. A booster antenna BA is generally in the form of a rectangular spiral of wire (or other conductive material), having two free ends "a" and "f". Only a representative few turns of the booster antenna BA are illustrated.

A portion 612a of the booster antenna BA is closely spiraled around the antenna module AM in the manner of the coupler coils (CC) described hereinabove with respect to FIGS. 3, 3A-3D. This "coupler portion" 612a of the booster antenna BA may have a relatively small pitch. Although the coupler portion 612a is shown as being at one end portion of the overall booster antenna BA, it may be created at an portion, such as a midsection of the booster antenna BA.

A remaining portion 614a of the booster antenna BA has a pitch that may increase across the width of the card body. The general idea is that the booster antenna BA may cover substantially the entire width of the card body. Since the width of the card body is greater than its height, even more so when comparing the width of the card body with the height of the upper portion only, there is more room in the width dimension for the turns of the booster antenna to spread out, and this area may be advantageously utilized.

If the coupler portion 612a were formed at a midsection of the overall booster antenna BA (rather than at one end, as shown), the remaining portion 614a of the booster antenna would have two portions (or "poles") extending from the coupler portion 612a, forming a kind of dipole antenna. This would be analogous to the FIG. 3 type booster antenna, described as a "quasi-dipole" which has an outer winding OW and an inner winding IW extending from a more-or-less central coupler coil CC.

Figure 6B:
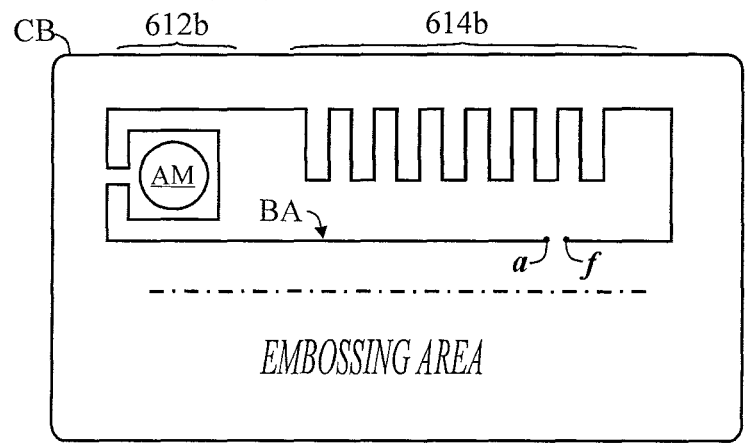

FIG. 6B illustrates a smart card having a card body CB, an antenna module AM disposed in the upper portion of the card body CB. A booster antenna BA is generally in the form of a rectangular loop of wire (or other conductive material), having two free ends "a" and "f". Only a representative few turns of the booster antenna BA are illustrated.

A portion 612b of the booster antenna BA, which may be referred to as a "coupler portion", is closely spiraled around the antenna module AM in the manner of the coupler coils (CC) described hereinabove with respect to FIGS. 3, 3A-3D.

A remaining portion 614b of the booster antenna BA extends across the width of the card body, and includes a portion which is formed with a zig-zag, for improved capacitance. This remaining portion 614 may exhibit a spiral pattern.

In the embodiments of FIGS. 6A and 6B, the booster antenna BA is illustrated disposed entirely within the upper portion of the card body CB, not encroaching on the lower embossing area. However, it is evident that the ends "a" and "f" of the booster antenna(s) could extend into the embossing area.

Figure 6C:
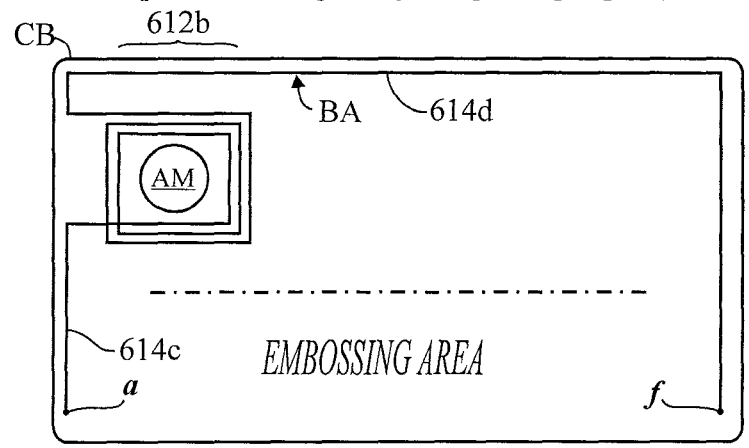

FIG. 6C illustrates a smart card having a card body CB, an antenna module AM disposed in the upper portion of the card body CB. A booster antenna BA is generally in the form of a rectangular loop of wire (or other conductive material), having two free ends "a" and "f". Only a representative few turns of the booster antenna BA are illustrated.

A portion 612c of the booster antenna BA, which may be referred to as a "coupler portion", is closely spiraled around the antenna module AM in the manner of the coupler coils (CC) described hereinabove with respect to FIGS. 3, 3A-3D.

In this example, the coupler portion 612c is shown formed at a midsection of the overall booster antenna BA (rather than at one end, as shown), and there are two remaining portions 614c, 614d of the booster antenna BA extending from the coupler portion 612c, forming a kind of dipole antenna. This is somewhat analogous to the FIG. 2 type booster antenna, described as a "quasi-dipole" which has an outer winding OW and an inner winding IW extending from a more-or-less central coupler coil CC.

The remaining portion 614c extends from one end of the coupler portion 612c along a side edge (left side, as viewed) of the card body CB into the embossing area. (This is acceptable to have a portion of the booster antenna BA in a peripheral region only of the embossing area.)

The remaining portion 614d extends from the other end of the coupler portion 612c along the top edge of the card body CB to the right (as viewed) side edge thereof, thereafter extending down the right edge of the card body CB into the embossing area.

The booster antenna BA with remaining portions 614c and 614d extending from the two ends of the coupler portion 612c) forms a kind of dipole antenna which is somewhat analogous to the FIG. 2 type booster antenna.

Figure 6D:
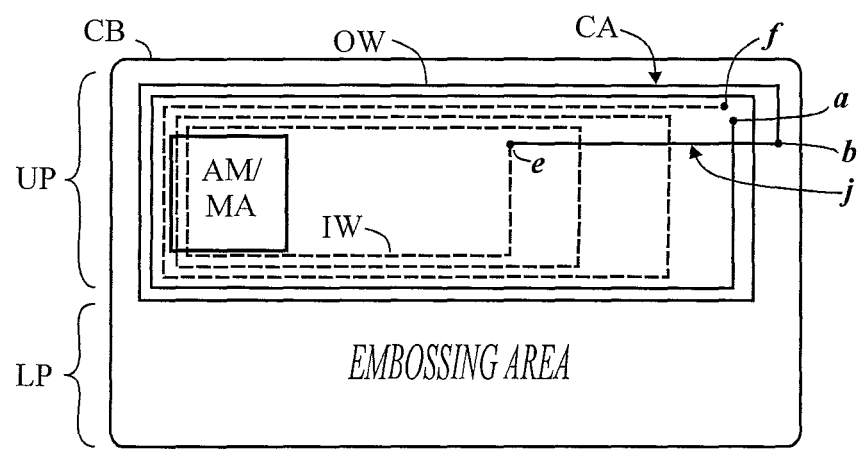

FIG. 6D shows a configuration for a card antenna CA having an outer winding OW and an inner winding IW. The card antennas described hereinabove occupy substantially the entire peripheral portion of the card body CB, the card antenna CA is disposed within and near all four (top, right, left, bottom) edges of the card body CB. In contrast therewith, the card antenna CA of FIG. 8 occupies only approximately the top half of the surface of the card body CB, leaving the bottom half of the card body CB free for embossing, etc. In other words, the card antenna CA of FIG. 8 may extend along substantially all of the top side edge of the card body CB, only about halfway down the right and left side edges of the card body, and across a central portion of the card body. The overall area encompassed by the card antenna CA is only about half of the overall area of the card body CB.

The card antenna CA may be configured as quasi-dipole with inner and outer windings (IW/OW), the outer end "b" of OW connected via jumper "j" to inner end "e" of IW, the inner end "a" of OW and outer end "f" of IW are free ends.

The module antenna MA of antenna module AM may overlap only a portion of the inner winding IW. There is no distinct coupler coil CC. The "center" of any given windings of the OW and IW of the card antenna CA is outside of the area of the antenna module AM The pitch of the turns of the outer winding OW and/or inner winding IW may vary (such as increase) across the width of the card body CB, as illustrated.

Some Characteristics of the Booster Antenna and its Components

The booster antenna BA and its various components may be formed of various size wire ranging, for example, from approximately 50 µm to 112 µm in diameter. A single continuous wire may be modified, such as with a conductive coating to have different diameters for different ones of the booster antenna components. Flat wire can also be used, and may be beneficial for booster antenna components which may extend into the embossing area (146). Wires having different resistances, or a single continuous wire having portions with different resistances may be used for the various components of the booster antenna.

The number of turns and the spacing of the turns of the booster antenna BA and its various components may be varied to control characteristics of the booster antenna BA and its performance.

DISTINGUISHING OVER SOME OF THE PRIOR ART

U.S. Pat. No. 5,955,723 (Siemens; 1999), incorporated by reference herein, discloses a contactless chip card having a first conductor loop connected to the semiconductor chip and at least one second conductor loop with approximately the dimensions of the data carrier, and a region forming a third loop with approximately the dimensions of the first conductor loop. Inductive coupling is described.

In the Siemens patent, there is no disclosure of an additional antenna extension (EA), nor is there any disclosure of the conductor loops (comparable to the "booster antenna" BA described herein) components extending into the embossing area (146) or into the residual area (148) (or embossing are) of a card body (CB), as disclosed herein.

U.S. Pat. No. 8,130,166 (Assa Abloy; 2012), incorporated by reference herein, discloses a coupling device is formed by a continuous conductive path having a central section in the form of a small spiral and two extremity sections which are formed as large spirals. The pitches of the large spirals are chosen such that the large spirals have mainly a capacitive behavior. The pitch of the small spiral is chosen such that the small spiral has mainly an inductive behavior.

In the Assa Abloy patent, the large spirals appear to be in the peripheral area (142), and the small spiral appears to be in the coupling area (144). There is no disclosure of an additional antenna extension (EA), nor is there any disclosure of the coupling device (comparable to the "booster antenna" BA described herein) components (small and large spirals) extending into the embossing area (146) or into the residual area (148) (or embossing are) of a card body (CB), as disclosed herein.

Figure 11A:
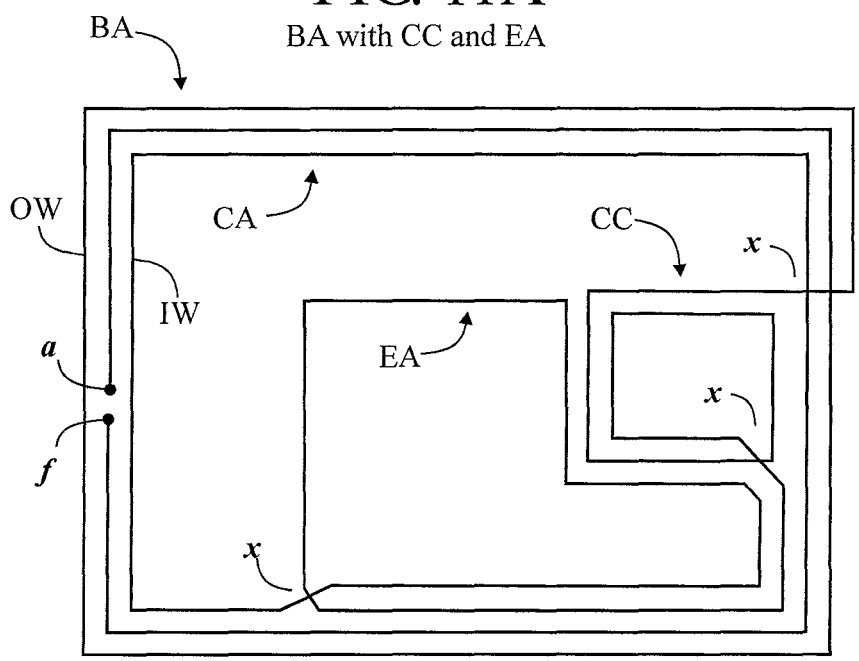

US 20130146671 (Infineon; 2013), discloses a booster antenna structure for a chip card, which may include an additional electrically conductive structure connected to the booster antenna. The additional electrically conductive structures disclosed therein are principally capacitive structures. FIG. 11A (for example) shows a booster antenna structure with a finger capacitor. FIG. 12A (for example) shows a booster antenna structure with a spiral capacitor. FIG. 12B (for example) shows a booster antenna structure with a dummy turn as capacitor. FIG. 13A shows a meander shape (the additional electrically conductive structure may have a meander structure). The structures which form the capacitor, and the booster antenna structure, may be arranged in the same plane. In this case, no additional structural layer is required in which one of the components is arranged separately, but both the structures forming the capacitor and the booster antenna structure may be formed in a forming process on the same layer, i.e. in the same plane, that is to say, for example, on one or on two sides of the carrier on which the booster antenna structure is arranged. The capacitor may also be configured as line capacitor and arranged, for example, as dummy turn. The dummy turn may have two conductor tracks extending next to one another, the winding direction of the two conductor tracks being opposite with respect to one another so that the dummy turn does not supply any or a negligible contribution to the inductance of the booster antenna structure.

Figure 7:
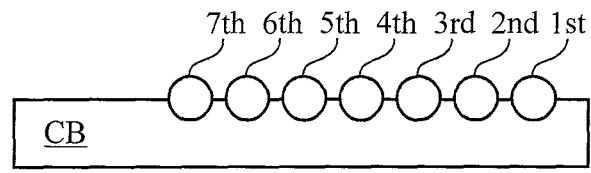
FIG. 7 is a cross-sectional illustration of wire coil comprising 7 windings embedded on a substrate of a card body (CB).

The Infineon publication discloses various embodiments of a booster antenna structure for a chip card, wherein the booster antenna structure may include a booster antenna; and an additional electrically conductive structure connected to the booster antenna. Attention may be directed to FIGS. 7, 8B, 9, 12A, 12B, and 13-15 therein, wherein:

FIG. 7 shows a section of a booster antenna structure according to various embodiments;

FIG. 9 shows a circuit diagram of a system of reading unit and a contactless chip card module arrangement according to various embodiments;

FIG. 9 shows a circuit diagram 900 of a system having a reading unit 902 (also called PCD (proximity coupling device)) and a contactless chip card module arrangement 904 (also called PICC (proximity integrated circuit card)).... The chip card module 908 has an off-chip coil 918 which is connected to the chip which is modeled by a parallel circuit of an on-chip capacitor 920 and an on-chip resistor 922, the latter representing the ohmic consumption of the chip . . . . The booster antenna structure 906 is represented by a resonant circuit in the form of a series circuit which has a booster antenna coil 912, a booster capacitor 914 and an additional electrically conductive structure, for example a booster resistor 916. In the circuit of the booster antenna structure 906, the booster resistor 916 may also be connected alternatively in parallel with the arrangement which has the booster antenna coil 912 and the booster capacitor 914.

Claim 1 is directed to A booster antenna structure for a chip card, wherein the booster antenna structure comprises: a booster antenna; and an additional electrically conductive structure connected to the booster antenna.

FIG. 12A shows a booster antenna structure according to various embodiments with a spiral capacitor;

FIG. 12B shows a booster antenna structure according to various embodiments with a dummy turn as capacitor;

A further possible form which the capacitance can have is shown in FIG. 12A. To illustrate, the booster antenna structure 1200 is here also represented by only one turn 1202 and connected to a spiral capacitor 1204. A spiral capacitor 1204 may be understood in various embodiments to be a capacitor which has two conductor tracks forming a conductor track string and extending next to one another, the conductor track string being rolled together to form a spiral. In this arrangement, the spiral does not need to have a circular shape, it can also be oval or a polygon having rounded corners. The capacitance value of the spiral capacitor is adjustable, for example by adapting parameters which have already been mentioned in conjunction with the finger capacitor.

Another further possible shape which the capacitance can have is shown in FIG. 12B. The booster antenna structure 1210 has three turns 1212 in this case. Furthermore, the end of the inner turn of the turns 1212 of the booster antenna structure 1210 is followed by an inductive coupling area 1216 which is surrounded by coupling turns 1218. The, for example, three coupling turns 1218 are here formed from an extension of one end of an inner turn of the turns 1212 of the booster antenna structure 1210. The end of the conductor track formed by the coupling turns 1218 is followed by a dummy turn 1214 which forms the capacitor. The dummy turn 1214 has two conductor tracks extending in parallel next to one another, the first conductor track 1220 being coupled to the end of the conductor track which forms the coupling turns 1218 and the second conductor track 1222 being coupled to the end of the outer turn of the turns 1212 of the booster antenna structure 1210. The first conductor track 1220 and the second conductor track 1222 have an opposite direction of circulation with respect to one another. The ends of the first conductor track 1220 and of the second conductor track 1222 are open or are not connected to any other structure analogously to the end of the conductor track double string which forms the spiral capacitance 1204 in FIG. 12A. The double string which is formed by the first conductor track 1220 and the second conductor track 1222 as such has two turns, wherein its course can deviate from the course shown in FIG. 12B and can be matched to unoccupied areas in the plane of the booster antenna structure 1210 or to areas to be kept free which, for example, are reserved for embossed lettering.

It may be noted that the turns or tracks in the Infineon publication are not shown crossing over one another. Therefore, they do not form a "true" coil which would contribute to the inductance of the booster antenna. Compare U.S. Pat. No. 8,130,166 (Assa Abloy; 2012) which shows (FIGS. 3, 5, 6 therein) crossovers for all of their spirals (booster antenna components). In the present invention, the antenna extension EA is in the form of a "true" coil, involves at least one crossover, and contributes to the inductance of the booster antenna BA.

Controlling Force and Ultrasonic Power During Wire Embedding

An embedding head (or tool) for embedding the wire for the booster antenna BA and its various components in the substrate may comprise an ultrasonic transducer (or sonotrode) vibrating a capillary tube through which the wire being embedded extends (or is fed) onto the surface of the substrate. By imparting an ultrasonic vibration of the tool while applying a downward force (urging the tool downward, with a force), the wire may be caused to embed itself, at least partially, into the surface of the card body CB substrate. Reference may be made to U.S. Pat. No. 6,698,089 (2004; Finn et al) and U.S. Pat. No. 6,233,818 (2001; Finn et al), incorporated by reference herein, which disclose embedding wire in a substrate using a sonotrode. See, for example, FIGS. 1 and 3 of the '089 patent.

The booster antenna (BA) (and any of its components CA, OW, IW, CC, AE) may comprise several turns of wire embedded very close to one another. When embedding the several turns of a booster antenna (BA), notably the peripheral card antenna (CA) portion thereof, it may be appreciated that the first turn of wire may be embedded in the "native" substrate of the card body (CB), and may interfere (resisting or blocking, in a manner of speaking) with the embedding of subsequent turns of the booster antenna (BA).

FIG. 7 shows the cross-section of a typical coil (booster antenna component) embedded on a substrate of a card body CB and shows the sequence used to scribe the 7 coil windings. A first ($1^{st}$) turn may be laid or embedded in the card body CB, followed by a second ($2^{nd}$) turn, followed by a third ($3^{rd}$) turn, followed by a fourth ($4^{th}$) turn, followed by a fifth ($5^{th}$) turn, followed by a sixth ($6^{th}$) turn, followed by the final seventh ($7^{th}$) turn. Evidently, when the second and subsequent turns are being embedded, the process can be resisted by the first and other previously-embedded turns.

A method is disclosed herein for controlling at least one of the downward force which is exerted by the embedding tool and a power of the ultrasonic vibration while embedding the wire in the surface of the substrate. Various benefits may be obtained, such as improved embedding of the wire, more consistent embedding of the wire, and reduced pitch (closer spacing) of turns of the wire in a booster antenna BA component (for example) which may allow for more turns of wire (hence, more inductance) in a given space (such as, but not limited to the peripheral area 146 of the card body CB).

Figure 7A:
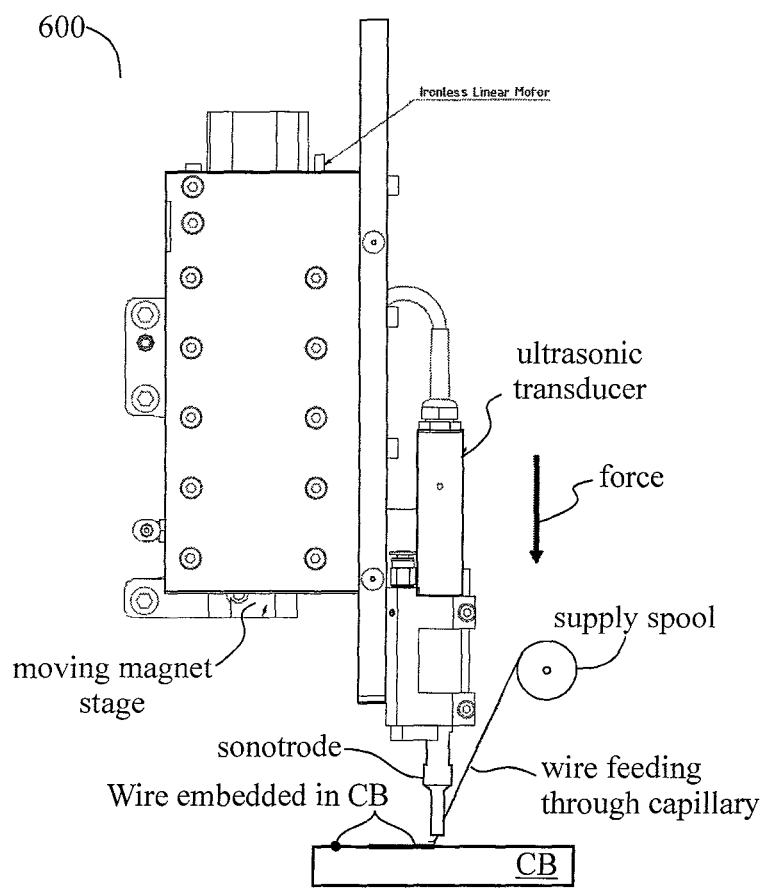
FIG. 7A is a diagram illustrating an embedding device based on a controlled sonotrode.

FIG. 7A shows a device 600 for embedding wire (such as for a booster antenna (BA) in a substrate (card body CB) may comprise an ultrasonic transducer a sonotrode a capillary with wire exiting (feeding out) from one end thereof means for urging the device downward with a given force The means for urging the device for embedding downward may comprise a linear actuator comprising a movable part with at least one coil and a fixed part having magnets. The downward force imparted to the capillary may be proportional to current flowing through the coil(s) of the movable part. For the purposes of this invention the downward motion of the device will be along an axis defined as the "z-axis", set perpendicular to the plane of the card body (CB). The plane of the card body (CB) will be denoted the "x-y plane" with the device moving across the x-y plane along an "x-axis" and a "y-axis" set perpendicular each other.

The embedding device 600 may be based on a controlled sonotrode. The device has a moving stage control system allowing downward force control.

An additional actuator (not shown), such as a pneumatic piston may be provided to apply an upward force to the capillary when current flow to the coil(s) is turned off, such as at the commencement and termination of the embedding operation.

According to an aspect of the invention, a force profile may be established so that the force of embedding can be controlled based on position, for example (but not limited to) applying a first force (f1) at the beginning of embedding, a second force (f2) during embedding a first turn of a booster antenna BA, a third force (f3) during embedding subsequent turns of the booster antenna BA, etc. An exemplary force profile is presented in FIG. 7B.

During embedding of the wire, either or both of the ultrasonic power provided by the sonotrode and the downward force exerted by the capillary may be controlled, and varied at different positions along the path of embedding the wire, to facilitate embedding. For example, power or force may be changed at turns (for example at the corner of the card body CB when embedding a rectangular spiral shaped card antenna CA). Better control over embedding may be achieved. Closer spacing of turns of a given booster antenna BA coil component (IW, OW, CC, AE) may be achieved.

Figure 7B:
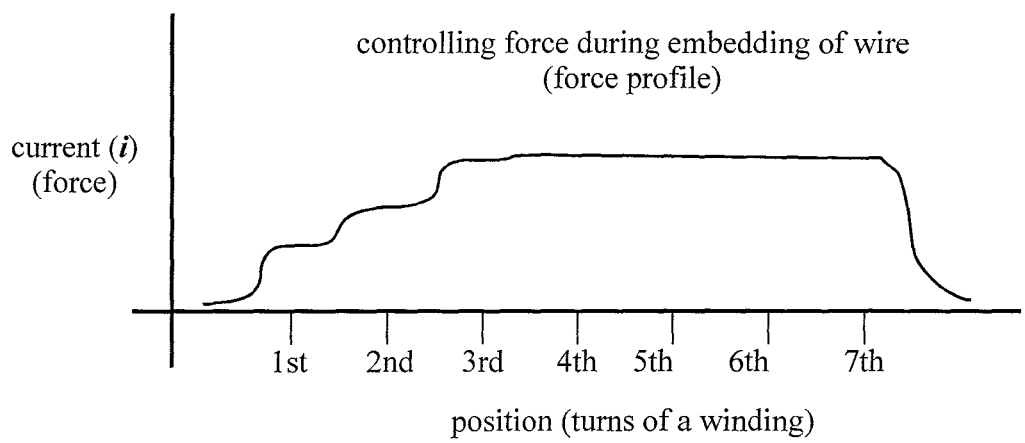
FIG. 7B is a graph illustrating an example of force profile for embedding a series of consecutive turns of a booster antenna (BA) into the substrate of a card body (CB)

FIG. 7B illustrates an example of force profile for embedding a series of consecutive turns of a booster antenna (BA) into the substrate of a card body (CB). (Ultrasonic power may be profiled in a similar manner.)

The downward force being applied, via the capillary, during embedding, may be increased or reduced, as desired, at any given location (position) on the substrate (card body CB) during embedding of wire, such as for the booster antenna (BA), including the peripheral card antenna (CA) portion thereof and the inner coupler coil (CC) thereof.

Typical forces may be in the range of a few hundred grams (a few Newtons). Given a typical sonotrode diameter of approximately 4 mm this gives typical pressures or the order of a few hundred kPa. The downward force being applied, via the capillary, during embedding, may be reduced to zero where the wire has to "jump over" previously-embedded wires. During embedding, control may be switched between downward force and vertical position of the capillary. The invention enables a high degree of control over the embedding process. During embedding, at any point in the X-Y plane of the card body (CB), several parameters can be controlled and varied. These include: the speed of movement over the entire device in the x-y plane, the power fed to the sonotrode, the height of the sonotrode above the sample (for example when performing a jump), the downward force exerted by the sonotrode during embedding. Of course, when making a cross-over, force may be reduced to nearly zero, and the ultrasonic power may (or may not) be turned off.

Controlling Bonding of a Wire

In some cases (other than the examples of embedding the booster antenna components which have been described herein), it may be necessary to bond the wire to bond pads on the card body, or on the RFID chip. For example, when bonding a wire of an antenna coil to a module tape MT for an antenna module AM, or wire bonding the RFID chip to the module tape MT.

Bonding of a wire to bond pads of a chip module CM or to contact pads of interconnects on the module tape MT may be realized using a thermode, which essentially welds the wire to the pad. The integrity of the bonds is of course important, and can be monitored with an optical inspection system. During bonding, the wire is deformed, and may exhibit a diameter which is (for example) approximately 30% smaller than its pre-bond diameter. A typical wire being bonded may have an initial diameter of 112 µm.

According to an embodiment of the invention, the position of the thermode may be measured, with micrometer precision, to achieve a deformation of the wire in a range of values centered around a target value representative of (for example) a 30% reduction in the diameter of the wire. The position of the thermode may be monitored to ensure that wires which are bonded are in this range, and when they are not, the thermode may be cleaned, or the process re-calibrated to ensure successful subsequent bonds.

Figure 8:
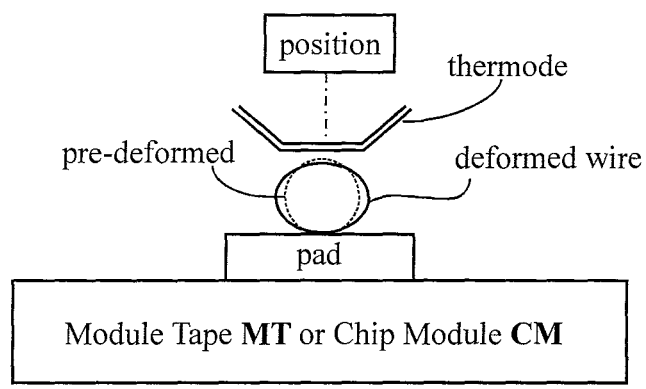
FIG. 8 is a diagram illustrating a technique for bonding a wire to a pad.

FIG. 8 shows a wire bonder comprising a thermode, and means for measuring position, and also shows a wire (pre-deformed) being bonded to a pad, and the resulting bonded wire which is deformed (squished). By precisely measuring the deformation of the wire as it is being bonded, the quality of the resulting bond can be inferred, with a high degree of confidence. As the thermode becomes dirty, the measured thickness may change, and the thermode can be cleaned.

Capacitive Stubs

U.S. Ser. No. 13/931,828 filed 29 Jun. 2013 (US 20130299598, 14 Nov. 2013) discloses an antenna module (AM) for a transponder (or smartcard, or secure document) including a module antenna (MA) comprising a main antenna structure ("A") and two additional antenna structures ("B", "C") connected to the main antenna structure and functioning as "capacitive stubs".

Figure 9A:
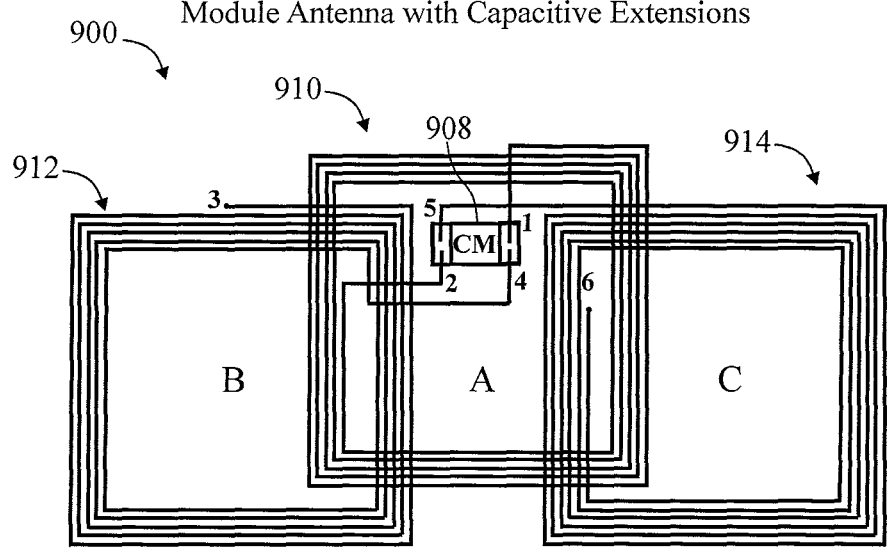
FIG. 9A is a schematic representation of an antenna module (AM), according to an embodiment of the invention.
Figure 9B:
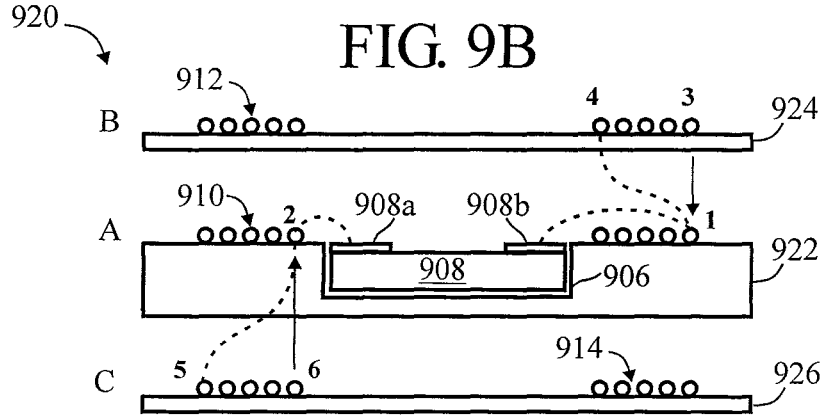
FIG. 9B is a cross-sectional view diagram of the antenna module of FIG. 9A.

FIGS. 9A, 9B illustrate an embodiment of an antenna module (AM) 900 for a transponder comprising
a chip module (CM) 908 having two terminals 908a, 908b
an inductive wire antenna (A) 910 formed as a flat coil of embedded wire having a number (such as 12) of turns, and two ends—an outer end 1 (at the end of an outer one of the turns) and an inner end 2 (at an end of an inner one of the turns)
The overall length of the antenna A may be 400 mm
The ends 1 and 2 of the antenna A may be connected to the terminals of the chip module.
The chip module may be disposed within (interior to) the turns of the antenna A.
The outer turn of the antenna A may cross over inner turns of the antenna A to be routed to the chip module CM.
The antenna A is an "antenna structure".
capacitive antenna extensions (or stubs) B and C also formed as flat coils of embedded wire having a number of turns, and connected to the inductive wire antenna as described below.
The stubs B,C are "antenna structures"

The chip module 908 and antenna A 910 may be disposed in or on a layer 922 of a multi-layer antenna substrate 900. The chip module 908 may be disposed in a recess (pocket) 906 extending partially through the layer 922 (as illustrated), or may be disposed in a recess (opening) extending completely through the layer 922, with the chip module 908 being supported by an underlying layer 924.

The chip module is illustrated in FIG. 9B "face up", with its terminals for connecting with the antenna A on its top side. Alternatively, the chip module may be orientated "face down" with its antenna-receiving terminals on its bottom side (and extend through the substrate 922, for example), and another set of terminals (not shown) for a contact interface on its top side.

Other variations for the AM 900 may include, but are not limited to . . .
the antenna A may be on the bottom of the layer 922
the stub B 912 may be on the bottom of the layer 924
the stub C 914 may be on the bottom of the layer 926
the stubs B and C may be on the top and bottom surfaces of a single layer which is either above or below the layer 922

The stub B 912 may be formed as a flat coil of wire having a number (such as 12) of turns and two ends—an outer end 3 of an outer turn and an inner end 4 of an inner turn—in a layer 924 overlying the layer 922. The stub B may have an overall length of approximately 400 mm, and may be aligned with (directly over) the antenna A.

The stub C 914 may be formed as a flat coil of wire having a number (such as 12) of turns and two ends—an outer end 5 of an outer turn and an inner end 6 of an inner turn—in a layer 926 underlying the layer 922. The stub C may have an overall length of approximately 400 mm, and may be aligned with (directly under) the antenna A. The stub C may be aligned with (directly under) the stub B. The stubs B and C may be formed by etching, printing, or other processes, instead of (other than) using embedded wire.

In the schematic view of FIG. 9A, the antenna A and stubs B, C are shown laterally offset from each other. In FIG. 9B, the inductive wire antenna A and capacitive antenna extensions B and C are shown positioned and aligned atop one another. As best viewed in FIG. 9A, the antenna structures A, B, C may each be formed in a flat coil pattern having a number of turns, an overall length (from end to end), and a footprint (length×width), and may be substantially identical with one another in these regards. As best viewed in FIG. 9B, the antenna structures A, B, C may be disposed substantially directly over one another.

FIG. 9B illustrates that the number of turns, length, width, pitch and pattern of the stubs B, C may be substantially the same (match) as each other and they may be aligned one atop the other in layers of the antenna module 200 so that their turns are aligned with one another, turn-for-turn. The stubs B, C may also substantially match and be aligned with the antenna A. Capacitance and the resonant circuit is formed between A+B and A+C. Antenna A is shown disposed in a layer between the layers for stubs B and C. Antenna A could alternatively be disposed in a layer above or below both of the layers for stubs B and C.

Dashed lines ( - - - ) indicate that the inner end 4 of the stub B 912 may be connected to the outer end 1 of the antenna A 910, such as at the terminal 908*b*, and the outer end 5 of the stub C may be is connected to the inner end 2 of the antenna A, such as at the terminal 908*b*. The outer end 3 of the stub B and the inner end 6 of the stub C may be left unconnected (remain open).

Alternatively, the vertical arrows (↓, ↑) indicate that the outer end 3 of the stub B may be connected to the outer end 1 of the antenna A (such as at terminal 208*b*), and the inner end of stub C may be connected with the inner end of the antenna A.

Note that in either case, "opposite" (inner versus outer) ends of the stubs B, C are connected to the two ends 1, 2 of the antenna A—in other words, the inner end 4 of B and the outer end 5 of C. As used herein, "connected in an opposite sense" means that the inner end of one of the two stubs (B or C) is connected with one end of the antenna (A), and the outer end of the other of the two stubs (C or B) is connected with the other end of the antenna (A). It is generally not desirable that the "same" (such as both inner) ends of the stubs are connected with the ends of the antenna A. The connections (interconnects) discussed herein can be made in any conventional manner, such as by vias through layers, traces on layers, bonding, soldering, crimping, welding, etc.

Locating the stubs B and C over each other in close proximity with the antenna A between them forms additional resonant circuits between the A and the stubs B, C realized by the stray capacitance between the antenna structures A, B, C. The interaction between the coupled stubs B and C exposed to the same electromagnetic field from the antenna A may advantageously reduce the self-resonance (or self-resonant) frequency of the antenna A. Stub B is close to antenna A and stub C is close to antenna A, ergo stub B is close to stub C.

In electronics, capacitors and inductors have parasitic inductance and capacitance, respectively. For a capacitor, the inductance is primarily due to the physical dimensions including the leads. Since a capacitor and inductor in series creates an oscillating circuit, all capacitors and inductors will oscillate when stimulated with a step impulse. The frequency of this oscillation is the self-resonant frequency (SRF).

The dimensions of the antenna module 900 may be approximately 15 mm×15 mm. Due to the relatively small available area, an inductive wire loop of the size of the antenna module may have a self-resonance frequency of approximately 75 MHz. The over-layered close coupled antenna structures (stubs B and C) may function as a wire formed capacitor—with open wire ends (3 and 6)—that may reduce the resonance frequency of the formed transponder to a more desirable value of approximately 13~17 MHz, thereby increasing the voltage and transferred power to the chip module.

Two Module Antenna Segments (MA1, MA2)

U.S. Ser. No. 14/078,527 filed 13 Nov. 2013 discloses various configurations for components (CA, CC, EA) of booster antenna (BA). For example, A module antenna (MA) may have two windings connected with one another in a quasi-dipole configuration.

Figure 9C:
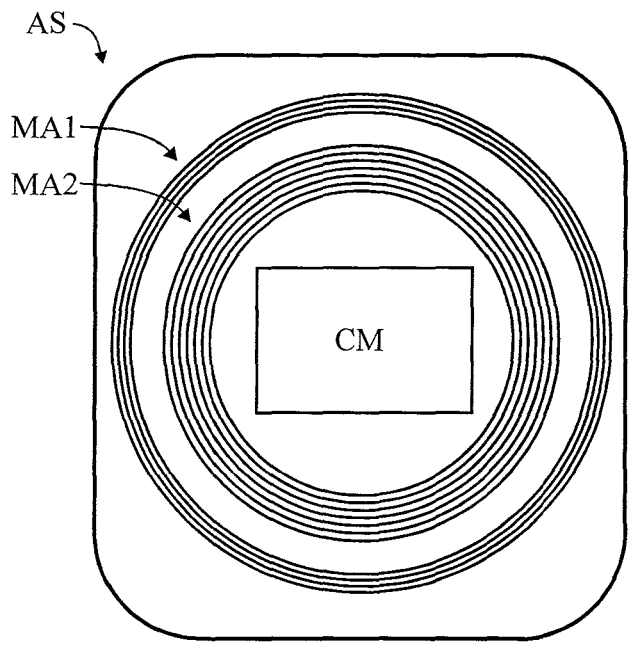
FIG. 9C is plan view of the underside of a module tape (MT) for an antenna module (AM), showing an antenna structure (AS) having two antenna segments (MA1, MA2).

FIG. 9C illustrates the underside of a module tape MT for an antenna module (AM). An antenna structure (AS) for a module antenna (MA) is shown, comprising two module antenna segments MA1 and MA2. These two module antenna segments MA1, MA2 may be arranged concentric with one another, as inner and outer antenna structures. Both module antenna segments MA1, MA2 may be wound coils, or patterned tracks, or one may be a wound coil and the other a pattern of tracks. The two module antenna segments MA1, MA2 may be interconnected with one another in any suitable manner to achieve an effective result.

Figure 9D:
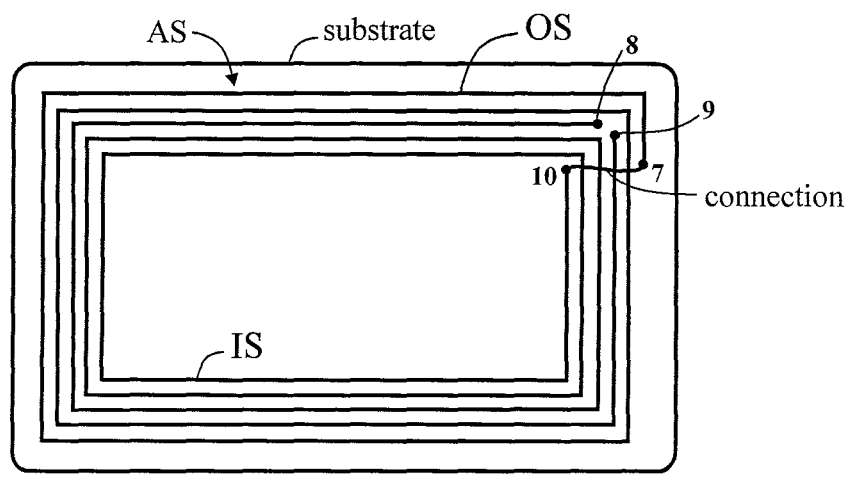
FIG. 9D is a diagrammatic view of an antenna structure (AS).

FIG. 9D illustrates an exemplary antenna structure AS which may be used in an antenna module AM, having two segments (compare MA1, MA2) which are interconnected with one another, the antenna structure comprising an outer segment OS having an outer end 7 and an inner end 8 an inner segment IS having an outer end 9 and an inner end 10 the outer end 7 of the outer segment OS is connected with the inner end 10 of the inner segment IS the inner end 8 of the outer segment OS and the outer end 9 of the inner segment IS are left unconnected this forms what may be referred to as a "quasi dipole" antenna structure AS.

Such an arrangement is shown in U.S. Ser. No. 13/205,600 filed Aug. 8, 2011 (published as 20120038445, Feb. 16, 2012, issued as U.S. Pat. No. 8,474,726 Jul. 2, 2013) for use as a booster antenna BA in the card body CB of a smartcard SC. See FIG. 2C therein.

Such an arrangement is shown in U.S. Ser. No. 13/310,718 filed Dec. 3, 2011 (published as 20120074233, Mar. 29, 2012, issued as U.S. Pat. No. 8,366,009 Feb. 5, 2013) for use as a booster antenna BA in the card body CB of a smartcard SC. See FIGS. 3 and 4A therein.

Coupler Coil (CC) with Inner and Outer Windings

As mentioned in conjunction with the booster antenna (BA) shown (for example) in FIG. 2, a single antenna component (such as the peripheral card antenna CA) may comprise two windings, such as an inner winding and an outer winding. Module antennas having two windings rather than one have also been discussed, for example with respect to FIGS. 9C,D.

Figure 10A:
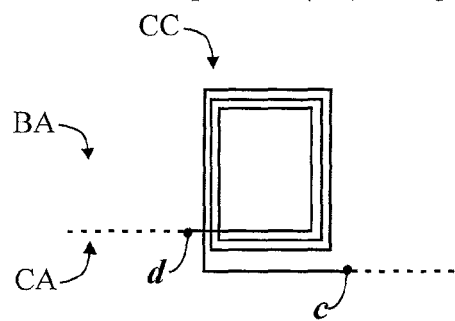
FIG. 10A, 10B, 10C are diagrams (plan views), each showing a configuration of a coupler coil (CC).

FIGS. 10A,B,C are diagrams of some coupler coil (CC) configurations for a booster antenna (BA). The coupler coil CC may be configured in various ways to increase a coupling factor between the coupler coil CC component of the booster antenna BA and the module antenna MA of the antenna module AM.

FIG. 10A shows a configuration of a conventional (typical) coupler coil CC in the form of a flat coil having number (such as ten) of turns, and two ends "c" and "d". The booster antenna BA extending around the periphery of the card body is illustrated with only one turn, for illustrative clarity. The coupler coil CC may have, for example, approximately 10 turns of wire, in a flat spiral pattern.

Figure 10B:
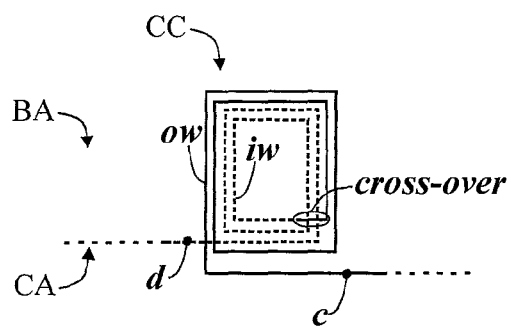

FIG. 10B shows a coupler coil CC having inner and outer windings. Starting at one end "d" of the coupler coil CC, an inner winding iw (or inner portion IP, shown in dashed lines) has approximately 5 turns of wire and is wound (laid) in a counter clockwise direction from outside-to-inside, then jumps over itself (over previously laid turns) at a "crossover", and an outer winding ow (or outer portion OP, shown in solid lines) has approximately 5 turns of wire and is wound (laid) in a counter clockwise direction from inside-to-outside, then terminates at the other end "c". It should be understood that the coupler coil CC could be wound from "c" to "d", rather than from "d" to "c", and other variations may be implemented. The inner and outer windings iw and ow may have substantially the same number of turns, five each. Fewer turns are shown in the figure, for illustrative clarity.

Figure 10C:
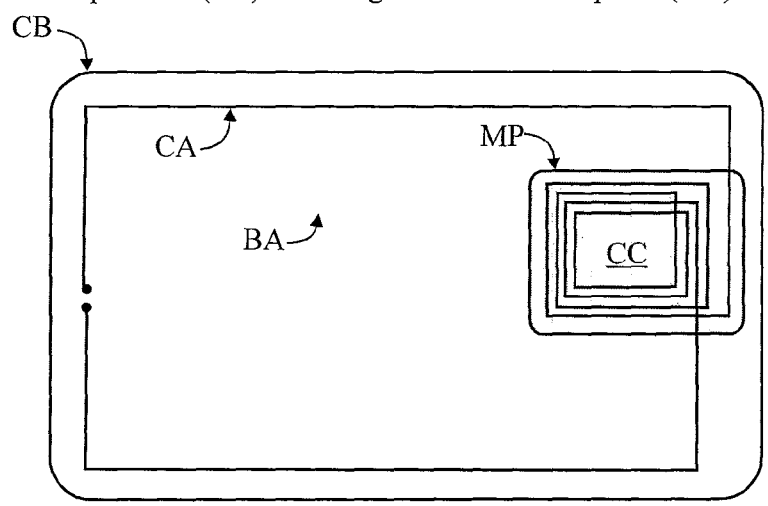

FIG. 10C shows a magnetically conductive patch (e.g. ferrite) MP which may improve the coupling. The patch MP could e.g. be placed onto the coupling coil CC (between the module antenna MA and the coupling coil CC). Instead of using the whole area (module and coupling coil) it could also be possible to create only a ring of conductive material MP around the coupler coil which is outside of the module recess area covering the wires of the coupling coil only. The card antenna CA component of the booster antenna BA, which extends around the periphery of the card body is shown as having only one turn, for illustrative simplicity. It should be understood that the card antenna CA component may have several turns, and may include an inner winding IW and an outer winding OW.

Some Configurations of Booster Antenna (BA) Components

FIGS. 11A-11F show various exemplary configurations of a booster antenna BA. The booster antenna BA may comprise various antenna components, such as (but not limited to):

- a card antenna CA component extending around a periphery of the card body (CB, not shown, see FIG. 1) for coupling with an external contactless reader (see FIG. 1),
  - the card body CA component may comprise an outer winding OW and an inner winding IW (see FIG. 1B)
- a coupling coil CC component disposed at an interior position (area) of the card body (CB), corresponding with a position for the antenna module (AM, not shown) for coupling with the module antenna (MA, not shown) of the antenna module (AM), and
- an extension antenna (or extension coil) EA component.

The components CA, CC, EA of the booster antenna BA may be interconnected, as shown. The components of the booster antenna may comprise wire which is laid in a continuous path, from a starting point "a" to a finishing point "f" (or vice-versa). In some of the examples, the "sense" or laying direction (either clockwise CW, or counter clockwise CCW) of the various components may be the same, or different than (e.g., opposite from) the sense of other components. Some of the components may be "true coils" which may form a complete loop having a crossover "x" and contributing to the inductive coupling of the booster antenna BA. The overall booster antenna BA may have two or more crossovers "x". The various components may each be shown with only a few turns, for illustrative simplicity, and are generally laid in a flat rectangular spiral pattern having a number (generally two or more) "turns". One of the turns, or a portion thereof, may be an "innermost" turn of the booster antenna component. Another of the turns, or a portion thereof, may be an "outermost" turn of the booster antenna component.

Some characteristics and advantages of the various configurations shown in FIGS. 11A-11F may include, but are not limited to . . .

- altering the Q-factor of the booster antenna/module antenna system by altering the winding direction of one or more components (elements) making up the booster antenna BA
- winding one or more turns of the coupler coil CC in the opposite direction to the majority of the turns, with substantially no increase in DC resistance, but counterwinding may broaden the resonance curve and reduce Q-factor, and there may be no power loss as would be the case if a resistor introduced
- winding one or more turns of the booster antenna BA in the opposite direction to the majority of the turns
- winding one or more turns of the extension antenna EA in the opposite direction to the other extension antenna EA turns, or winding the entire extension antenna EA in the opposite direction to the inner and outer windings (IA, OW) of the booster antenna BA.

FIG. 11A shows a configuration for the booster antenna BA wherein from the starting point "a", the wire commences being laid in a clockwise CW direction forming outer windings (OW) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then crosses over "x" itself and heads towards the periphery of the card body (CB) for laying the extension antenna EA in a clockwise CW direction (from an outermost turn to an innermost turn), then the wire crosses over then crosses over "x" itself and heads towards the periphery of the card body (CB) for laying the inner windings (IW) of the card antenna CA which may be laid in a clockwise CW direction (from an innermost turn to an outermost turn), until the finishing point "f". the entire sequence may be performed in reverse, starting at the point "f" and finishing at the point "a".

Figure 11B:
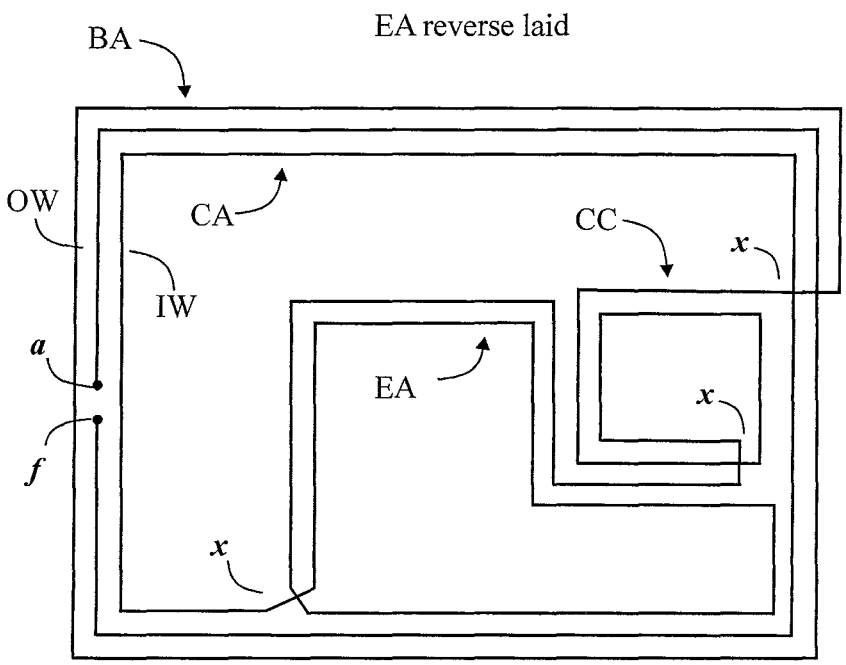

FIG. 11B shows a configuration for the booster antenna BA wherein from the starting point "a", the wire commences being laid in a clockwise CW direction forming outer windings (OW) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outmost turn to an innermost turn), then crosses over "x" itself and heads towards the periphery of the card body (CB) for laying the extension antenna EA in a counter clockwise CCW direction (from an outermost turn to an innermost turn), then the wire crosses over then crosses over "x" itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

Figure 11C:
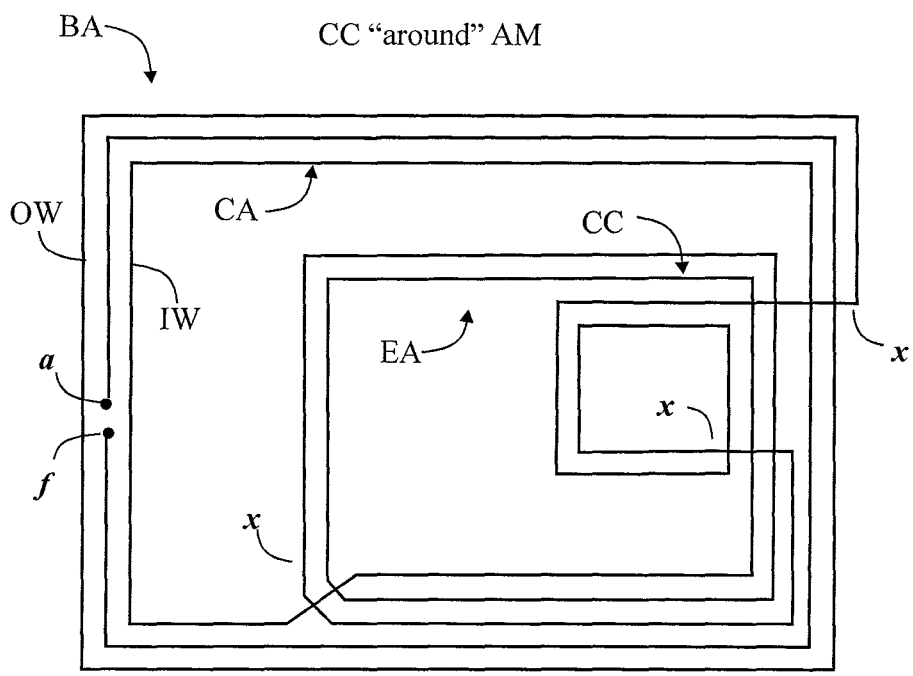

FIG. 11C shows a configuration for the booster antenna BA wherein from the starting point "a", the wire commences being laid in a clockwise CW direction forming outer windings (OW) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then the wire crosses over "x" itself and heads towards the periphery of the card body (CB) for laying the extension antenna EA in a clockwise CW direction (from an outermost turn to an innermost turn), then the wire crosses over "x" itself and heads towards the periphery of the card body (CB) for laying the inner windings (IW) of the card antenna CA which may be laid in a clockwise CW direction (from an innermost turn to an outermost turn), until the finishing point "f". the entire sequence may be performed in reverse, starting at the point "f" and finishing at the point "a".

Figure 11D:
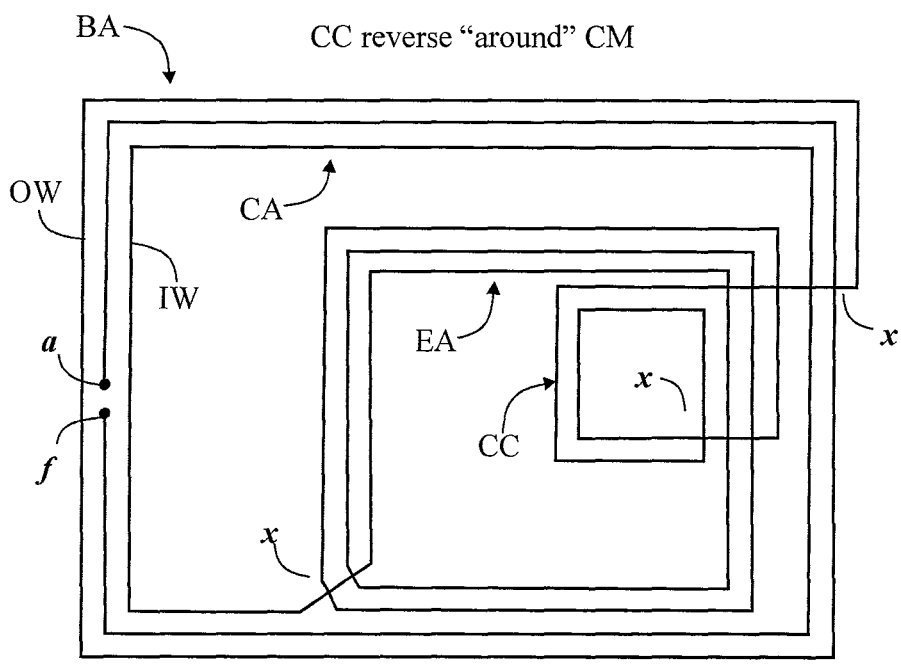

FIG. 11D shows a configuration for the booster antenna BA wherein from the starting point "a", the wire commences being laid in a clockwise CW direction forming outer windings (OW) of the card antenna CA (from an innermost turn to an outermost turn), then crosses over "x" itself and heads towards the interior of the card body (CB) whereat the coupler coil CC may be formed with turns of wire laid in the counter clockwise CCW direction (from an outermost turn to an innermost turn), then the wire crosses over "x" itself and heads towards the periphery of the card body (CB) for laying the extension antenna EA in a counter clockwise CCW direction (from an outermost turn to an innermost turn), then the wire crosses over "x" itself and heads towards the periphery of the card body (CB) for laying the inner windings (IW) of the card antenna CA which may be laid in a clockwise CW direction (from an innermost turn to an outermost turn), until the finishing point "f". the entire sequence may be performed in reverse, starting at the point "f" and finishing at the point "a".

Figures 11E, 11F:
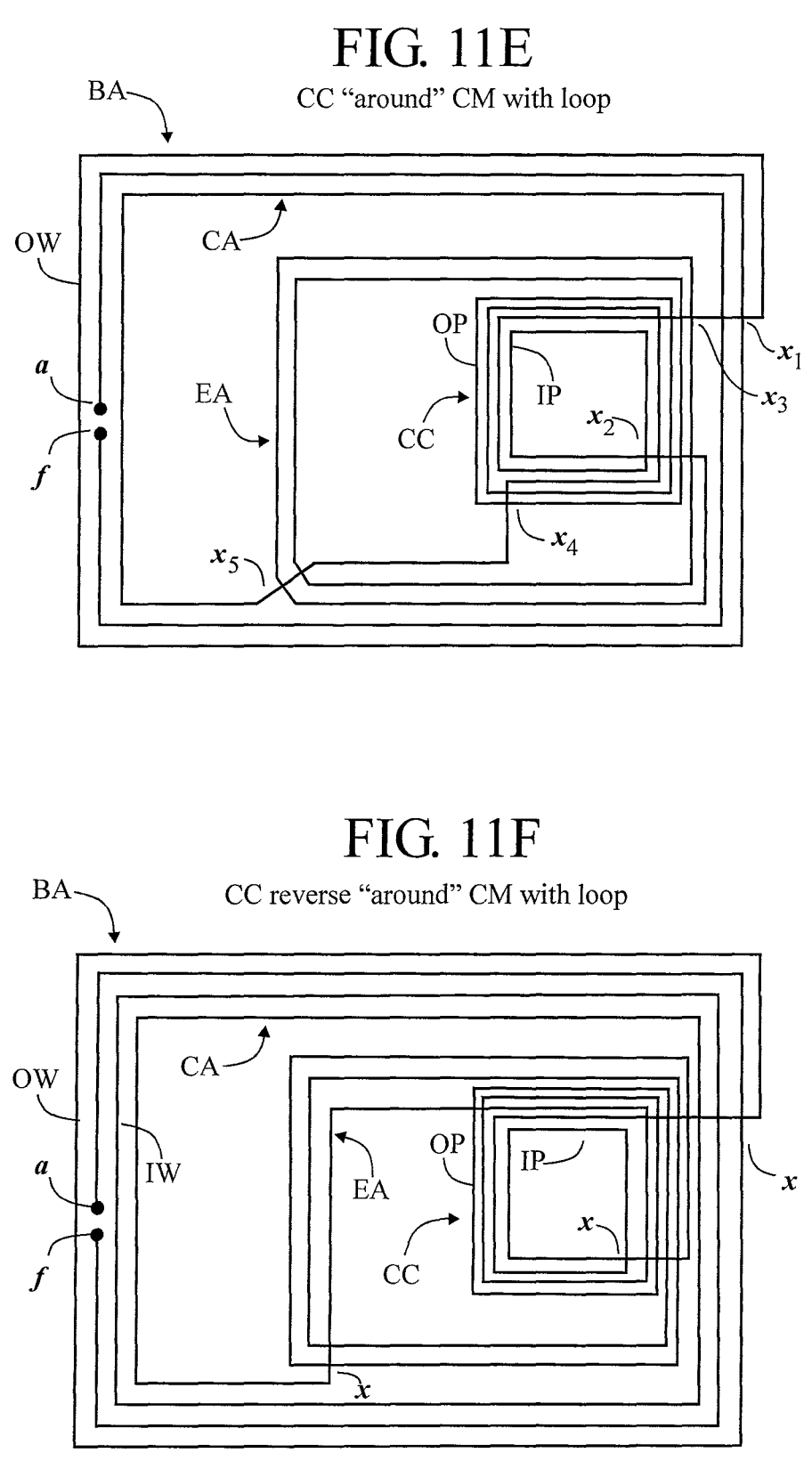

FIG. 11E shows a configuration for the booster antenna BA wherein from the starting point "a", the wire commences being laid in a clockwise CW direction forming outer windings (OW) of the card antenna CA (from an innermost turn to an outermost turn), then crosses over "x" (x1) itself and heads towards the interior of the card body (CB) whereat an inner portion IP of the coupler coil CC may be formed with turns of wire laid in the counter clockwise CCW direction (from an outermost turn to an innermost turn), then the wire crosses over "x" (x2) itself and heads towards the periphery of the card body (CB) for laying the extension antenna EA in a clockwise CW direction (from an outermost turn to an innermost turn), then the wire crosses over "x" (x3) itself for laying an outer portion OP of the coupler coil CC with turns of wire laid in the clockwise CW direction (from an outermost turn to an innermost turn), then the wire crosses over "x" (x4, x5) itself and heads towards the periphery of the card body (CB) for laying the inner windings (IW, compare FIG. 1B) of the card antenna CA which may be laid in a clockwise CW direction (from an innermost turn to an outermost turn), until the finishing point "f". the entire sequence may be performed in reverse, starting at the point "f" and finishing at the point "a".

FIG. 11F shows a configuration for the booster antenna BA wherein from the starting point "a", the wire commences being laid in a clockwise CW direction forming outer windings (OW) of the card antenna CA (from an innermost turn to an outermost turn), then crosses over "x" itself and heads towards the interior of the card body (CB) whereat an inner portion IP ("iw") of the coupler coil CC may be formed with turns of wire laid in the counter clockwise CCW direction (from an outermost turn to an innermost turn), then the wire crosses over "x" itself for laying the extension antenna EA in a counter clockwise CW direction (from an outermost turn to an innermost turn), then the wire crosses over "x" itself for laying an outer portion OP ("ow") of the coupler coil CC with turns of wire laid in the counter clockwise CCW direction (from an outermost turn to an innermost turn), then the wire crosses over "x" itself and heads towards the periphery of the card body (CB) for laying the inner windings (IW) of the card antenna CA which may be laid in a clockwise CW direction (from an innermost turn to an outermost turn), until the finishing point "f". the entire sequence may be performed in reverse, starting at the point "f" and finishing at the point "a".

The following table presents the "laying" senses of the various components CA (OW, IW), CC, EA of the booster antenna BA. (The OW and IW may have the same sense as one another.)

|  | OW of CA | CC | EA | IW of CA |
| --- | --- | --- | --- | --- |
| FIG. 11A | CW | CCW | CW | CW |
| FIG. 11B | CW | CCW | CCW | CW |
| FIG. 11C | CW | CCW | CW | CW |
| FIG. 11D | CW | CCW | CCW | CW |
| FIG. 11E | CW | (IP) CCW (OP) CW | CW | CW |
| FIG. 11F | CW | (IP) CCW (OP) CCW | CCW | CW |

Although not specifically directed to the antenna module AM, the configurations of and improvements to booster antennas disclosed herein may provide for improved coupling of the booster antenna BA with the antenna module AM, and consequent improvements in "read distance" and "activation distance".

According to some embodiments (examples) of the invention, a booster antenna (BA) may comprise a card antenna (CA) component disposed around a periphery of a card body (CB) and comprising an inner winding (IW) and an outer winding (OW); a coupler coil (CC) component disposed at a location for an antenna module (AM) on the card body (CB); and an extension antenna (EA) component; and may be characterized in that: at least one of the components is laid having a sense which is opposite one or more of the other components. At least some of the components may have innermost and outermost turns; at least one of the components is laid from an innermost turn to an outermost turn; and at least another of the components is laid from an outermost turn to an innermost turn.

Some Additional Embodiments of the Booster Antenna (BA)

Figure 12:
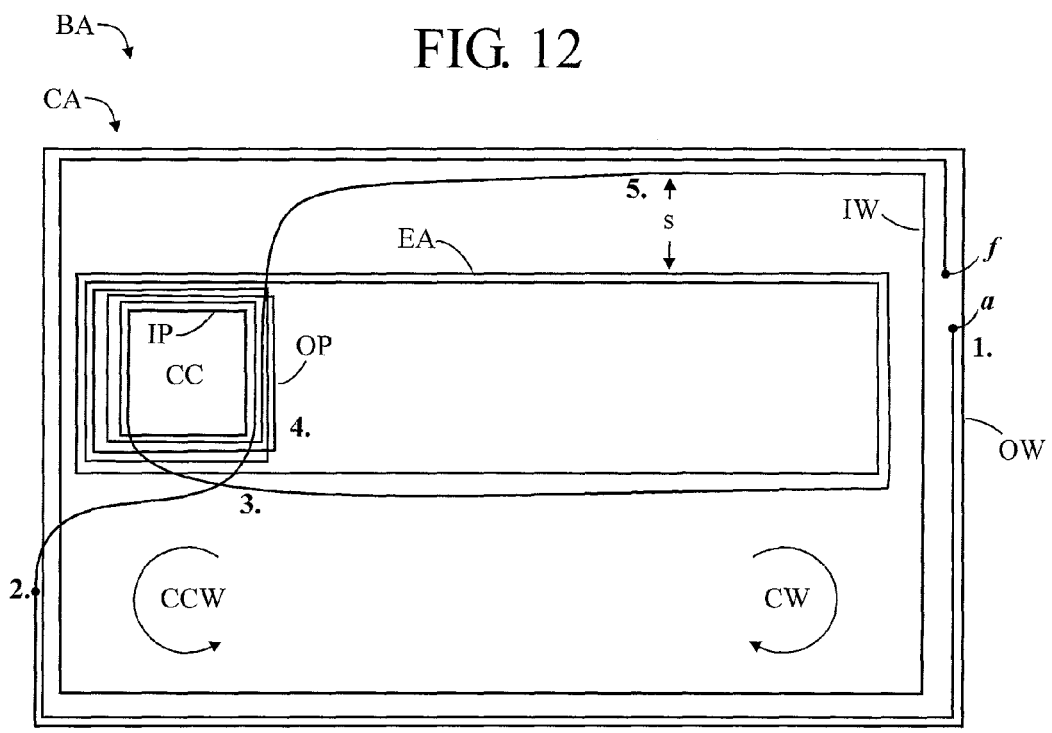
FIG. 12 shows diagrammatically.
Figure 12A:
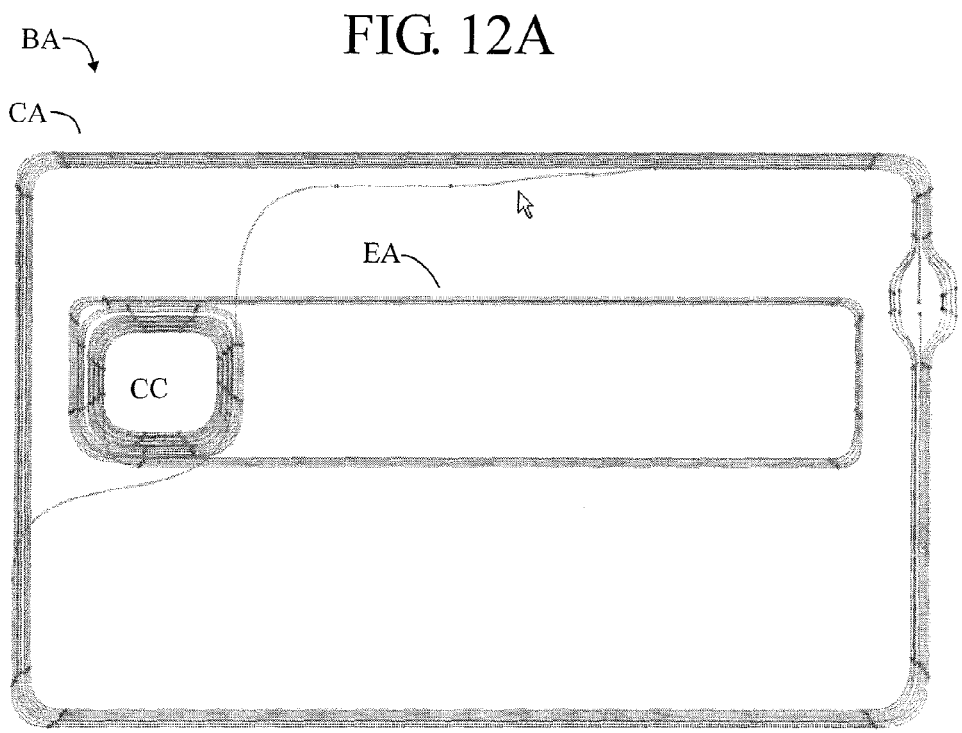
FIG. 12A shows more "realistically", an exemplary embodiment of a booster antenna BA.
Figure 13A:
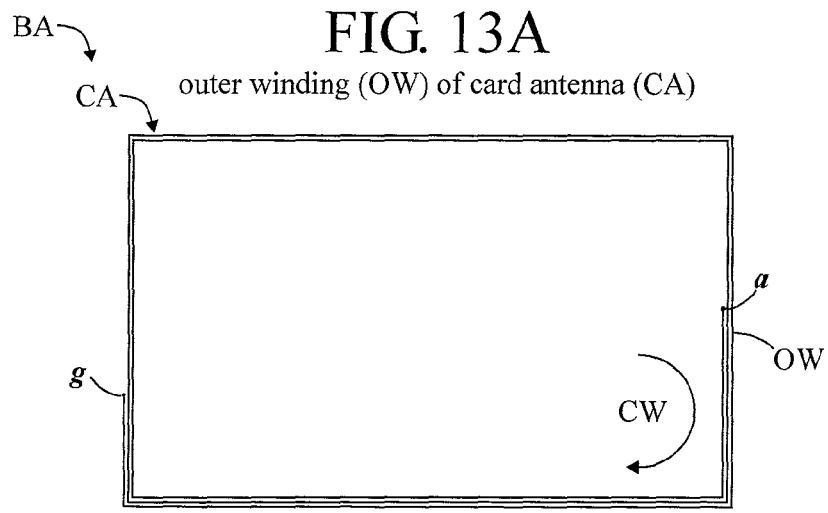
FIGS. 13A-13E illustrate an example of laying the booster antenna (BA), step-by-step.
Figure 13B:
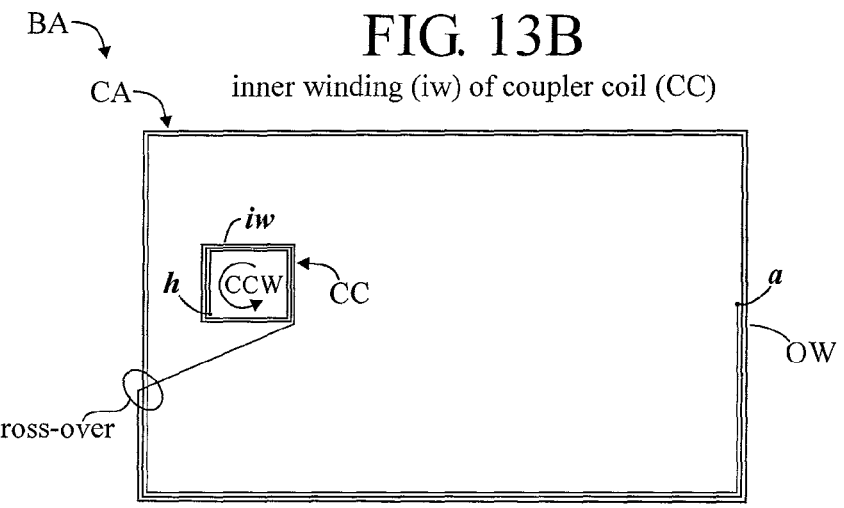
Figure 13C:
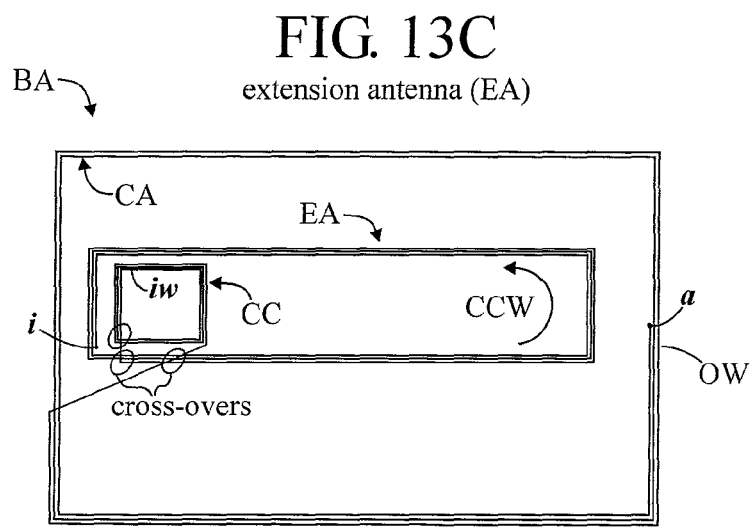
Figure 13D:
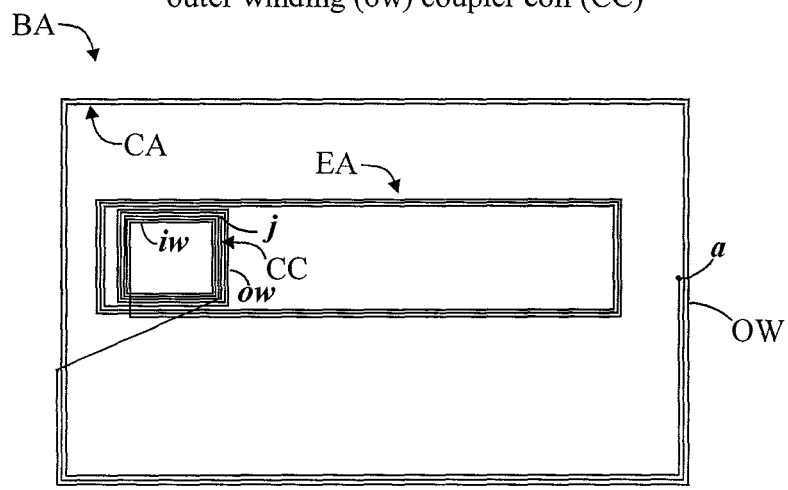
Figure 13E:
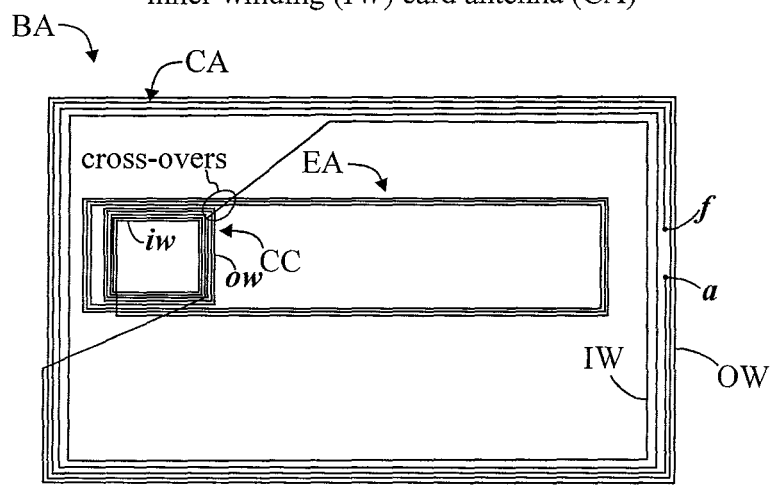

FIG. 12 shows diagrammatically, and FIG. 12A shows more "realistically", an exemplary embodiment of a booster antenna BA comprising a coil antenna CA component having an inner winding IW and an outer winding OW, a coupler coil component CC having an inner portion IP (or inner winding "iw") and an outer portion OP (or outer winding "ow"), and an extension antenna EA component. (The extension antenna EA in this embodiment is shown having a single multi-turn winding, but it could be formed with an inner and outer winding.)

The booster antenna BA may comprise insulated wire, embedded in the card body CB. Each component may have a number of turns, non-limiting examples of which are given. The booster antenna BA may be laid (embedded), as follows. The number of turns, sense (clockwise, counter clockwise), and order of laying the turns and/or windings of the various booster antenna BA components—such as the inner winding IW and outer winding OW of the card antenna CA component, the inner portion IP and outer portion OP of the coupler coil CC component, and (optionally) the inner and outer windings of the extension antenna EA component)—are exemplary, and may be changed, reversed, or done in a different order, and some of these elements or portions thereof may be omitted. A booster antenna BA formed by an additive or subtractive process, resulting in traces of conductors, may exhibit a similar arrangement to the embedded wire-based booster antenna BA described herein.

In a first step (1), at a point "a" which may be a first end of the overall booster antenna BA, start laying (routing, embedding) the outer winding OW of the card antenna CA component in a clockwise CW direction, for 3 or 4 turns around (just inside of) the perimeter of the card body CB, from an innermost turn to an outermost turn thereof. (The diagrammatic view of FIG. 12 may show fewer number of turns, for the various booster antenna components, for illustrative clarity.)

In a next step (2), stop embedding, jump over the already laid turns of the outer winding OW, to the interior (coupling area, 144) of the card body CB, and lay the inner portion IP (or inner winding "iw") of the coupler coil CC component in a counter clockwise CCW direction, such as for 8-10 turns, from an outermost turn to an innermost turn thereof.

In a next step (3), the wire may be lifted (jump) over the already laid inner portion IP of the coupler coil CC component to start forming form the extension antenna EA component by laying the wire in a counter clockwise CCW direction, from an outermost winding to an innermost winding thereof. The extension antenna EA component may have 4 turns, and may be routed around a central position of the card body CB, substantially as illustrated, and maintained at a given distance "s" from the card antenna CA component, so as to be substantially symmetrical (from left-to-right, as viewed).

In a next step (4), having completed laying the extension antenna EA component, the embedding process continues around the already laid inner portion IP of the coupler coil CC component, forming an outer portion OP (or outer winding "ow") of the coupler coil CC component, with a counter clockwise CCW sense (laying direction), and having 5 turns, around the exterior of the inner portion IP of the coupler coil CC component, from an outermost winding to an innermost winding thereof. In this example, the inner portion IP and outer portion OP of the coupler coil CC component have the same sense (CCW). Alternatively, the inner portion IP and outer portion OP of the coupler coil CC component may be laid with opposite sense (one CW, the other CCW). The order of laying the inner portion IP and outer portion OP of the coupler coil CC component may also be switched (first lay the outer portion OP, then the extension antenna EA, then the inner portion IP). Or, lay both the inner portion IP and outer portion OP of the coupler coil CC component, without "interrupting" by laying the extension antenna EA component.

In a next step (5), after completion of the outer portion OP of the coupler coil CC component, the antenna wire may be routed to the perimeter of the card body CB to lay the inner winding IW of the card antenna CA component in a clockwise CW direction, having 3 or 4 turns, from an innermost winding to an outermost winding thereof. Embedding may stop, as a point "f". Compare FIG. 2, the points "a" and "f" represent free (not connected) ends of the booster antenna BA, which otherwise is a continuous winding of the various components (CA, CC, EA). In this example, the inner winding IW and outer winding OW of the card antenna CA component have the same sense (CW). Alternatively, the inner winding IW and outer winding OW of the card antenna CA component may be laid with opposite sense (one CW, the other CCW). The inner winding IW and outer winding OW of the card antenna CA component may also be switched (first lay the outer portion OP, then the extension antenna EA, then the inner portion IP).

FIGS. 13A-13E illustrate an example of laying the booster antenna (BA), step-by-step, or component (and portion thereof)—by—component. For example:

(FIG. 13A) in a first step, the outer winding OW of the card antenna CA component may be laid, starting at a point "a", which is a free end of the booster antenna BA, and proceeding a number of turns around (but spaced inside of) the outer perimeter of at least a portion of the card body CB (card body omitted, for illustrative clarity), in a clockwise CW direction, from an inner turn to an outer turn thereof, to a point "g" which is an interim point (rather than an end point);

(FIG. 13B) in a next step, crossing over the already laid turns of the outer winding OW of the card antenna CA component, then forming the inner winding iw of the coupler coil CC component by laying the wire in a counter-clockwise CCW direction from an outer turn to an inner turn thereof, to a point "h" which is an interim point (rather than an end point);

(FIG. 13C) in a next step, crossing over the already laid turns of the inner winding iw of the coupler coil CC component, then forming at least a portion of the extension antenna EA component by laying the wire in a counter-clockwise CCW direction from an outer turn to an inner turn thereof, to a point "i" which is an interim point (rather than an end point); (In this step, the turns of the extension antenna EA component may cross over the wire coming from the coupler coil CC component and the wire coming from the outer winding OW of the card antenna CA component.)

(FIG. 13D) in a next step, crossing over the wire leading to the inner winding iw of the coupler coil CC component, then forming the outer winding ow of the coupler coil CC component around the inner winding iw of the coupler coil CC component by laying the wire in a counter-clockwise CCW direction from an outer turn to an inner turn thereof, to a point "j" which is an interim point (rather than an end point);

(FIG. 13E) in a next step, crossing over the already laid extension antenna EA component, then forming the inner winding IW of the card antenna CA component by laying the wire in a clockwise CW direction from an inner turn to an outer turn thereof, to a point "f" which is a free end of the booster antenna BA.

A booster antenna (BA) may comprise a coil antenna (CA) component having an inner winding (IW) and an outer winding (OW), a coupler coil component (CC) having an inner winding (iw) and an outer winding (ow), and an extension antenna (EA) component, wherein:
  the card antenna (CA) has two ends (a, f); and
  each component (CA, CC, EA) of the booster antenna BA and winding thereof (IW, OW, iw, ow) has a number of turns and a laying sense (clockwise, counter clockwise).

A booster antenna (BA) may comprise:
  a card antenna (CA) component disposed around a periphery of a card body (CB);
  a coupler coil (CC) component disposed at an interior area of the card body;
  wherein the coupler coil has two ends (c, d) an inner winding (iw) and an outer winding (ow); and
  wherein the inner and outer windings cross over one another.

A booster antenna (BA) may incorporate one or more of the following features or characteristics, and may be formed by one or more of the following steps (which may be performed in the sequence set forth herein, or in another sequence):
  starting from one end (a), the outer winding (OW) of the card antenna (CA) component may be laid in a clockwise (CW) direction, for approximately 3 or 4 turns around (just inside of) the perimeter of the card body (CB), from an innermost turn to an outermost turn thereof;

the inner winding (iw) of the coupler coil (CC) may be laid in a counter clockwise (CCW) direction, such as for approximately 8-10 turns, from an outermost turn to an innermost turn thereof;

the extension antenna (EA) component may be laid in a counter clockwise (CCW) direction, for approximately 4 turns, from an outermost winding to an innermost winding thereof;

the extension antenna (EA) may be routed around a central position of the card body CB; the extension antenna EA is maintained at a given distance "s" from the card antenna CA component, so as to be substantially symmetrical;

the outer winding (ow) of the coupler coil (CC) component may be laid in a counter clockwise (CCW) direction for approximately 5 turns around the inner winding (iw) of the coupler coil (CC) component, from an outermost winding to an innermost winding thereof;

the inner winding (IW) of the card antenna (CA) component may be laid in a clockwise CW direction, having approximately 3 or 4 turns, from an innermost winding to an outermost winding thereof depending on the shape of the module antenna (MA) of the antenna module (AM), the coupler coil (CC) component may be formed by embedding 8 to 10 turns of wire from its outermost to its innermost turn;

any of the components (or portions thereof) may be laid with a reverse sense (such as clockwise rather than counter clockwise);

the components (or portions thereof) may be laid in a different order;

the components (or portions thereof) may be formed by a pattern of conductive tracks, rather than embedded wire;

the coupler coil (CC) component may have a rectangular, oval, round or elongated shape;

iron or ferromagnetic particles or flakes may be selectively deposited in areas between the antenna components;

the booster antenna (BA) may have a resonance frequency at or below 13.56 MHz;

holographic metal foils may be incorporated into the inlay (card body CB);

the holographic metal foils may not significantly attenuate the electromagnetic field;

the holographic metal foils may generate capacitance to improve communication performance of the smart card with an external reader;

the holographic metal foils may mask the presence of the booster antenna (BA);

one or more turns on the coupler coil (CC) component may be routed in an area directly beneath an antenna module (AM).

Another Embodiment of the Booster Antenna BA

Figure 13F:
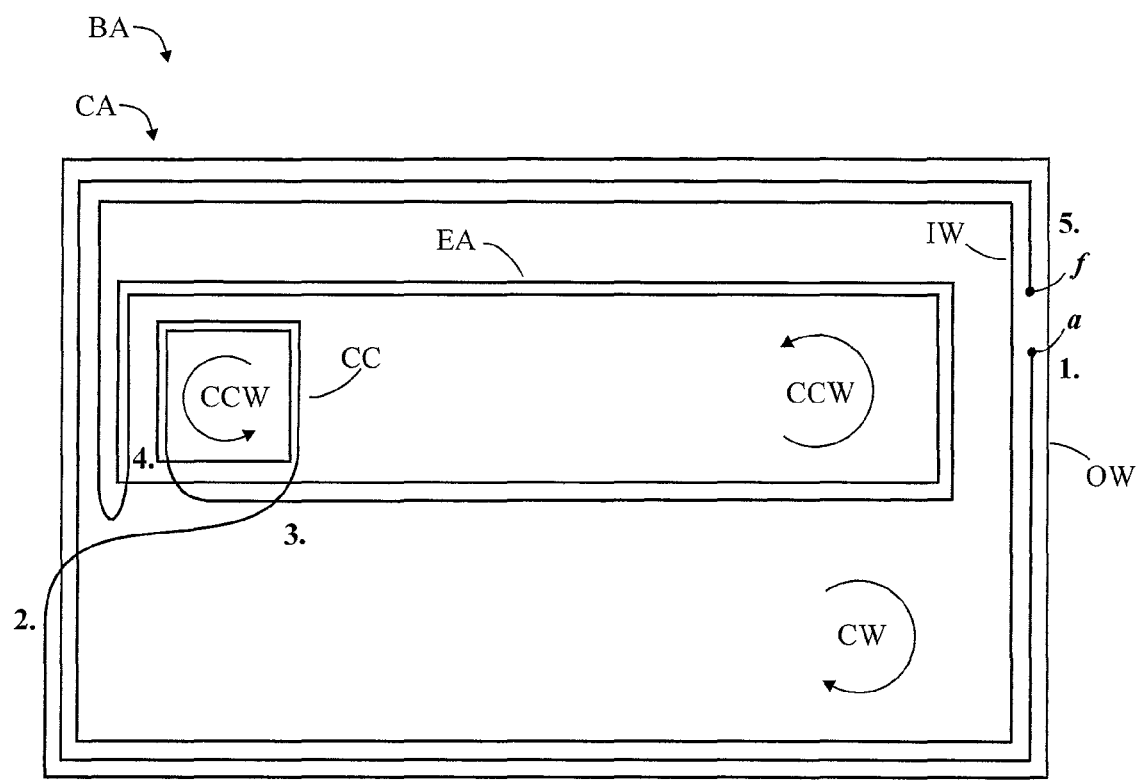
FIG. 13F is a diagram showing an embodiment of a booster antenna.

FIG. 13F illustrates another embodiment of a booster antenna BA. Some comparisons may be made with the embodiments shown in FIGS. 4A-4E, 6D, 12, 12A, and 13A-13E, and this embodiment may incorporate various features and variations shown and described therein, or elsewhere, although each and every feature and variation may not be shown in this figure.

The booster antenna BA may comprise:
a card antenna CA portion comprising an outer winding OW and an inner winding IW, each winding having a number of turns, but may comprise only a single winding. The outer and inner windings may have the same or a different sense (CW, CCW) than one another. The turns of the outer and inner windings may have the same or a different pitch as one another, and may be constant or varying.

a coupler coil CC component comprising a single multi-turn winding having a cross-over, but which may alternatively be formed with an inner winding or portion (iw, IP) and an outer winding or portion (ow, or OP). The coupler coil CC component is shown formed as a "true coil" (compare FIGS. 4B,E,G), having a cross-over, but may alternatively be formed as an "open loop" (compare FIGS. 4A,C,D).

an extension antenna EA component comprising a single multi-turn winding having a cross-over, but which may alternatively be formed with inner and outer windings (in a manner similar to that of the card antenna CA and coupler coil CC portions of the booster antenna BA).

As illustrated, the booster antenna BA may be formed by (some illustrative steps "1" to "5"):

1. starting at the free end "a" of the card antenna CA component, laying the wire for the outer winding OW, in a clockwise CW direction, from an innermost turn to an outermost turn thereof, around (just within) the periphery of the card body CB (not shown), 2. then, crossing over the already laid turns of the outer winding OW of the card antenna CA component, heading towards the interior of the card body CB and commencing laying the wire for the coupler coil CC component, in a counter-clockwise CCW direction, from an outermost turn to an innermost turn thereof, 3. then, crossing over the already laid turns of the coupler coil CC component, commencing laying the wire for the extension antenna EA component, in a counter-clockwise CCW direction, from an outermost turn to an innermost turn thereof, 4. then, crossing over the already-laid turns of the extension antenna EA component, heading back towards the periphery of the card body CB and commencing winding the inner winding IW of the card antenna CA component in a clockwise CW direction, from an innermost turn to an outermost turn thereof, within the already laid outer winding OW, 5. finishing laying of the wire for the booster antenna BA at the free end "f", which may be (but need not be) close to the other free end "a".

The coupler coil CC of any of the booster antenna BA components disclosed herein may have a rectangular, oval, round or elongated shape (depending on the shape of the module antenna of the antenna module) is formed by embedding 8 to 10 turns of wire from the outer to the inner position.

The extension antenna EA may have inner and outer windings. The coupler coil (CC) component may have inner and outer windings. The card antenna (CA) component may have inner and outer windings. Any of the components mentioned herein (CA, CC, EA) may have at least one winding in addition to its inner and outer windings.

The routing directions as indicated above can be in the reverse order. The various components (CA, CC, EA) of the booster antenna (BA), including portions thereof, may be laid from an innermost turn thereof to an outermost turn thereof, or from an outermost turn thereof to an innermost turn thereof.

The number of turns for a given component (CA, CC, EA) of the booster antenna (BA), including portions thereof, may change with the size of the booster antenna (BA). The extension antenna (EA) component may have approximately four turns.

The order of laying the windings of any of the booster antenna BA components disclosed herein may be performed in an order other than that which is described, for example, starting at the free end "f" and finishing at the free end "a".

The order of laying the wire from an innermost to an outermost turn (or vice-versa) may be performed in the reverse order, such as from outermost to innermost turn (or vice-versa).

The electrical resistance and/or material of the wire (or other electrical conductor) forming the windings of any of the booster antenna BA components disclosed herein may be uniform, or may varied along the length of the card antenna CA portion.

The booster antenna BA design of this embodiment, in a dual interface card, may exhibit the property that the card can be interrogated by scrolling across a point-of-sale terminal without loss or impairment of the data.

The sense (counter clockwise) of the extension antenna EA being opposite to the sense (clockwise) of the card antenna CA may beneficially reduce the "Q" (quality) of the booster antenna BA, may increasing the bandwidth of the booster antenna BA, and may stabilize the resonance frequency of the booster antenna. It may be noted that the sense (CCW) of the coupler coil (CC) component may be the same as the sense (CCW) of the extension antenna (EA) component.

Most important is (1) because (2) and (3) are a result of this. Systems with high quality tend to be instable and the deviation of the resonance frequency of a transponder site is high. A stable resonance frequency is beneficial in the production since the results can be reproduced.

A reduced quality (1) causes a broader bandwidth (2) which is an enhancement of data communication because high speed transition signals need a broad bandwidth in order to avoid distortion of the signal.

Some Additional Features

Iron or ferromagnetic particles or flakes could be selectively deposited in the areas between the antenna.

The booster antenna BA may be tuned, after lamination, to be below the resonance frequency of 13.56 MHz, rather than above.

Holographic metal foils may be glued or laminated to both sides of the booster antenna BA inlay (card body DB). The holographic metal foils may not significantly attenuate the electromagnetic field, in other words the holographic metal foils may be largely transparent to the RF field. The holographic metal foils can be used to mask (visually hide) the presence of the booster antenna BA. In addition, the holographic metal foils when placed either side (above, below) of the booster antenna BA can generate capacitance which may help improve the communication performance of the smart card with the reader (FIG. 1).

One or more turns on the coupler coil CC can be routed in the area directly beneath the antenna module AM. Placing some turns of the coupler coil CC directly under the antenna module AM, and consequently close to the module antenna MA, may increase the coupling between the booster antenna BA and the antenna module AM, resulting in improved power delivery to the chip IC (CM), thereby improving smart card performance.

Compensating Loops

Figure 14A:
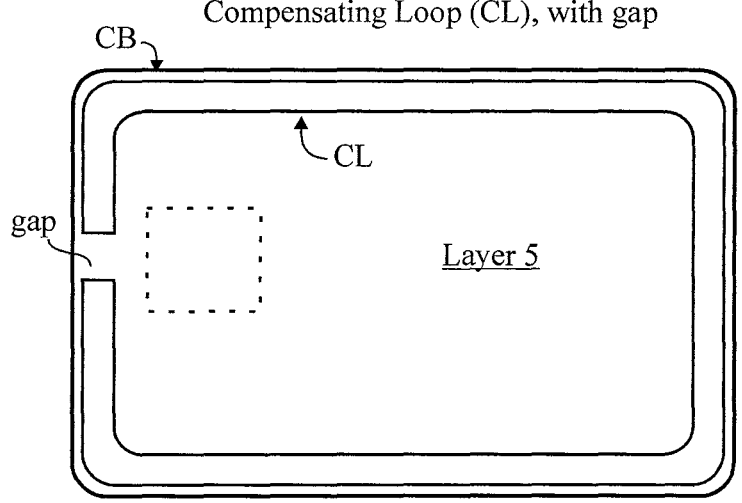
FIGS. 14A and 14B are diagrams showing various embodiments of compensating loops (CL).
Figure 14B:
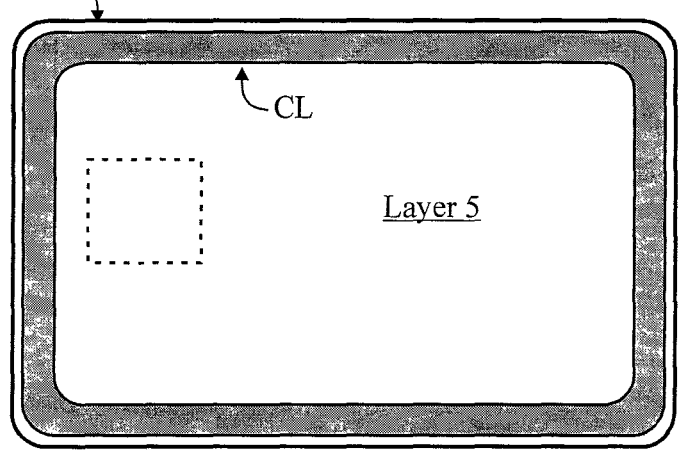

FIG. 14A shows a conductive "compensating (or compensation) loop" CL that may be disposed in a layer of a card body CB, such as behind the booster antenna BA (not shown). The compensating loop "CL" may extend around at least a portion of the periphery of the card body CB. The compensating loop CL may be an open loop having two free ends, and a gap ("gap") therebetween, and is discontinuous. The compensation loop CL may be made of copper cladding, can be printed on a support layer, etc. FIG. 14B shows that the compensating loop CL may be "closed", having no gap and no free ends, or a continuous ring of material.

The compensating loop CL may comprise ferrite material, and may be referred to as a "compensation frame". Disposing the compensating loop CL on the reverse side of the booster antenna BA (away from the antenna module AM) may help with the stabilization of the resonance frequency. The compensating loop CL may be used in addition to the booster antenna BA. The booster antenna BA may be embedded into one side of an inlay substrate (or card body) while the compensation frame may be inkjet printed or adhesively attached to the opposite (from the booster antenna) side of the inlay substrate. The compensating loop CL can be mounted using a subtractive (etching away of material) or additive (depositing material) process.

Metal Foil Layer(s)

Metal foils, metallic coatings, segments of metal foil or metal particles may be deposited on or embedded in the inlay (or card body CB) to alter the electrical characteristics of the RFID device or smartcard. A metal foil layer in the card body construction may helps to meet the ISO and EMV communication standards for RFID devices or smart cards in terms of read write distance, baud rate, Q-factor bandwidth, etc. The metal foil can be any pure metal such as aluminum or copper or an alloy. The metal foils, metallic coatings, segments of metal foil or metal particles should have a thickness less than the skin depth of the metal or material being used in order to prevent the formation of eddy currents in the metal or metallic structure that will attenuate the RF electromagnetic field. The use of thicknesses substantially less than the skin depth of the metal or material being used will increase the electrical resistance of the structure to alternating current flows (impedance) thereby preventing unwanted or excessive attenuation of the RF electromagnetic field. Other electrical conductors such as metal nanoparticles, metal nanowires or carbon-based conductors like graphite or exfoliated graphite can be used to construct electrically conductive networks that are hereby included under the definition of a metal foil or metallic structure.

The booster antenna (BA) is normally constructed from a track of wire embedded in an inlay substrate (or card body CB) comprising one or more layers of a material such as Polyvinyl Chloride (PVC), Polycarbonate (PC), Polyethylene (PE), Poly(ethylene terephthalate) (PET), Polyetherurethane, PET-G (Polyethylene Terephtalate Glycol-modified), Polyester Copolymer film, Teslin™, paper, synthetic paper and the like. Alternatively, the booster antenna (BA) can be formed on the inlay substrate by chemically or laser etching a metal coating previously deposited on the substrate. A particular design of booster antenna (BA) with coupler coil (CC), having a certain geometry and number of coil windings, will exhibit specific electrical characteristics in terms of resonance frequency and impedance.

The metallic/metallized foil in the card stackup may exhibit "capacitive coupling" with the booster antenna (BA) to broaden the bandwidth of the Gaussian curve to include the side bands and to reduce the concentration of the electromagnetic flux at the position of the coupler coil CC (i.e. to avoid overpowering the RFID chip). This may improve the communication of signals carried between the RFID device (secure document or smartcard) and the reader on the sub-carrier frequencies (the sub-carrier frequencies is typically +/−848 kHz at 12.712 MHz and 14.408 MHz for a device operating at 13.56 MHz, as per ISO/IES 14443-2).

The metal foil or metallic structure can advantageously alter (such as lower) the quality factor (Q) of the booster antenna (BA). The metal foil or metallic structure can also have a capacitive effect in the circuit. The presence of the metal foil or metallic structure in the card design can alter the electrical power delivered to the IC chip (CM). Some or all of these effects may enhance the performance of the RFID device or smartcard, improving the coupling between the antenna module AM and the coupler coil CC of the booster antenna BA. The communication between the RFID device or smartcard and the reader can thus be improved.

The metal foil MF together with the booster antenna BA generates capacitance in the resonant circuit which may result in a broadening of the resonance curve and which may improve signal communication on the sub-carrier frequencies, typically at 12.712 MHz and 14.408 MHz (i.e. +/−848 kHz for a device operating at 13.56 MHz).

A metal foil, metal coating or metal particles can be implemented in the RFID device or smartcard in a number of ways as described hereunder. A very thin continuous metal foil can be deposited directly on top of the booster inlay (card body CB), behind the booster inlay or within the booster inlay structure. The metal foil can be supported on a plastic substrate, such as Poly(ethylene terephthalate) (PET), before being incorporated into the booster antenna structure.

FIG. 14C-F shows methods of applying conductive material in the card body CB, which may reduce the Quality factor (Q) of the coupler coil CC to include sidebands and improve coupling between the coupler coil CC and the module antenna MA.

Figure 14C:
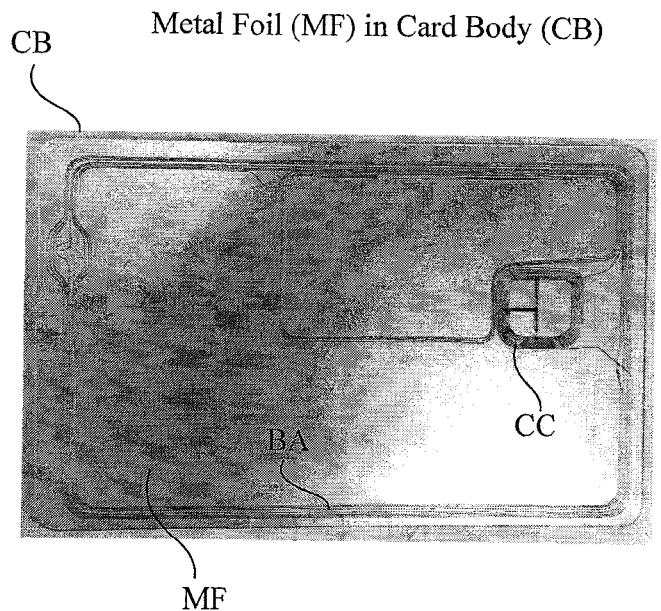
FIG. 14C,D, E, F are illustrations of including a metal foil (MF) in the card body (CB).

FIG. 14C illustrates a booster antenna (BA) placed on a transparent PVC substrate that has been laminated to a second PVC layer bearing a metal foil coating. The metal foil may have a thickness typically of the order of tens of nanometers (for example 15 nm). The thickness of the metal foil dictates the effect on the electrical properties of the RFID device or smartcard. The metal foil can deposited anywhere within the body of the card and may have a size matching the full area of the card body CB, or only a portion thereof. The foil can also be used to overlap only the booster antenna or parts of the booster antenna. Multiple areas of foils can be deposited within the card body to alter the performance effect. Additionally, multiple layers of foils can be deposited within a card body. The metal foil can be disposed on the PCV substrate without the intermediary of the second PVC layer.

As an alternative to a continuous metal foil, a perforated (or otherwise segmented or discontinuous) metal foil can be used. The perforations may allow the electromagnetic flux from the RFID reader to substantially penetrate the card body (CB). The perforated foil can be deposited anywhere within the card body, as described above. The thickness of a perforated foil may be greater than the thin continuous foils described above—for example, greater than 15 nm. (A continuous metal foil may have a thickness less than 15 nm.)

As an alternative to a continuous metal foil, a metal mesh can be used. The mesh can be deposited anywhere within the card body as described above. The metal mesh can also be constructed of a porous network Metal particles of various sizes and shapes (including spheres and flakes) can be deposited on the surface of the booster antenna (BA) or an additional inlay layer within the card body. The metal particles can be formed a range of materials including metal alloys and can be deposited within the material used to form the inlay or other layers within the card body. The metal particles can also be derived from a conventional metallic finish on the surface of the card.

The metal foil MF or metallic structure can cover the full area of the RFID device or smartcard as illustrated in FIG. 14C or can partially cover the area leaving selectively exposed regions.

Figure 14D:
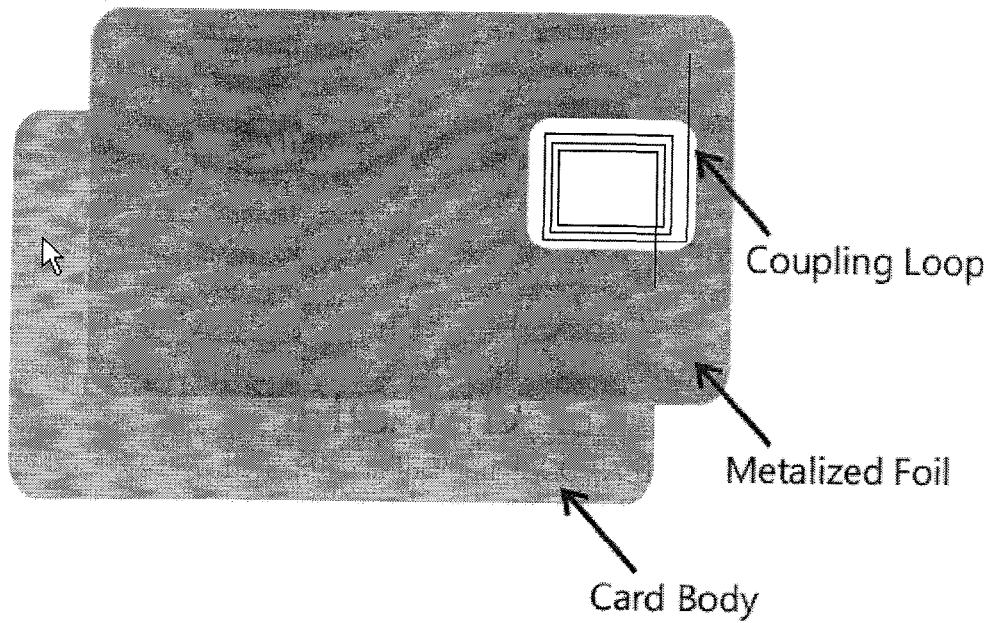

FIG. 14D illustrates an embodiment of the invention where the area of the coupling coil (or coupling loop) is left free of the metal foil. The metal foil MF or metallic structure partially covers the smartcard area, leaving exposed metal-free region at the coupling loop of the booster antenna (BA). This may substantially reduce (or prevent) attenuation of the inductive coupling between the coupler coil CC and the module antenna MA (not shown). This is illustrative of a metal foil or metallic structure partially covering the smartcard area, leaving an exposed metal-free region at the location of the coupling coil CC of the booster antenna (BA). The recess of (opening in) the metallized foil MF at the location of the chip module (underneath the coupling loop) may help to reduce the quality (Q) of the booster antenna without having destructive effects on the coupling between the booster antenna BA and the antenna module AM.

Figure 14E:
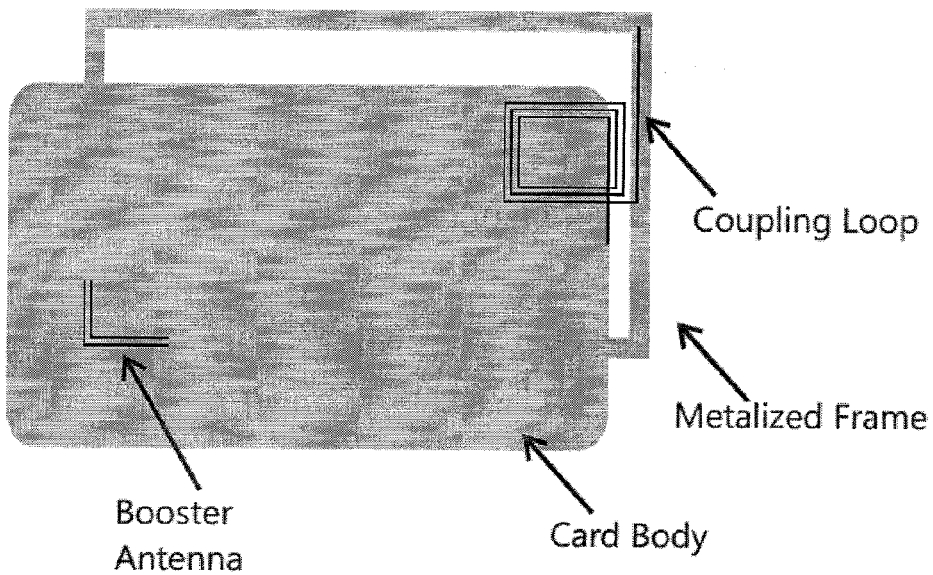

FIG. 14E illustrates a continuous metal loop or loop of a metallic structure is disposed on top of or below the booster antenna BA, and may cover part of the booster antenna BA.

Figure 14F:
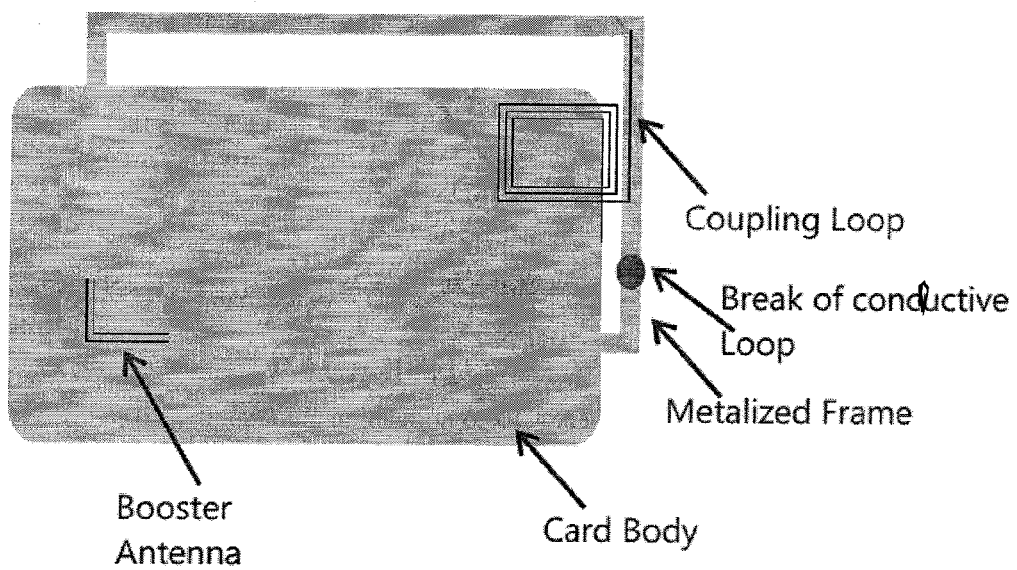

FIG. 14F illustrates a discontinuous (broken) metal loop or loop of a metallic structure is placed on top of or below the booster antenna, and may cover part of the booster antenna BA. In this case, the ends of the open loop may be left open or connected to a resistive load. Alternatively, a resistor can be formed by narrowing a section of the metal loop or metallic structure in order to locally reduce the cross sectional area of the loop.

The metal foils may comprise a conductive material (such as aluminum on PVC), having a sheet resistance which is very low, on the order of only a few Ohms, which normally should block the electromagnetic field (such as between the booster antenna BA and an external reader, or between the booster antenna BA and the antenna module AM), but a mitigating factor may be the thickness of the aluminum (or other material), being thin enough to allow the electromagnetic field to pass through.

Metal foils or substrate materials having metallized coatings may be used in the production of the booster antenna (BA) for RFID devices or smartcards. The metal can be any pure metal such as aluminum or copper or an alloy. Other electrical conductors such as metal nanoparticles, metal nanowires or carbon-based conductors like graphite or exfoliated graphite may also be used.

The booster antenna (BA) is normally constructed from a track of wire embedded in an inlay substrate comprising one or more layers of a material such as Polyvinyl Chloride (PVC), Polycarbonate (PC), Polyethylene (PE), Poly(ethylene terephthalate) (PET), Polyetherurethane, PET-G (Polyethylene Terephtalate Glycol-modified), Polyester Copolymer film, Teslin™, paper, synthetic paper and the like. Alternatively the booster antenna (BA) can be formed on the inlay substrate by chemically or laser etching a metal coating previously deposited on the substrate. A particular design of booster antenna (BA) with coupler coil (CC), having a certain geometry and number of coil windings, will exhibit specific electrical characteristics in terms of say resonance frequency and impedance. Metal foils, metallic coatings, segments of metal foil or metal particles may be deposited on or embedded in the inlay substrate or card body to alter the electrical characteristics of the RFID device or smartcard.

The effect of the metal or metallic structures can be to dampen the booster antenna (BA) resulting in a widening of the resonance curve of the booster antenna (BA) and lowering the quality factor (Q). The metal or metallic structure can also have a capacitive effect in the circuit. These effects can enhance the performance of the RFID device or smartcard. The communication between the RFID device or smartcard and the reader can thus be improved.

The metal foil, metal coating or metal particles can be implemented in the device in a number of ways, for example, but not limited to:

(a) A very thin metal continuous metal foil can be deposited on the booster inlay or within the booster inlay. The metal can thin (less than 10 micron in thickness for example) or extremely thin (or the order of nanometers). The metal foil can deposited anywhere within the body of the card and may have size matching the full area of the card of part of the card. The foil can also be used to overlap only the booster antenna or parts of the booster antenna.

(b) A perforated metal foil can be used. The perforations allow the electromagnetic flux from the RFID reader to largely penetrate the card. The perforated foil can be deposited anywhere within the card as described in 1 above.

(c) A metal mesh can be used. The mesh can be deposited anywhere within the card as described in (a).

Metal particles of various sizes and shapes (including spheres and flakes) can be deposited on the surface of the booster antenna (BA) or an additional inlay within the card body. The metal particles can be formed a range of materials including metal alloys and can be deposited within the material used to form the inlay or other layers within the card body. The metal particles can also be derived from a conventional metallic finish on the surface of the card.

According to some embodiments (examples) of the invention, a card body (CB) for a smart card (SC) may comprise: a metal foil (MF) layer incorporated into the card body (CB); and may be characterized in that: the metal foil (MF) comprises a material selected from the group consisting of pure metals, alloys, aluminum, copper, metal nanoparticles, metal nanowires, carbon-based conductors, graphite, and exfoliated graphite; and the metal foil may be characterized by one or more of: the metal foil comprises a very thin continuous layer deposited on the card body (CB); the metal foil has a size matching an area of the card body (CB), or only a portion thereof; the metal foil overlaps only the booster antenna (BA) or portions or components of the booster antenna; the metal foil comprises multiple areas of foils which are deposited on or in the card body (CB); the metal foil is perforated, segmented or discontinuous; the metal foil is continuous, and has a thickness less than 15 nm; the metal foil is discontinuous, and has a thickness greater than 15 nm; the metal foil comprises a mesh; the metal foil comprises metal particles of various sizes and shapes; the metal foil partially covers the smartcard area, leaving exposed metal-free region at a coupling coil (CC) of the booster antenna (BA); the metal foil reduces the quality (Q) of the booster antenna without having destructive effects on the coupling between the booster antenna (BA) and the antenna module (AM); the metal foil comprises (FIG. 22F) a continuous loop; the metal foil comprises (FIG. 22G) a discontinuous loop; the metal foil comprises a resistor formed by narrowing a section of a metal loop; and the metal foil comprises a conductive material having a sheet resistance on the order of only a few Ohms. The metal foil may be characterized by at least one of: the metal foil is continuous, and has a thickness of less than 10 μm; the metal foil is perforated; the metal foil comprises a mesh; and the metal foil comprises metal particles.

Some Additional Embodiments

In a manner analogous to how having a booster antenna (BA, more particularly the card antenna CA component thereof) with two windings connected in a quasi-dipole ("Q-D") configuration may be applied to the module antenna (MA), as described with respect to FIGS. 9D (and 9C), the concept of having a module antenna (MA) comprising a antenna segment ("A") with capacitive stubs ("B" and "C"), as in described with respect to FIGS. 9A (and 9B), may be applied to booster antennas (BA). See also FIG. 2A of U.S. Ser. No. 13/205,600 filed 8 Aug. 2011 (now U.S. Pat. No. 8,474,726 issued 2013 Jul. 12; "S34")

Figure 15:
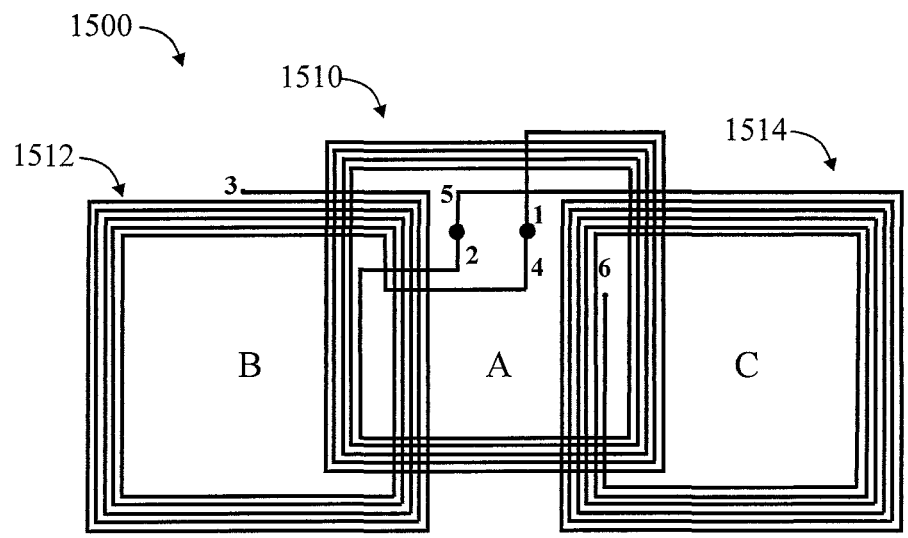
FIG. 15 shows diagrammatically.

FIG. 15 shows (schematically) an embodiment of a booster antenna BA having an antenna component 1510 (compare "A" in FIG. 9A), which may be any one (or more) of the card antenna CA, coupler coil CC or extension antenna EA components. Here, the antenna component 1510 is shown as having two ends "1" and "2", which are not free ends, but it is within the scope of the invention that the antenna component 1510 has only one free end, or no free ends.

A first stub (or extension CE) component 1512 (compare "B" in FIG. 9A) may be connected (in any suitable manner, as represented by the black dot) by an end "4 to the end "1" of the antenna component 1510, and may have another end "3" which is left unconnected (as a free end). A second stub (or extension CE) component 1514 (compare "C" in FIG. 9A) may be connected (in any suitable manner, as represented by the black dot) by an end "5 to the end "2" of the antenna component 1510, and may have another end "6" which is left unconnected (as a free end). The stub components 1512 and 1514 may constitute capacitive extensions of the antenna component 1510, such as has been described in U.S. Ser. No. 13/205,600 filed 8 Aug. 2011 (now U.S. Pat. No. 8,474,726 issued 2013 Jul. 12; "S34"), with respect to a module antenna in an antenna module. This may include that there are two capacitive stubs and they are formed in a flat coil pattern having a number of turns, and are substantially identical with one another.

Figure 15A:
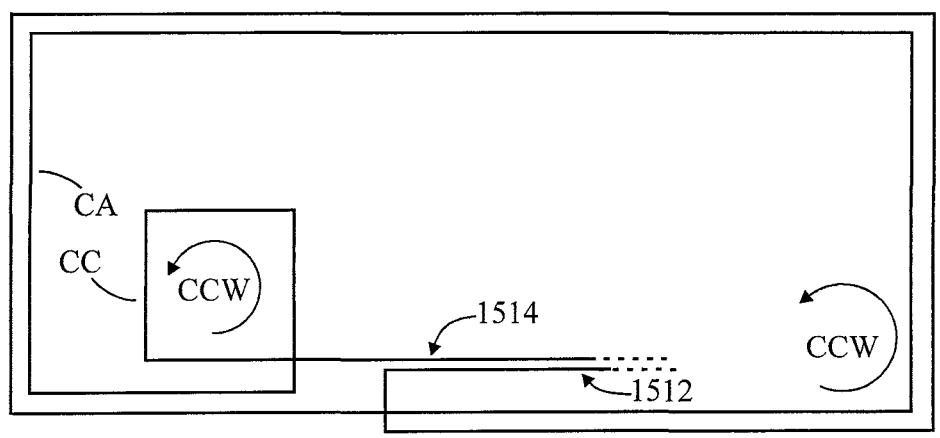
FIG. 15A shows more "realistically", an exemplary embodiment of a booster antenna (BA) having capacitive extensions (CE).

FIG. 15A shows a more realistic representation of a booster antenna BA having a card antenna CA component, a coupler coil CC component, and two capacitive extension components 1512 and 1514. One capacitive extension CE component 1512 extends from an end of the card antenna CA component. The other capacitive extension CE component 1514 extends from an end of the coupler coil CC component. This illustrates that the capacitive extension CE components may extend from different components (CA, CC, EA) of the booster antenna BA. (Any of the components illustrated may have two (or more) windings), but are shown with a single winding, for illustrative clarity. The extension antenna EA component has been omitted, for illustrative clarity, but may be one of the booster antenna BA components provided with one or more capacitive extensions, and itself may be arranged to serve as a capacitive extension CE.)

Figure 15B:
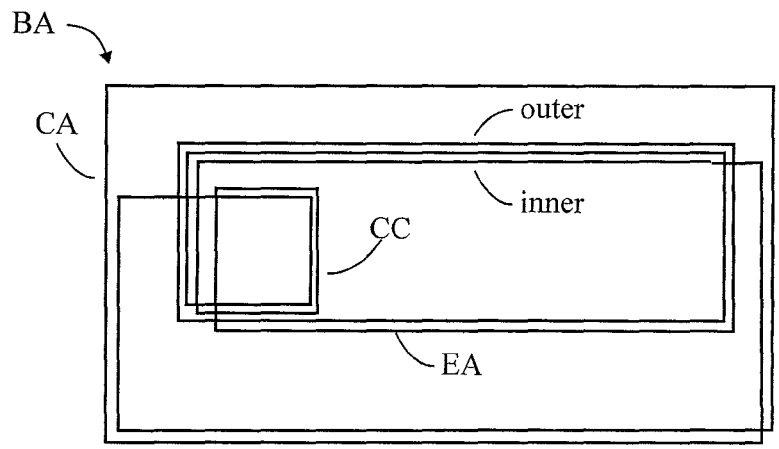
FIG. 15B is a diagram showing a configuration of a booster antenna (BA).

FIG. 15B shows an embodiment of a booster antenna BA having a card antenna CA component, a coupler coil CC component, and an extension antenna EA component. In this example, the extension antenna EA component is shown having inner and outer windings. Compare FIG. 4I which shows two extension antennas EA-1 and EA2. This illustrates that a given component (CA, CC, EA) of a booster antenna BA may have two or more windings which may be, but need not necessarily be arranged as inner and outer (IW/OW, iw/ow, IP/OP) windings. And, although the booster antenna BA in this example is shown without and free ends, it should be understood that any of the components (CA, CC, EA, as well as CE) may have at least one free end.

It may also be noted that FIG. 6A shows one of the free ends ("f") being in the extension antenna EA component, the other free end "a" being in the coupler coil CC component (in this embodiment, there is no showing of a card antenna CA component, and the booster antenna BA is shown disposed in the top half of the card body). And, that FIG. 6B shows both of the free ends "a" and "f" disposed in the extension antenna EA component (in this embodiment, there is no showing of a card antenna CA component, and the booster antenna BA is shown disposed in the top half of the card body). FIG. 5D shows that two free ends of the booster antenna BA may be in the coupler coil CC component (in these embodiments, there is no showing of an extension antenna EA component). FIG. 2 shows that two free ends of the booster antenna BA may be in the card antenna CA component.

This is illustrative of the proposition that selected features of various embodiments disclosed herein may be incorporated with other embodiments, to arrive at a desired configuration for the booster antenna BA. This would include, but is not limited to (i) having two or more windings per component, (ii) a component having one or more free ends, as well as (iii) the particular sense (CW, CCW) of a component or portions thereof, and (iv) any other features that are disclosed herein.

Figure 15C:
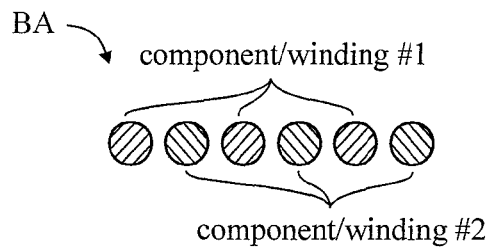
FIG. 15C is a diagram showing a configuration for components of a booster antenna (BA)

FIG. 15C shows a portion of a booster antenna BA wherein two components (any of CA, CC, EA, CE) or two windings of a single component, or portions thereof, may be laid so that their turns are interleaved with one another—herein labeled as "component/winding #1" and "component/winding #2".

Figure 15D:
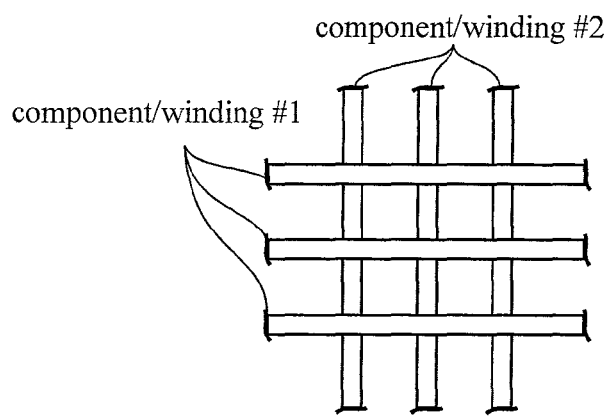
FIG. 15D is a diagram showing a configuration for components of a booster antenna (BA)

FIG. 15D shows a portion of a booster antenna BA wherein at least one component (any of CA, CC, EA, CE), or portions thereof, may be laid so that several of its/their turns cross over each other, multiple times. Here, one of the components "component/winding #1" is shown with at least portions of some of its turns laid horizontally (from left-to-right, as viewed) on the card body (CB, not shown), and the other of the components "component/winding #2" is shown with at least portions of some of its turns laid vertically (from top-to-bottom, as viewed) on the card body (CB).

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. A booster antenna (BA) comprising a card antenna (CA) component extending around a periphery of a card body (CB), a coupler coil (CC) component disposed at a coupling area of the card body (CB) corresponding to an antenna module (AM), and an extension antenna (EA) component, characterized by:

the extension antenna (EA) component has a sense opposite to that from the card antenna (CA) component.

2. The booster antenna (BA) of claim 1, wherein the coupler coil (CC) component has a sense which is the same as the sense of the extension antenna (EA) component.

3. The booster antenna (BA) of claim 1, wherein the card antenna (CA) component has an outer winding (OW) and an inner winding (IW).

4. A smart card (SC) incorporating the booster antenna (BA) of claim 1.

5. Booster antenna (BA) comprising the following components:

a card antenna (CA) component;
a coupler coil (CC) component; and
an extension antenna (EA) component;
characterized in that:
at least one of the components has a sense which is opposite one or more of the other components.

6. The booster antenna (BA) of claim 5, wherein:

at least one of the components comprises an outer winding (OW, ow) and an inner winding (IW, iw).

7. The booster antenna of claim 5, wherein:

at least some of the components have innermost and outermost turns;
at least one of the components is laid from an innermost turn to an outermost turn; and
at least another of the components is laid from an outermost turn to an innermost turn.

8. Booster antenna (BA) comprising:

a card antenna (CA) component;
a coupler coil (CC) component;
a first capacitive stub connected with the coupler coil (CC) component; and
a second capacitive stub connected with the card antenna (CA) component.

9. The booster antenna (BA) of claim 8, wherein:

the two capacitive stubs are each formed in a flat coil pattern having a number of turns.

10. The booster antenna (BA) of claim 8, wherein:

the two capacitive stubs are substantially identical with one another.

* * * * *